(12) United States Patent
Yada

(10) Patent No.: US 12,507,414 B2
(45) Date of Patent: Dec. 23, 2025

(54) THREE-DIMENSIONAL MEMORY DEVICE WITH LATERALLY SEPARATED SOURCE SELECT ELECTRODES AND METHODS OF FORMING THE SAME

(71) Applicant: WESTERN DIGITAL TECHNOLOGIES, INC., San Jose, CA (US)

(72) Inventor: Shinsuke Yada, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 387 days.

(21) Appl. No.: 18/362,805

(22) Filed: Jul. 31, 2023

(65) Prior Publication Data
US 2024/0422973 A1    Dec. 19, 2024

Related U.S. Application Data

(60) Provisional application No. 63/508,386, filed on Jun. 15, 2023.

(51) Int. Cl.
*H10B 43/27*    (2023.01)
*H01L 23/00*    (2006.01)
(Continued)

(52) U.S. Cl.
CPC ............. *H10B 43/27* (2023.02); *H01L 24/08* (2013.01); *H01L 24/80* (2013.01); *H01L 25/0657* (2013.01); *H01L 25/18* (2013.01); *H01L 25/50* (2013.01); *H10B 43/35* (2023.02); *H10B 80/00* (2023.02); *H01L 2224/08145* (2013.01); *H01L 2224/80006* (2013.01); *H01L 2224/80895* (2013.01); *H01L 2224/80896* (2013.01);
(Continued)

(58) Field of Classification Search
CPC ........ H10B 43/27; H10B 43/35; H10B 41/35; H10B 41/50; H10B 80/00; H01L 24/08; H01L 24/80; H01L 25/0657; H01L 25/18; H01L 25/50
USPC .......................................................... 257/326
See application file for complete search history.

(56) References Cited

U.S. PATENT DOCUMENTS 10,256,252 B1    4/2019    Kanazawa
10,290,647 B2    5/2019    Noguchi et al.
(Continued)

FOREIGN PATENT DOCUMENTS

| KR | 20100106911 A | 10/2010 |
|---|---|---|
| KR | 20190095812 A | 8/2019 |
| KR | 20220033781 A | 3/2022 |

OTHER PUBLICATIONS

Endoh et al., "Novel Ultra High-Density Memory with a Stacked-Surrounding Gate Transistor (S-SGT) Structured Cell," IEDM Proc. (2001) 33-36.
(Continued)

*Primary Examiner* — Igwe U Anya
(74) *Attorney, Agent, or Firm* — THE MARBURY LAW GROUP PLLC

(57) ABSTRACT

A three-dimensional memory device includes primary source side select gate electrodes located between word lines and bottom source side select gate electrodes. The primary source side select gate electrodes are laterally separated in each memory block, while the word lines and the bottom source side select gate electrodes are not laterally separated in each memory block.

20 Claims, 42 Drawing Sheets

(51) Int. Cl.
  *H01L 25/00* (2006.01)
  *H01L 25/065* (2023.01)
  *H01L 25/18* (2023.01)
  *H10B 43/35* (2023.01)
  *H10B 80/00* (2023.01)

(52) U.S. Cl.
  CPC .............. *H01L 2924/1431* (2013.01); *H01L 2924/14511* (2013.01)

(56) References Cited

U.S. PATENT DOCUMENTS

| | | |
|---|---|---|
| 10,629,616 B1 | 4/2020 | Kai et al. |
| 11,121,153 B1 | 9/2021 | Obu et al. |
| 11,127,759 B2 | 9/2021 | Obu et al. |
| 11,195,781 B2 | 12/2021 | Okina et al. |
| 11,201,107 B2 | 12/2021 | Okina et al. |
| 11,482,539 B2 | 10/2022 | Sharangpani et al. |
| 11,508,711 B2 | 11/2022 | Ninomiya et al. |
| 11,631,690 B2 | 4/2023 | Okina |
| 2018/0053774 A1 | 2/2018 | Sakamoto |
| 2019/0009604 A1 | 1/2019 | Hachmann et al. |
| 2020/0027835 A1 | 1/2020 | Hsu et al. |
| 2020/0258817 A1 | 8/2020 | Okina et al. |
| 2021/0035965 A1 | 2/2021 | Mizutani et al. |
| 2021/0091063 A1 | 3/2021 | Ninomiya et al. |
| 2021/0159241 A1* | 5/2021 | Li ..................... H10B 41/50 |
| 2022/0077182 A1 | 3/2022 | Lee |
| 2022/0130853 A1 | 4/2022 | Sharangpani et al. |
| 2022/0157841 A1 | 5/2022 | Tsutsumi et al. |
| 2022/0157842 A1 | 5/2022 | Tsutsumi et al. |
| 2022/0189984 A1 | 6/2022 | Okina |
| 2022/0208748 A1 | 6/2022 | Rabkin et al. |
| 2022/0238162 A1* | 7/2022 | Yada ..................... H10B 41/35 |
| 2022/0336484 A1 | 10/2022 | Iwai et al. |

OTHER PUBLICATIONS

U.S. Appl. No. 17/577,533, filed Jan. 18, 2022, SanDisk Technologies LLC.
U.S. Appl. No. 17/659,057, filed Apr. 13, 2022, SanDisk Technologies LLC.
U.S. Appl. No. 17/661,783, filed May 3, 2022, SanDisk Technologies LLC.
U.S. Appl. No. 17/662,926, filed May 11, 2022, SanDisk Technologies LLC.
U.S. Appl. No. 17/684,975, filed Mar. 2, 2022, SanDisk Technologies LLC.
U.S. Appl. No. 17/806,406, filed Jun. 10, 2022, SanDisk Technologies LLC.
U.S. Appl. No. 17/806,415, filed Jun. 10, 2022, SanDisk Technologies LLC.
U.S. Appl. No. 17/931,362, filed Sep. 12, 2022, SanDisk Technologies LLC.
U.S. Appl. No. 18/347,838, filed Jul. 6, 2023, SanDisk Technologies LLC.
U.S. Appl. No. 18/350,573, filed Jul. 11, 2023, SanDisk Technologies LLC.
U.S. Appl. No. 18/355,765, filed Jul. 20, 2023, SanDisk Technologies LLC.
U.S. Appl. No. 18/357,634, filed Jul. 24, 2023, SanDisk Technologies LLC.
U.S. Appl. No. 18/357,702, filed Jul. 24, 2023, SanDisk Technologies LLC.

* cited by examiner

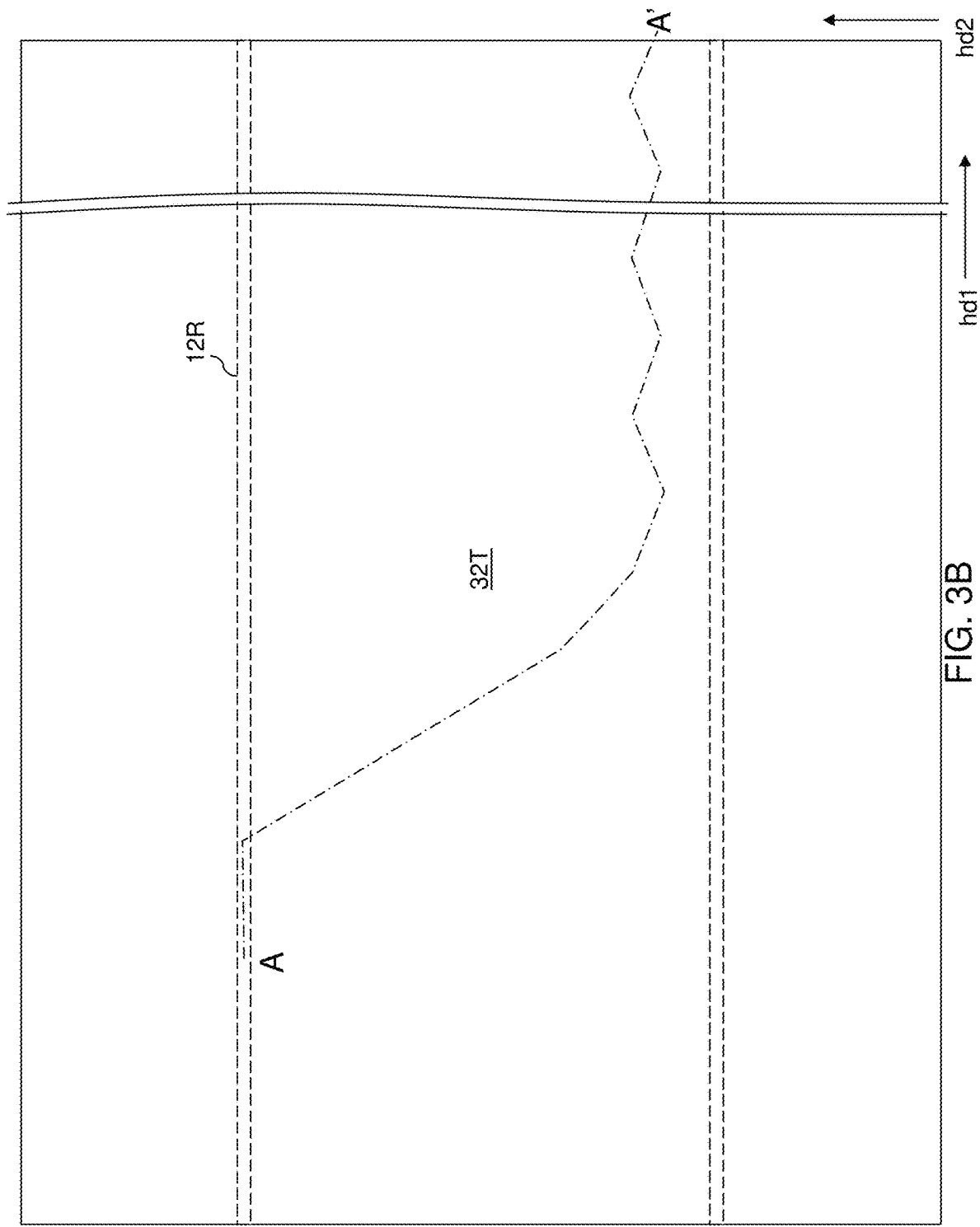

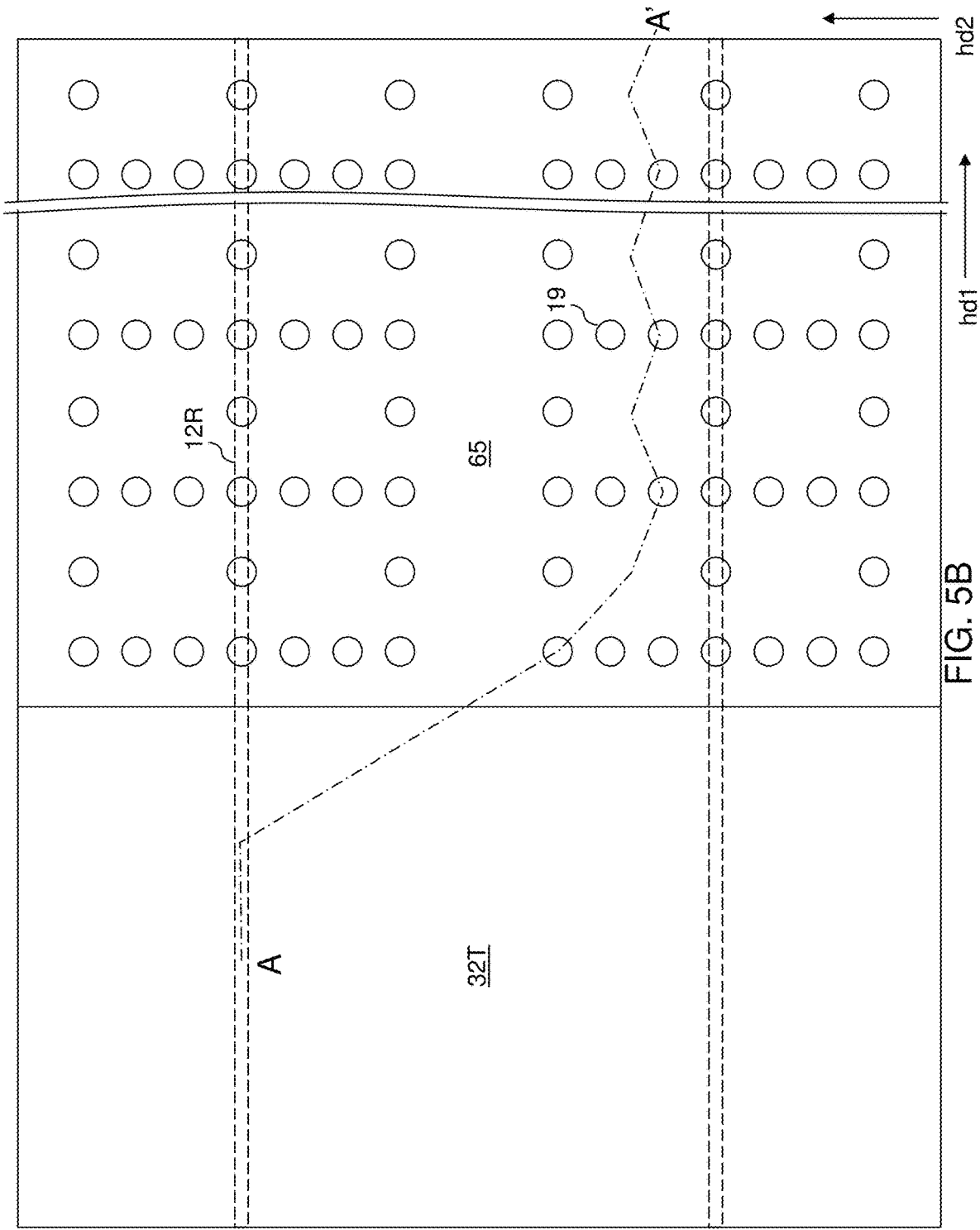

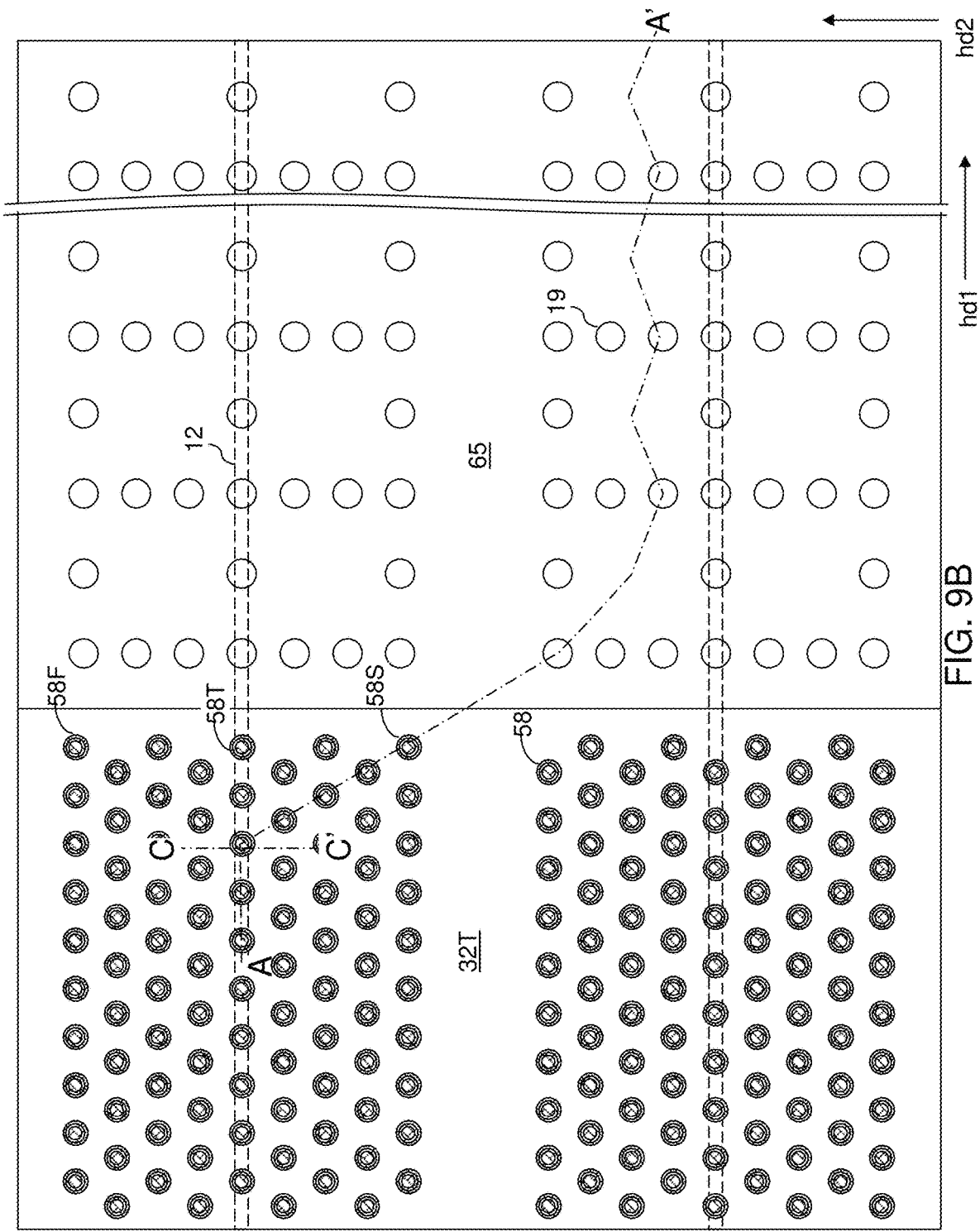

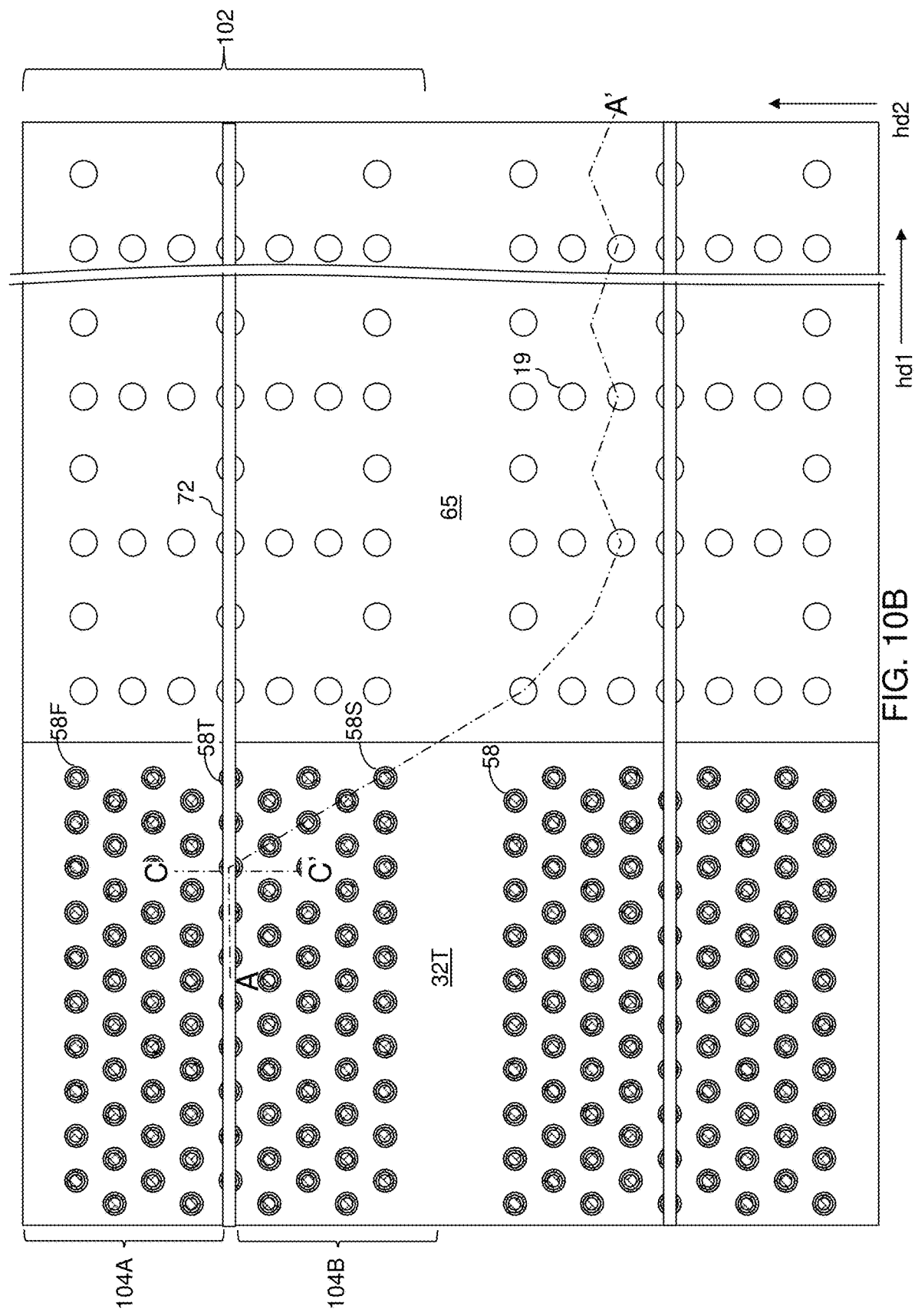

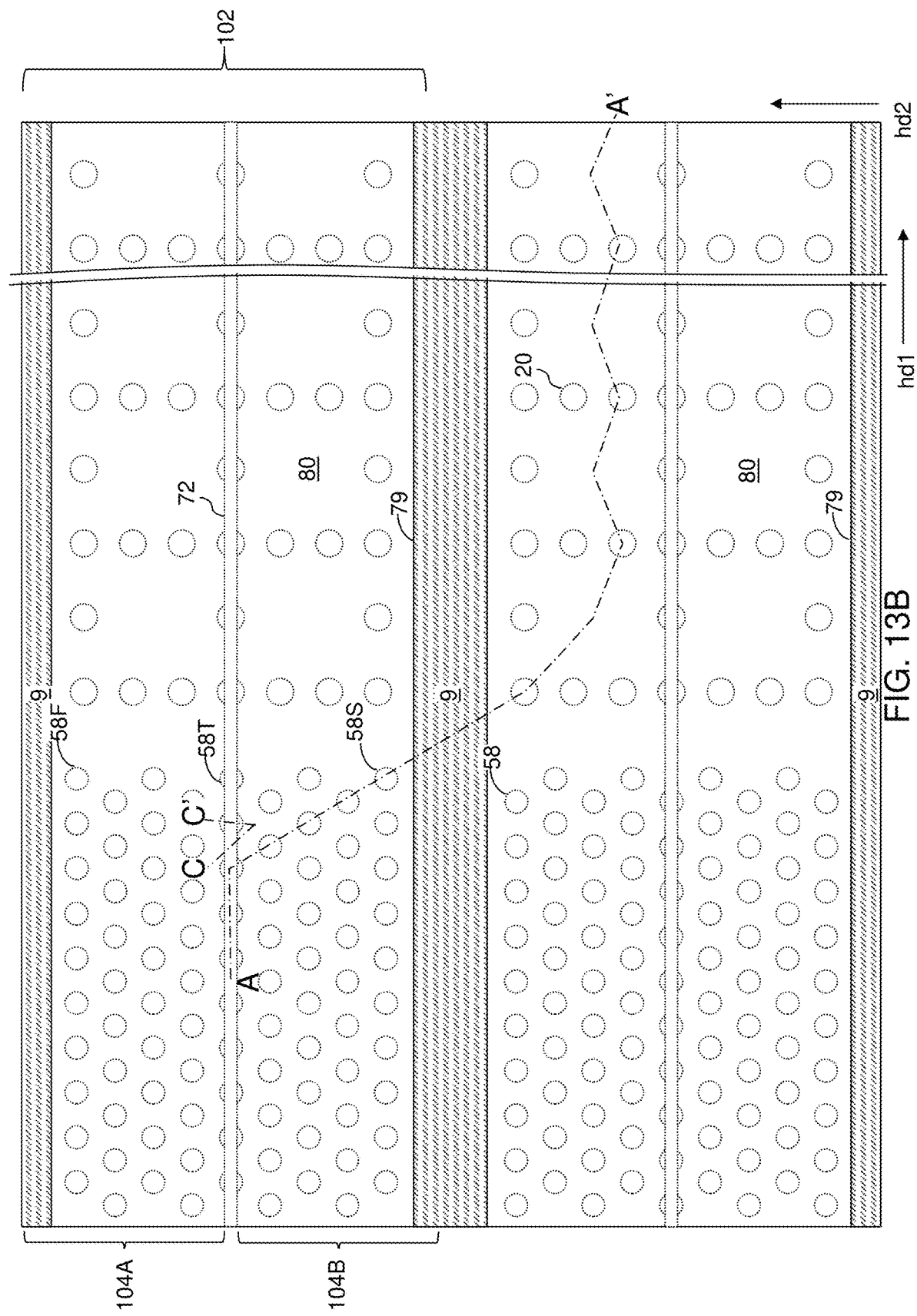

THREE-DIMENSIONAL MEMORY DEVICE WITH LATERALLY SEPARATED SOURCE SELECT ELECTRODES AND METHODS OF FORMING THE SAME

FIELD

The present disclosure relates generally to the field of semiconductor devices, and particularly to a three-dimensional semiconductor device including laterally separated source select electrodes in the same memory block, and methods for manufacturing the same.

BACKGROUND

Three-dimensional vertical NAND strings having one bit per cell are disclosed in an article by T. Endoh et al., titled "Novel Ultra High-Density Memory With A Stacked-Surrounding Gate Transistor (S-SGT) Structured Cell", IEDM Proc. (2001) 33-36.

SUMMARY

According to an aspect of the present disclosure, a semiconductor structure includes a memory block comprising an alternating stack of insulating layers and electrically conductive layers arranged along a vertical direction and laterally extending in a first horizontal direction; memory openings vertically extending through the alternating stack; and memory opening fill structures located in the memory openings, wherein each of the memory opening fill structures comprises a respective memory film and a respective vertical semiconductor channel. The electrically conductive layers comprise word lines, at least one bottom source side select gate electrode, and at least one primary source side select gate electrode located between the word lines and the at least bottom source side select gate electrode along the vertical direction. The word lines and the at least one bottom source side select gate electrode continuously laterally extend in a second horizontal direction perpendicular to the first horizontal direction through an entirety of the memory block, and the at least one primary source side select gate electrode is laterally separated along the second horizontal direction.

According to another aspect of the present disclosure, a method of forming a semiconductor structure is provided. The method comprises: forming a first alternating stack of first insulating layers and first sacrificial material layers over a substrate, wherein the first sacrificial material layers comprise, from bottom to top, at least one bottom-source-select-level sacrificial material layer and at least one primary-source-select-level sacrificial material layer; forming a source-side dielectric isolation structure laterally extending a first horizontal direction through the at least one primary-source-select-level sacrificial material layer but not through any portion of the at least one bottom-source-select-level sacrificial material layer; forming a second alternating stack of second insulating layers and second sacrificial material layers over the first alternating stack and the source-side dielectric isolation structure; forming memory openings through the second alternating stack and the first alternating stack; forming memory opening fill structures in the memory openings, wherein the each of the memory opening fill structures comprises a respective memory film and a respective vertical semiconductor channel; and replacing the second sacrificial material layers and the first sacrificial material layers with electrically conductive layers.

BRIEF DESCRIPTION OF THE DRAWINGS

FIG. 3B is a top-down view of the exemplary structure of FIG. 3A. The vertical plane A-A' is the cut plane of the vertical cross-sectional view of FIG. 3A.

FIG. 5B is a top-down view of the exemplary structure of FIG. 5A. The vertical plane A-A' is the cut plane of the vertical cross-sectional view of FIG. 5A.

FIG. 9B is a top-down view of the exemplary structure of FIG. 9A. The vertical plane A-A' is the cut plane of the vertical cross-sectional view of FIG. 9A.

FIG. 10B is a top-down view of the exemplary structure of FIG. 10A. The vertical plane A-A' is the cut plane of the vertical cross-sectional view of FIG. 10A.

FIG. 13B is a top-down view of the exemplary structure of FIG. 13A. The vertical plane A-A' is the cut plane of the vertical cross-sectional view of FIG. 13A.

DETAILED DESCRIPTION

Figure 1:
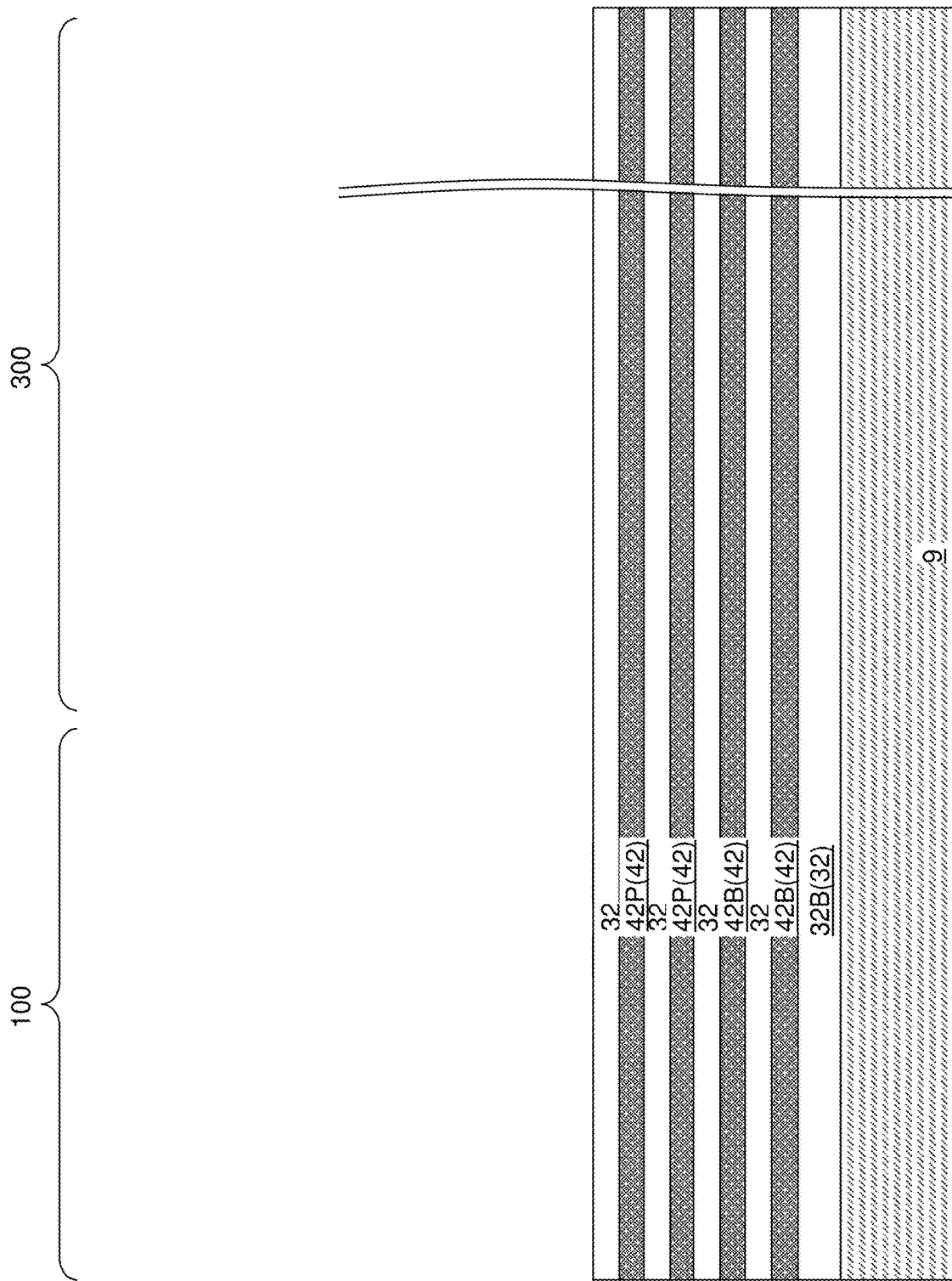
FIG. 1 is a schematic vertical cross-sectional view of an exemplary structure after formation of a first alternating stack of first insulating layers and first sacrificial material layers over a carrier substrate according to an embodiment of the present disclosure.

As discussed above, the present disclosure is directed to a three-dimensional semiconductor device including laterally-divided primary-source-select-level electrodes and source-side isolation structures that are level-offset from source-side ends of vertical semiconductor channels by undivided bottom-source-select-level electrodes, and methods for manufacturing the same, the various aspects of which are described below. Embodiments of the disclosure can be employed to form various structures including semiconductor devices, such as three-dimensional memory array devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, an exemplary structure according to an embodiment of the present disclosure is illustrated. The exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

A first alternating stack {32, (42B, 42P)} of first insulating layers 32 and first sacrificial material layers (42B, 42P) can be formed over the carrier substrate 9. The first insulating layers 32 comprise an insulating material such as undoped silicate glass (i.e., silicon oxide) or a doped silicate glass, and the first sacrificial material layers (42B, 42P) comprise a sacrificial material, such as silicon nitride or silicon-germanium. In one embodiment, the first insulating layers 32 may comprise silicon oxide layers, and the first sacrificial material layers (42B, 42P) may comprise silicon nitride layers. The first sacrificial material layers (42B, 42P) comprise, from bottom to top, at least one bottom-source-select-level sacrificial material layer 42B and at least one primary-source-select-level sacrificial material layer 42P. While the illustrated embodiment of the first alternating stack {32, (42B, 42P)} comprises two bottom-source-select-level sacrificial material layers 42B and two primary-source-select-level sacrificial material layer 42P, alternative embodiments are expressly contemplated herein in which the total number of the at least one the bottom-source-select-level sacrificial material layer 42B is a positive integer other than 2 (such as 1, 3, 4, 5, 6, etc.) and/or the total number of the at least one primary-source-select-level sacrificial material layer 42P is another positive integer other than 2 (such as 1, 3, 4, 5, 6, etc.).

Each bottom-source-select-level sacrificial material layer 42B is a sacrificial material layer that is subsequently replaced with a bottom-source-select-level electrically conductive layer (i.e., a bottom source side select gate electrode). Each bottom-source-select-level electrically conductive layer may be employed to erase a block of NAND strings. Each primary-source-select-level sacrificial material layer 42P is a sacrificial material layer that is subsequently replaced with a primary-source-select-level electrically conductive layer (i.e., a primary source side select gate electrode). Each primary-source-select-level electrically conductive layer may be employed to erase a subblock of NAND strings, which is a portion of a block of NAND strings that is less than the entirety of the block of NAND strings. Therefore, during erasing of a subblock of NAND strings, each bottom-source-select-level electrically conductive layer and each primary-source-select-level electrically conductive layer that controls the subblock are turned on (i.e., an erase voltage is applied to these select gate electrodes).

The exemplary structure may comprise a memory array region 100 in which NAND strings are to be subsequently formed, and a contact region 300 in which contact via structures for word lines and various select gate electrodes are to be subsequently formed. The bottommost one of the insulating layers 32 is hereafter referred to as a bottommost insulating layer 32.

Figure 2A:
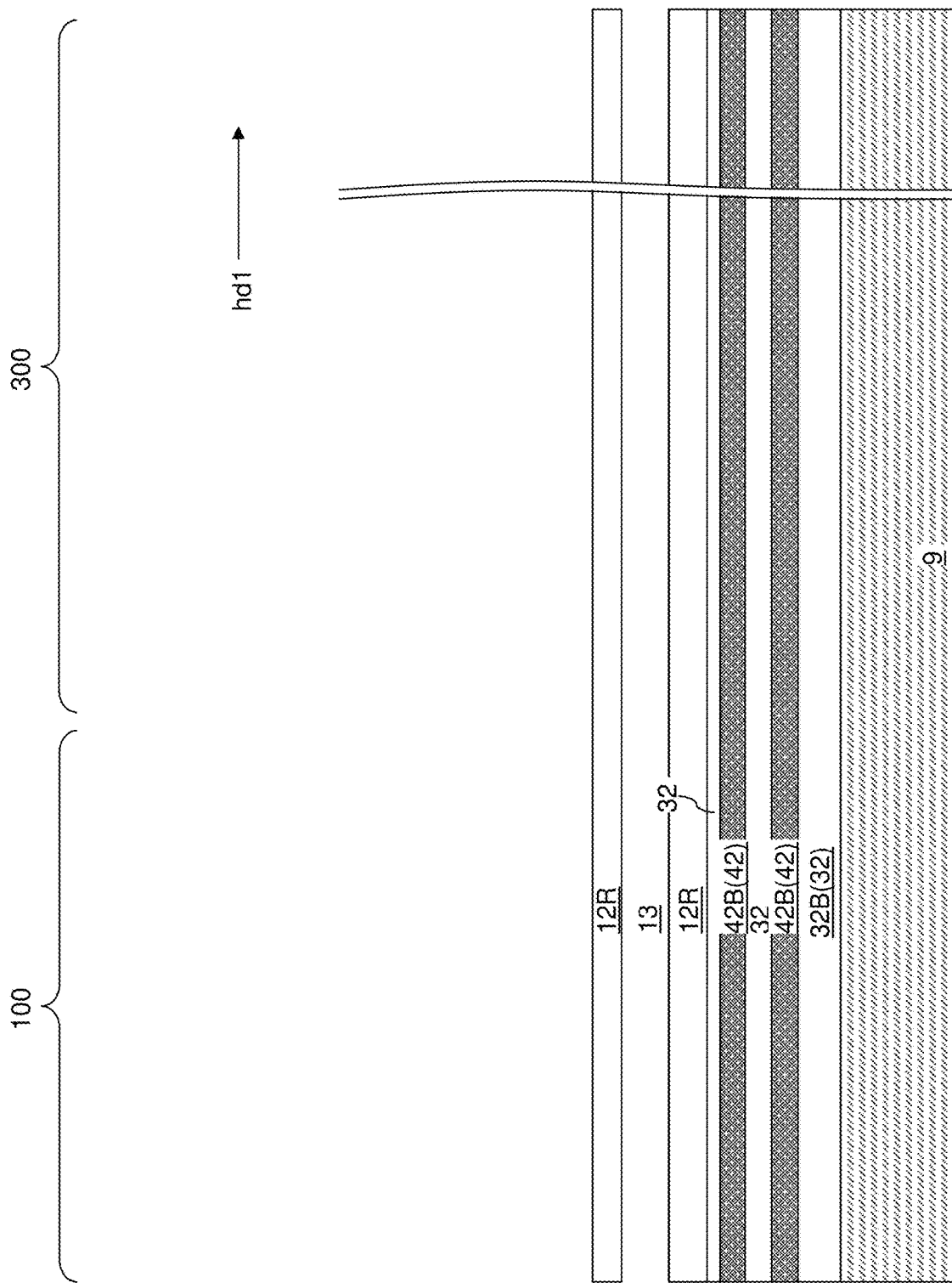
FIG. 2A is a schematic vertical cross-sectional view of the exemplary structure after formation of source-side dielectric isolation structures through at least one primary-source-select-level sacrificial material layer according to an embodiment of the present disclosure.
Figure 2B:
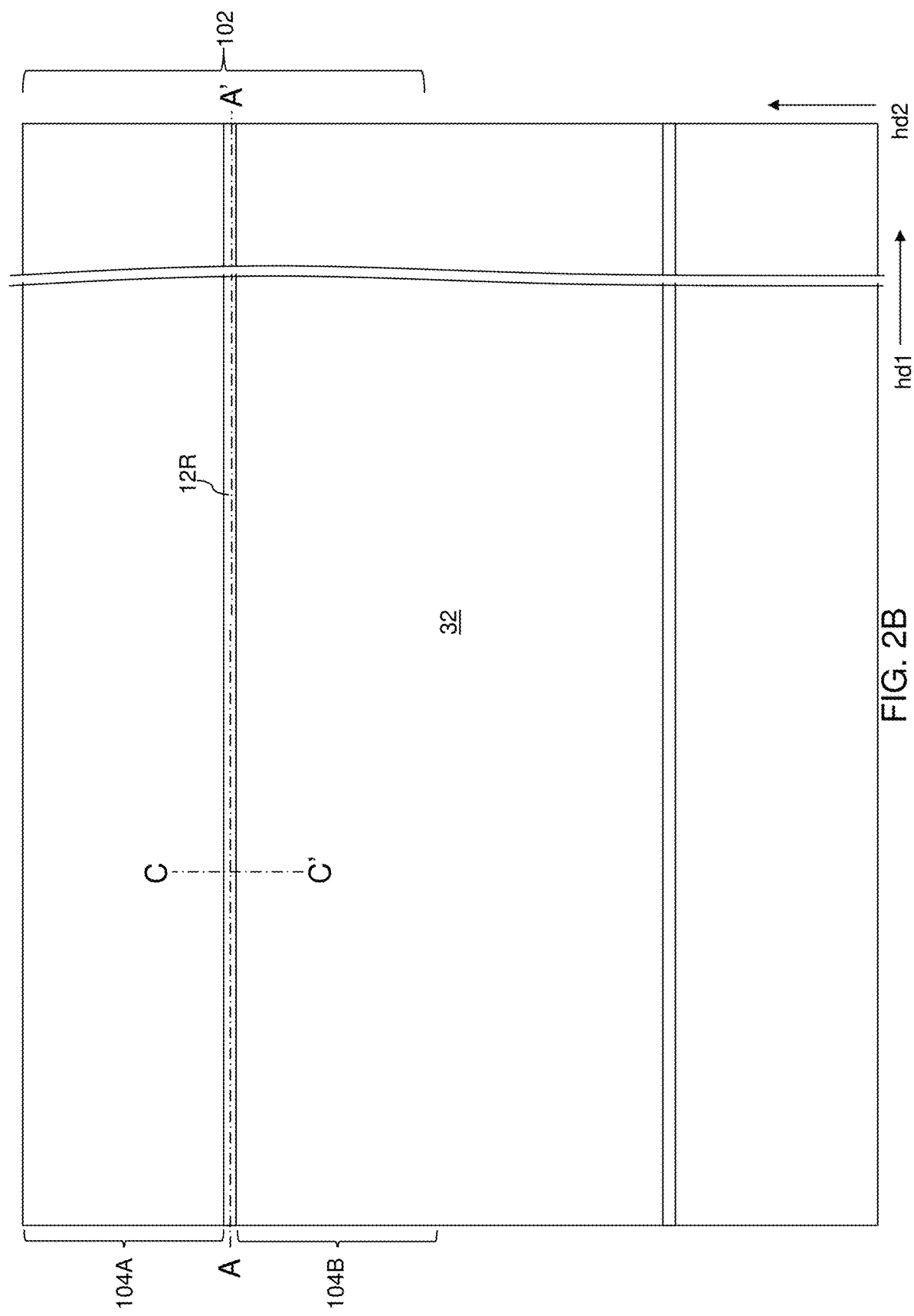
FIG. 2B is a top-down view of the exemplary structure of FIG. 2A. The vertical plane A-A' is the cut plane of the vertical cross-sectional view of FIG. 2A.
Figure 2C:
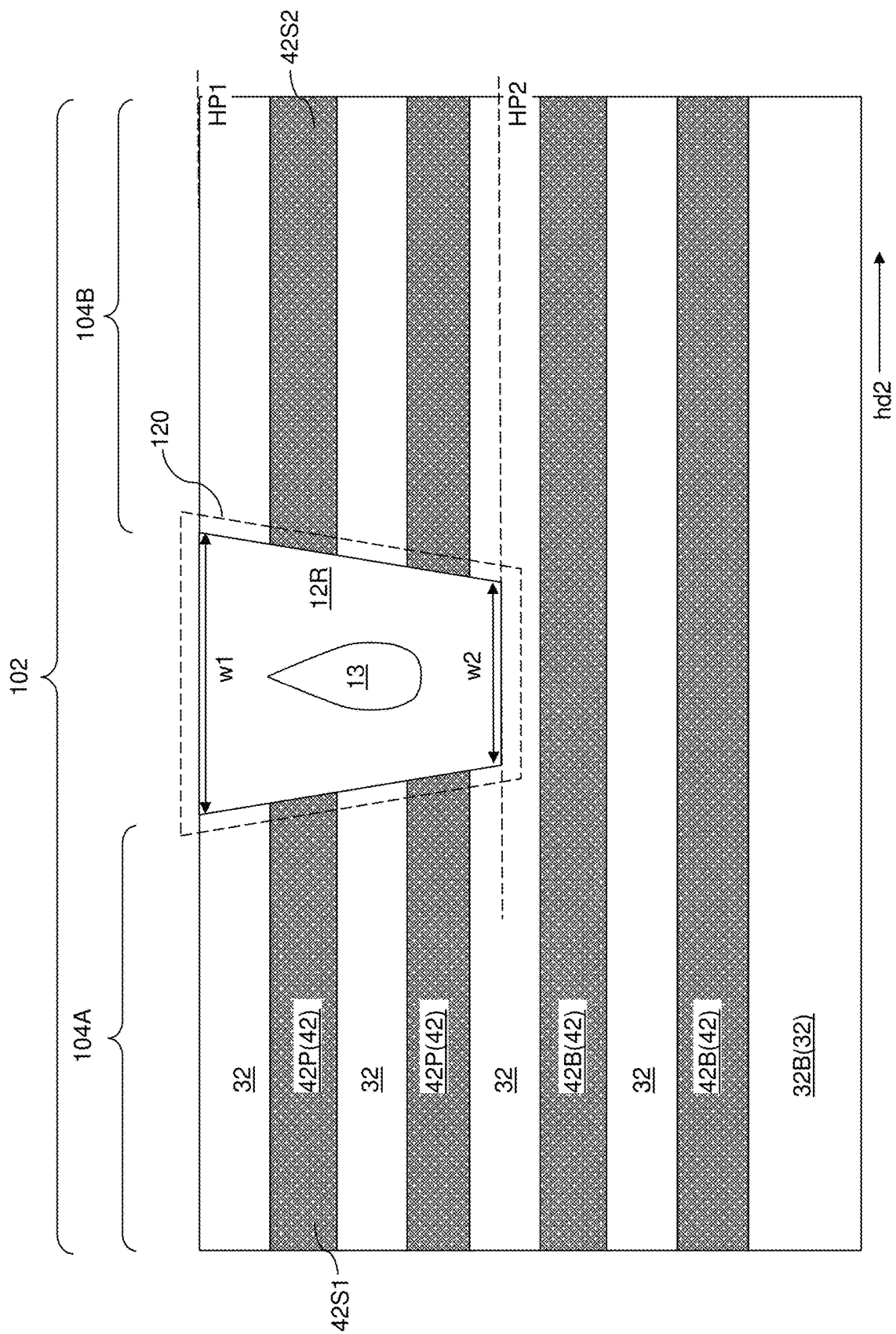
FIG. 2C is a vertical cross-sectional view of a region of the exemplary structure along the vertical plane C-C' of FIG. 2B.

Referring to FIGS. 2A-2C, a photoresist layer (not shown) can be applied over the first alternating stack {32, (42B, 42P)}, and can be lithographically patterned to form slit-shaped openings that laterally extend along a first horizontal direction (e.g., word line direction) hd1. The center-to-center distance between neighboring pairs of slit-shaped openings along a second horizontal direction (e.g., bit line direction) hd2 that is perpendicular to the first horizontal direction hd1 may be the same as the width along the second horizontal direction hd2 of the subblock of NAND strings to be subsequently formed. An anisotropic etch process can be performed to transfer the pattern of the slit-shaped openings in the photoresist layer through each of the at least one primary-source-select-level sacrificial material layer 42P. The trenches that are formed through the at least one primary-source-select-level sacrificial material layer 42P are herein referred to as source-select-level isolation trenches. The source-select-level isolation trenches vertically extend through each of the at least one primary-source-select-level sacrificial material layer 42P, but do not vertically extend into any of bottom-source-select-level sacrificial material layers 42B.

Referring to FIG. 2C, each of the source-select-level isolation trenches may vertically extend from a first horizontal plane HP1 including a topmost layer of the first alternating stack {32, (42B, 42P)} to a second horizontal plane HP2 including bottom surfaces of the source-select-level isolation trenches located within an insulating layer 32 that contacts a top surface of a topmost one of the at least one bottom-source-select-level sacrificial material layer 42B. The width of each source-select-level isolation trench along the second horizontal direction hd2 within the first horizontal plane HP1 is herein referred to as a first width w1, and the width of each source-select-level isolation trench along the second horizontal direction hd2 within the second horizontal plane HP2 is herein referred to as a second width w2.

According to an optional aspect of the present disclosure, the first width w1 may be less than the maximum lateral dimension of each memory opening to be subsequently formed. For example, the first width w1 may be in a range from 10 nm to 200 nm, such as from 20 nm to 100 nm, although lesser and greater dimensions may also be employed. According to an optional aspect of the present disclosure, the source-select-level isolation trenches may have tapered sidewalls which extend along the first horizontal direction, such that the first width w1 is greater than the second width w2.

A dielectric fill material, such as silicon oxide, can be deposited in the source-select-level isolation trenches, for example, by a chemical vapor deposition process. Excess portions of the dielectric fill material deposited above the first horizontal plane HP1 can be removed by a planarization process, which may comprise a recess etch process or a chemical mechanical polishing process. Each remaining portion of the dielectric fill material that remains in a respective one of the source-select-level isolation trenches constitutes a dielectric isolation structure, which is herein referred to as a source-side dielectric isolation structure 120.

In one embodiment, the top surface of each source-side dielectric isolation structure 120 may be located within a first horizontal plane HP1 including the top surface of the topmost insulating layer 32 of the first alternating stack {32, (42B, 42P)}. The bottom surface of each source-side dielectric isolation structure 120 may be located within the second horizontal plane HP2 that is located below a top surface of another of the insulating layers 32 that is interposed between the at least one primary-source-select-level sacrificial material layer 42P and the at least one bottom-source-select-level sacrificial material layer 42B. In one embodiment, a top surface of each source-side dielectric isolation structure 120 has the first width w1 along the second horizontal direction hd2 that is perpendicular to the first horizontal direction hd1. In one embodiment, the bottom surface of the source-side dielectric isolation structure 120 has the second width w2 along the second horizontal direction hd2 that is less than the first width w1. Thus, in one embodiment, the source-select-level isolation structure 120 may have tapered sidewalls which extend along the first horizontal direction, such that the first width w1 is greater than the second width w2.

Generally, the source-select-level isolation trenches do not extend into any of the bottom-source-select-level sacrificial material layers 42B. As such, the source-side dielectric isolation structures 120 are formed through each of the primary-source-select-level sacrificial material layers 42P without removing any portion of the bottom-source-select-level sacrificial material layers 42B. In one embodiment, the source-side dielectric isolation structures 120 divide each of the primary-source-select-level sacrificial material layers 42P into multiple portions that are laterally spaced from each other along the second horizontal direction hd2. For example, each source-side dielectric isolation structure 120 divides each primary-source-select-level sacrificial material layer 42P into a respective pair of sacrificial material strips, which are herein referred to as a first sacrificial material strip 42S1 and a second sacrificial material strip 42S1, as shown in FIG. 2C. The first sacrificial material strip 42S1 is located in a first memory subblock 104A of a memory block 102 and a second sacrificial material strip 42S1 is located in a second memory subblock 104B of the same memory block 102.

The source-select-level isolation trenches may have a relative high aspect ratio. In other words, the ratio of the vertical distance between the first horizontal plane HP1 and the second horizontal plane HP2 to the first width w1 can be a relatively large number, such as a number in a range from 3 to 10. Due to the high aspect ratio, the dielectric fill material that is deposited in a source-select-level isolation trench may have a laterally-extending void (i.e., air gap) that extends along the first horizontal direction hd1. The laterally-extending void is herein referred to as a lateral through-hole 13. The portion of the dielectric fill material that encloses the lateral through-hole 13 laterally-extends along the first horizontal direction hd1 with a uniform vertical cross-sectional profile, and is herein referred to as a dielectric material rail 12R. Thus, each source-side dielectric isolation structure 120 may comprise a combination of a dielectric material rail 12R and a lateral through-hole 13, which is a cavity that is completely enclosed by the dielectric material rail 12R. The lateral through-hole 13 also laterally extends in the first horizontal direction hd1 between the two memory subblocks (104A, 104B) of the same memory block 102. Alternatively the lateral through-hole 13 may be omitted in some or more of the source-side dielectric isolation structures 120.

Figure 3A:
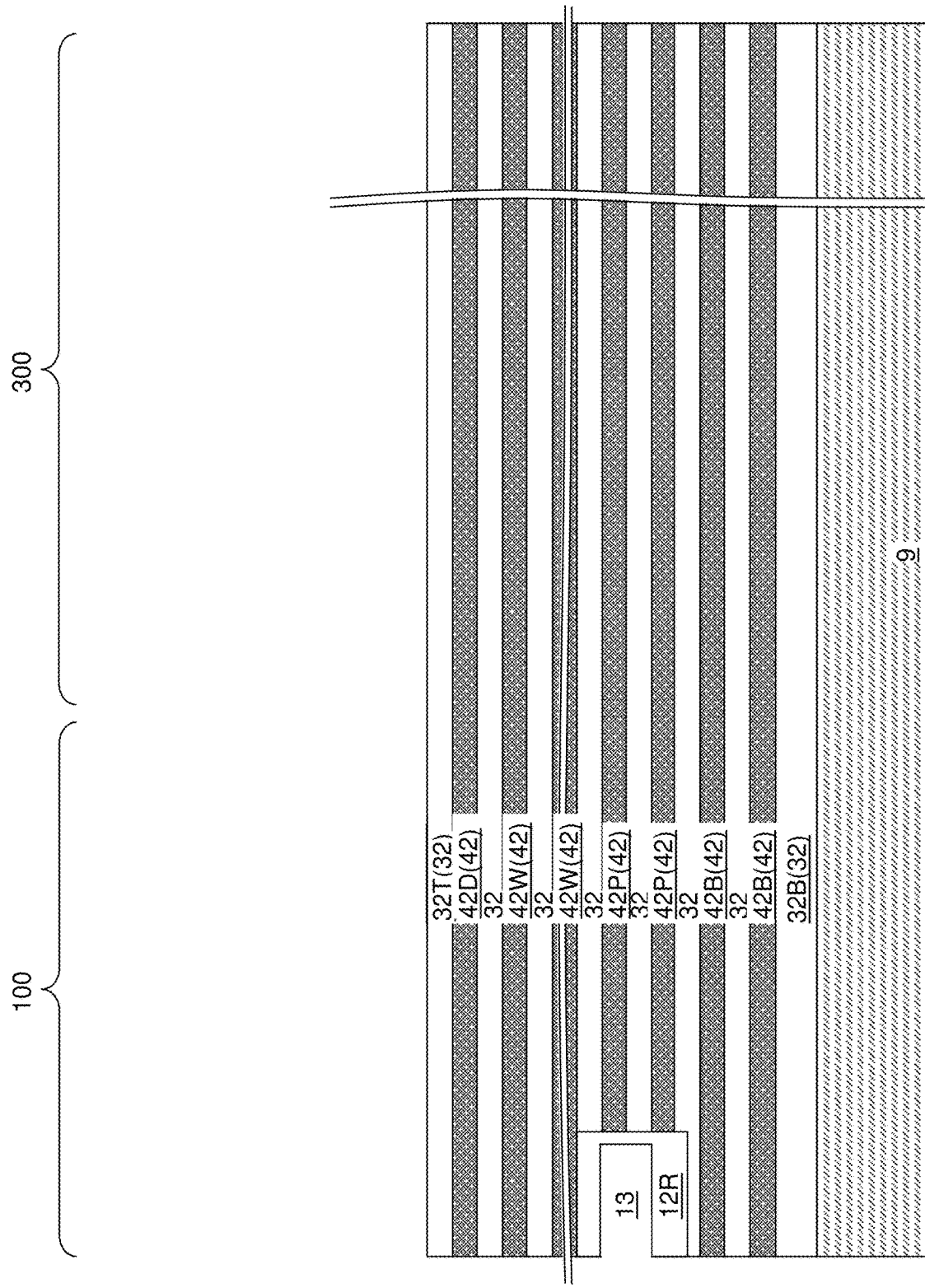
FIG. 3A is a schematic vertical cross-sectional view of the exemplary structure after formation of a second alternating stack of second insulating layers and second sacrificial material layers according to an embodiment of the present disclosure.

Referring to FIGS. 3A and 3B, a second alternating stack {32, (42W, 42D)} of second insulating layers 32 and second sacrificial material layers (42B, 42D) can be formed over the first alternating stack {32, (42B, 42P)} and the source-side dielectric isolation structures 120. The second insulating layers 32 comprise an insulating material such as undoped silicate glass or a doped silicate glass, and the second sacrificial material layers (42W, 42D) comprise a sacrificial material such as silicon nitride or a silicon-germanium alloy. In one embodiment, the second insulating layers 32 may comprise silicon oxide layers, and the second sacrificial material layers (42W, 42D) may comprise silicon nitride layers. In one embodiment, the second insulating layers 32 may comprise the same material as the first insulating layers 32, and the second sacrificial material layers (42W, 42D) may comprise the same material as the first sacrificial material layers (42B, 42P). The second sacrificial material layers (42W, 42D) comprise, from bottom to top, word-line-level sacrificial material layer 42W and at least one drain-select-level sacrificial material layer 42D.

The total number of word-line-level sacrificial material layers 42W within the second alternating stack {32, (42W, 42D)} may be, for example, in a range from 8 to 1,024, such as from 32 to 256, although lesser and greater number of repetitions may also be employed. The topmost one of the insulating layers 32 is hereafter referred to as a topmost insulating layer 32T. While an embodiment is illustrated in which only a single drain-select-level sacrificial material layer 42D is present, alternative embodiments are expressly contemplated herein in which a plurality of drain-select-level sacrificial material layers 42D is employed. The at least one bottom-source-select-level sacrificial material layer 42B, the at least one primary-source-select-level sacrificial material layer 42P, the word-line-level sacrificial material layers 42W, and the at least one drain-select-level sacrificial material layer 42D are collectively referred to as sacrificial material layers 42. The combination of the first alternating stack {32, (42B, 42P)} and the second alternating stack {32, (42W, 42D)} is hereafter referred to as an alternating stack (32, 42) of insulating layers 32 and sacrificial material layers 42.

Figure 4:
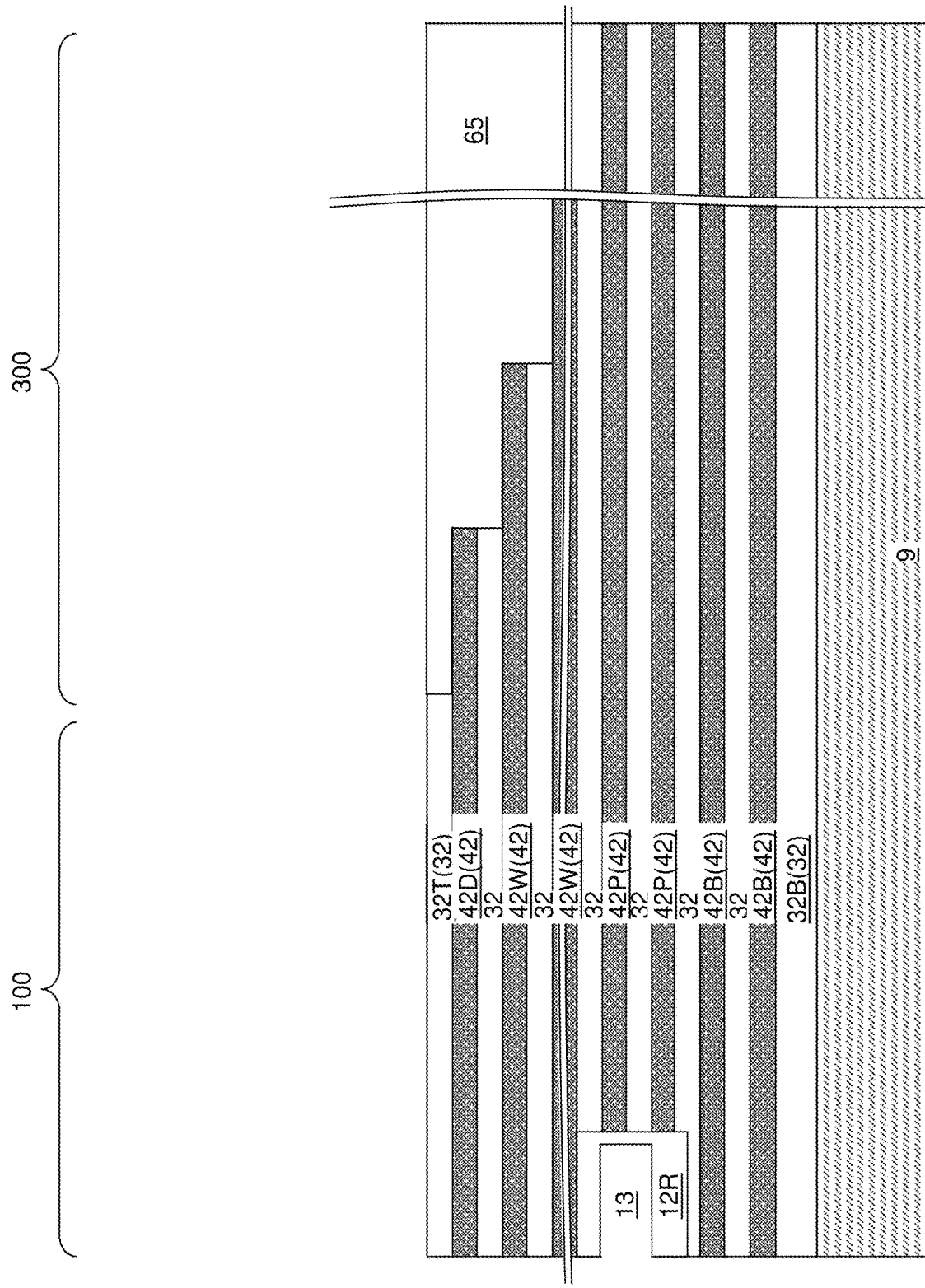
FIG. 4 is a schematic vertical cross-sectional view of the exemplary structure after formation of stepped surfaces and a stepped dielectric material portion according to an embodiment of the present disclosure.

Referring to FIG. 4, optional stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the carrier substrate 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases or decreases stepwise as a function of a vertical distance from a top surface of a substrate on which the element is present. If silicon oxide is employed for the stepped dielectric material portion 65, the silicon oxide of the stepped dielectric material portion 65 may optionally be doped with dopants such as B, P, and/or F.

Figure 5A:
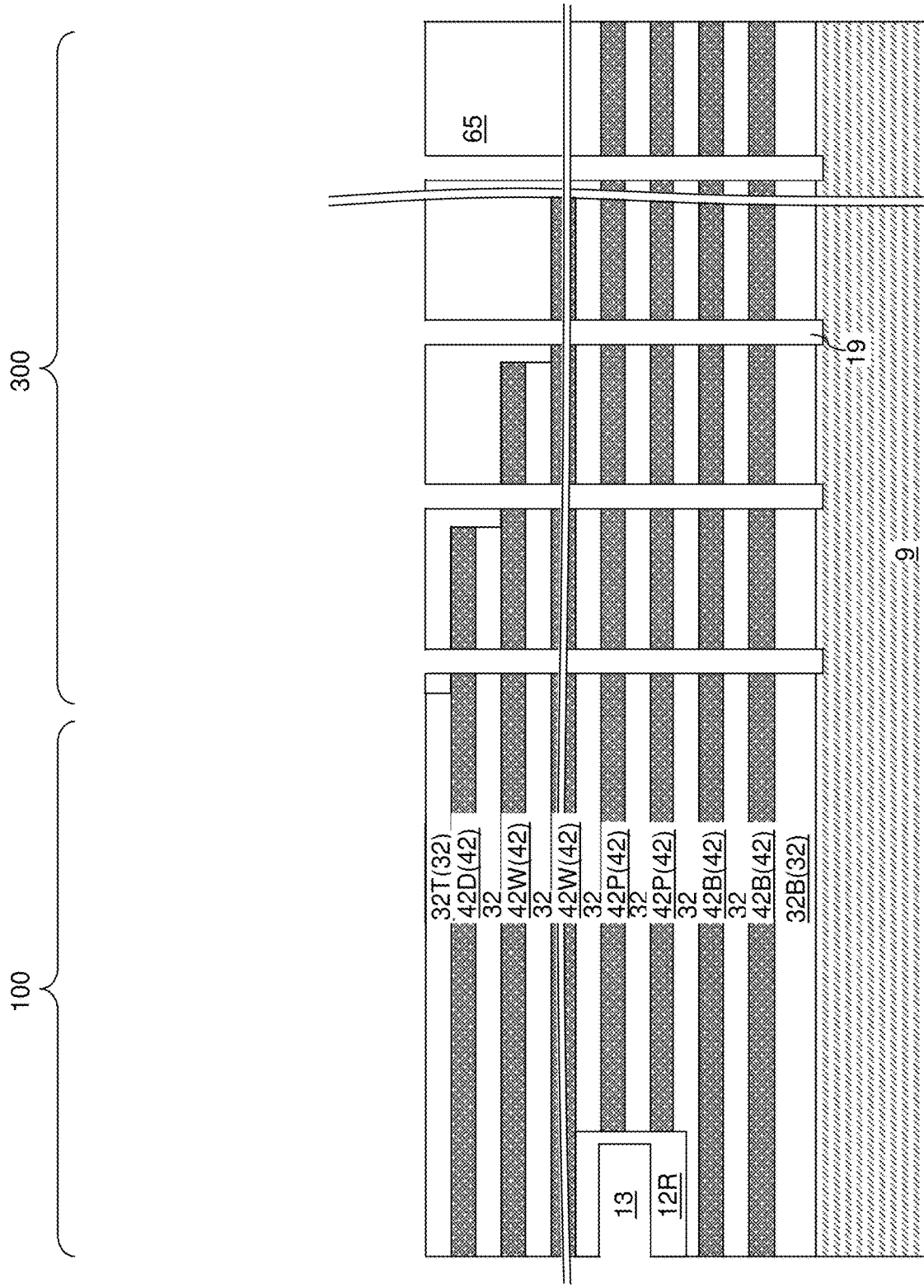
FIG. 5A is a schematic vertical cross-sectional view of the exemplary structure after formation of support openings according to an embodiment of the present disclosure.

Referring to FIGS. 5A and 5B, an optional first etch mask layer (such as a photoresist layer) can be formed over the alternating stack (32, 42), and can be lithographically patterned to form openings in the contact region 300. An optional anisotropic etch process can be performed to transfer the pattern of the openings in the first etch mask layer through the stepped dielectric material portion 65 and the alternating stack (32, 42). Support openings 19 can be formed through the stepped dielectric material portion 65 and the alternating stack (32, 42) in the contact region 300. Each of the support openings 19 can vertically extend into the carrier substrate 9. In one embodiment, bottom surfaces of the support openings 19 may be formed at or below the top surface of the carrier substrate 9. The support openings 19 may have a diameter in a range from 20 nm too 400 nm, such as from 50 nm to 300 nm, although lesser and greater thicknesses may be employed.

Figure 6:
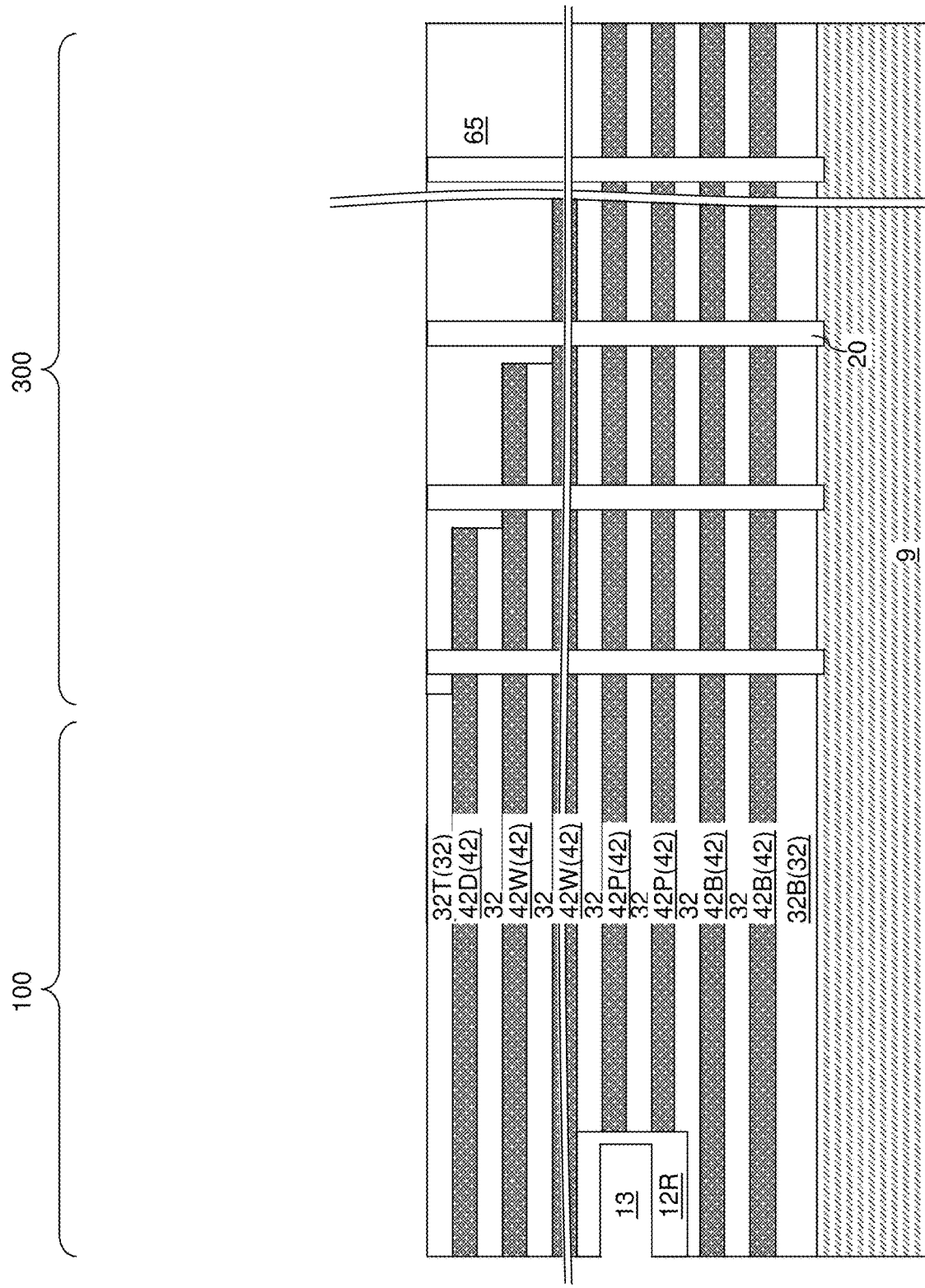
FIG. 6 is a vertical cross-sectional view of the exemplary structure after formation of support pillar structures according to an embodiment of the present disclosure.
Figure 7A:
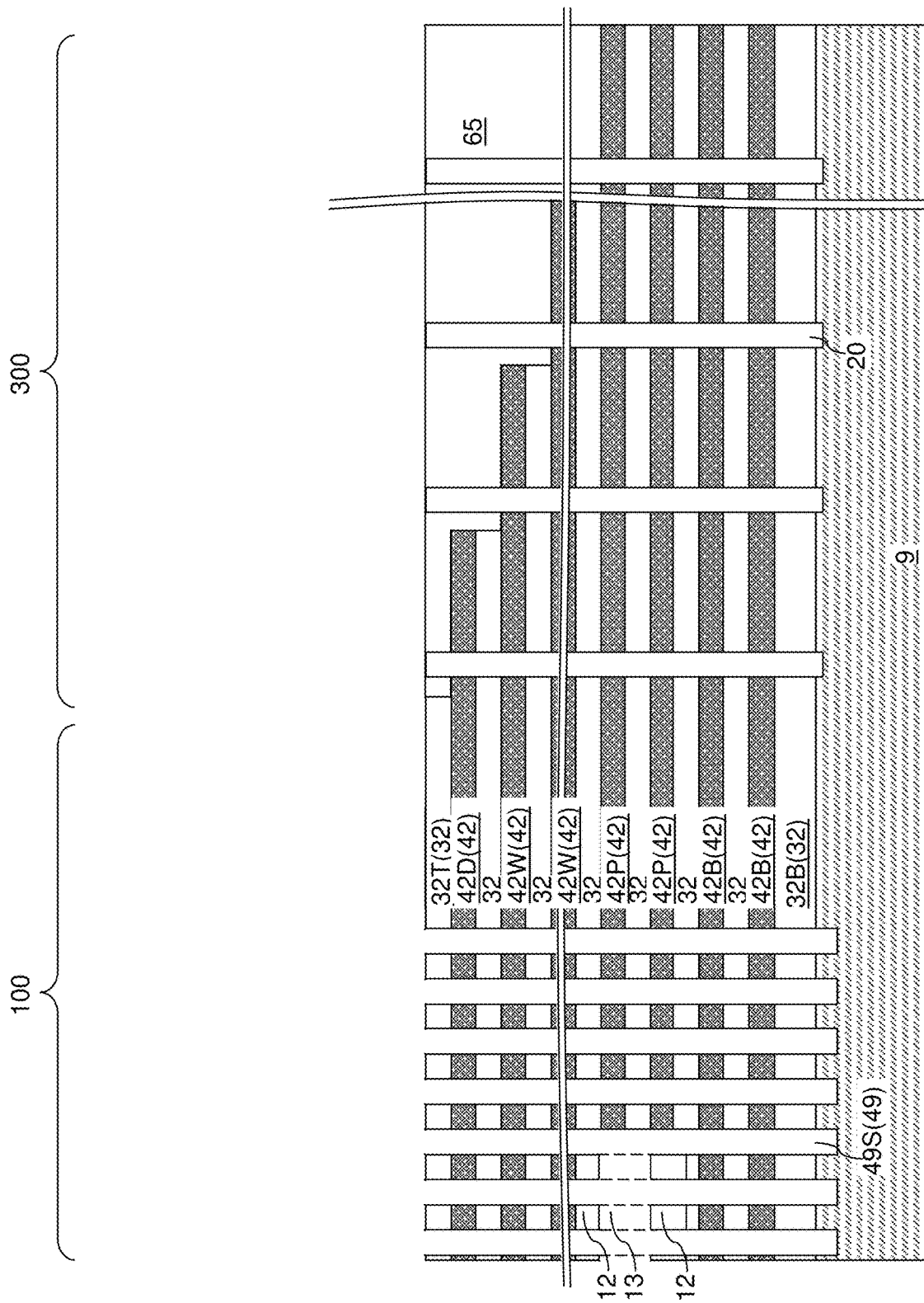
FIG. 7A is a schematic vertical cross-sectional view of the exemplary structure after formation of memory openings according to an embodiment of the present disclosure.
Figure 7B:
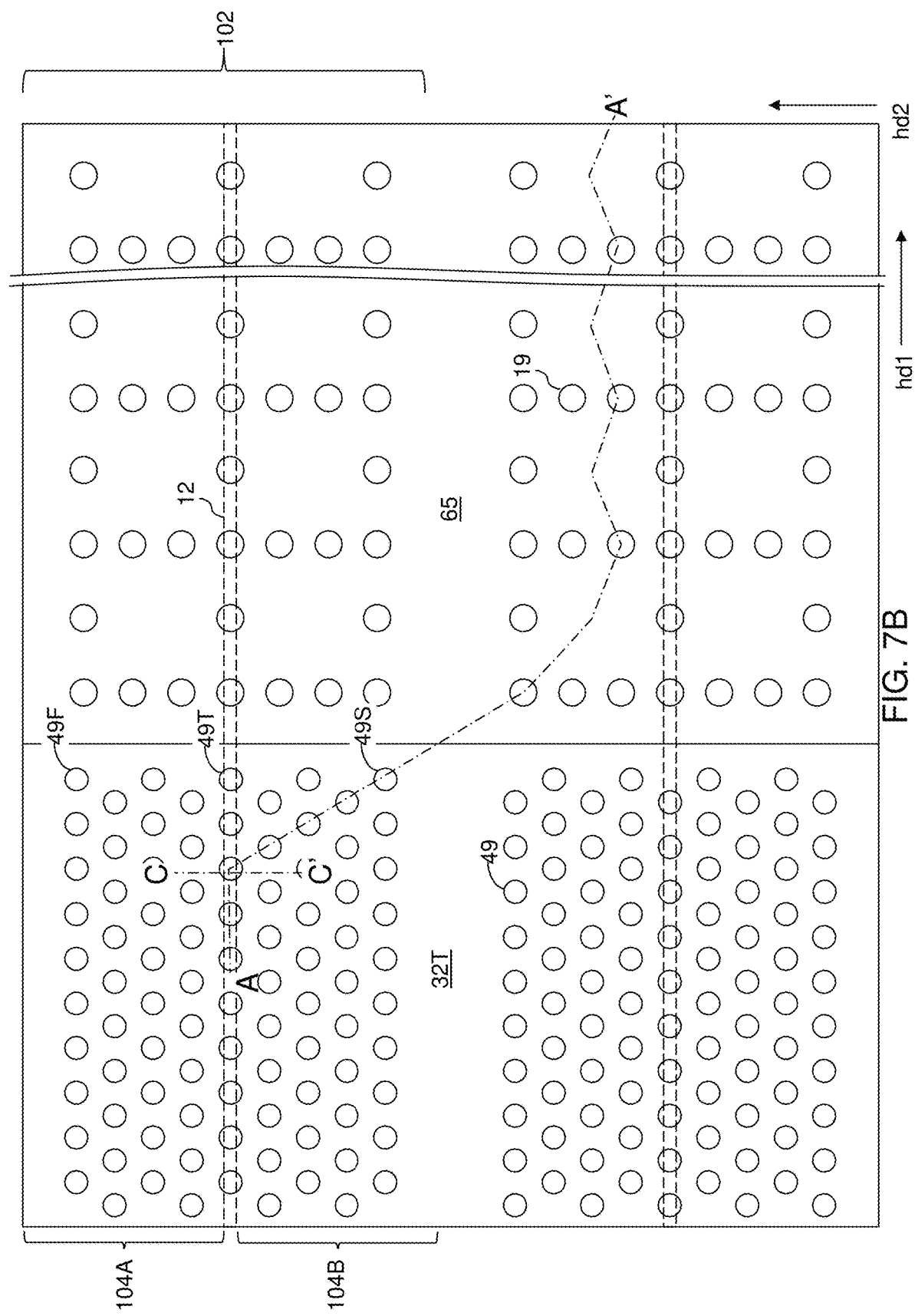
FIG. 7B is a top-down view of the exemplary structure of FIG. 7A. The vertical plane A-A' is the cut plane of the vertical cross-sectional view of FIG. 7A.
Figure 7C:
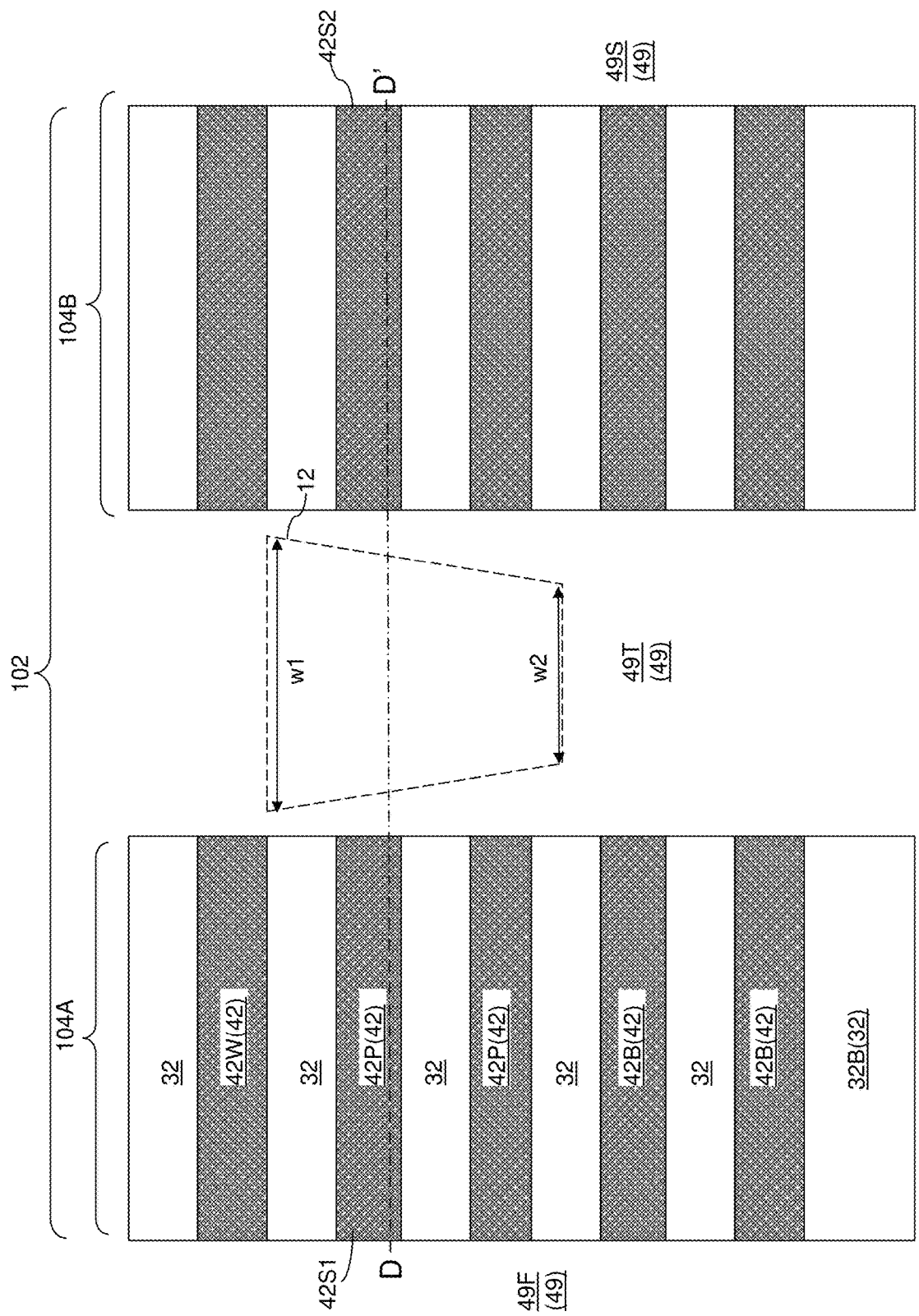
FIG. 7C is a vertical cross-sectional view of a region of the exemplary structure along the vertical plane C-C' of FIG. 7B.
Figure 7D:
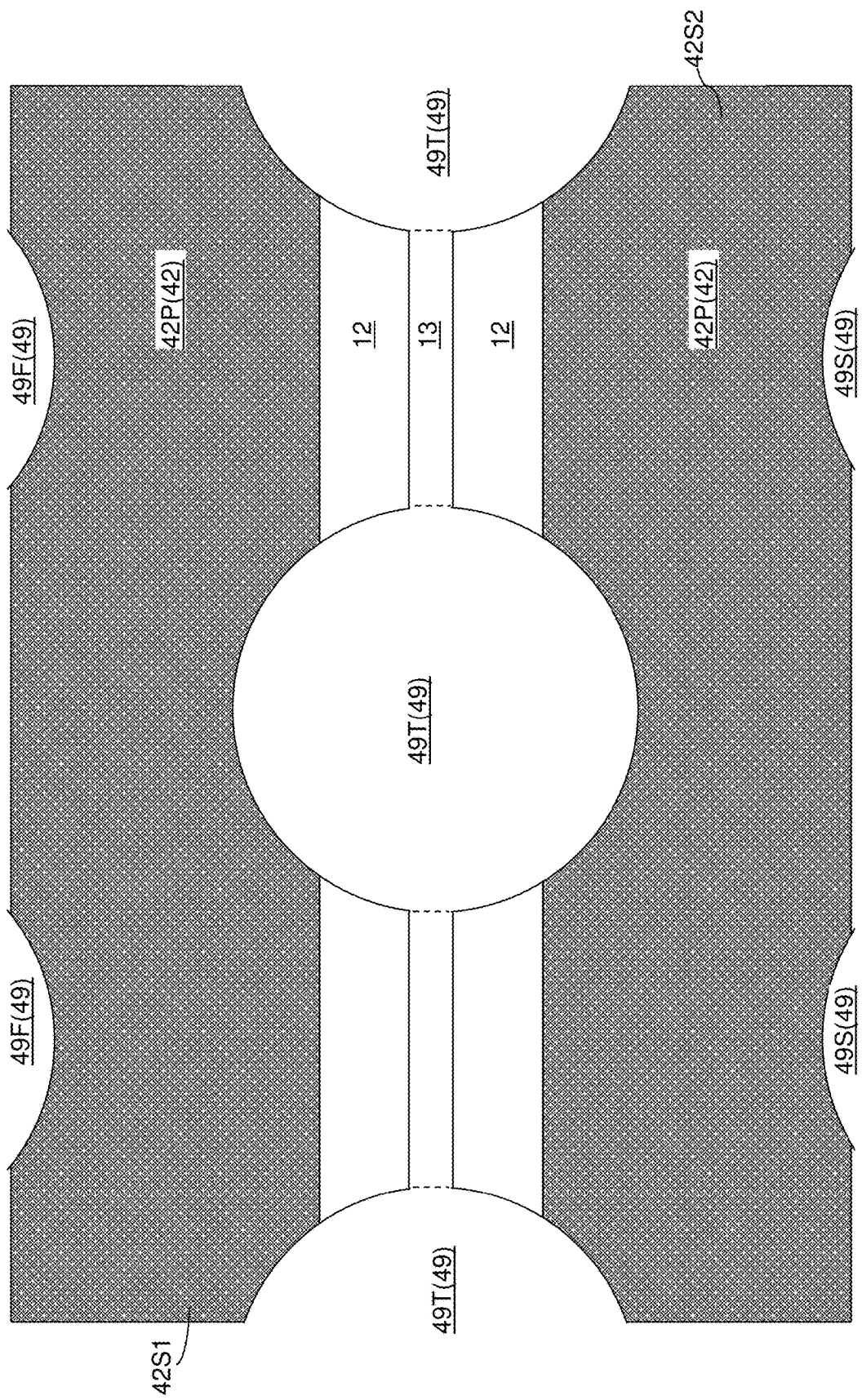
FIG. 7D is a horizontal cross-sectional view of a region of the exemplary structure along the horizontal plane D-D' of FIG. 7C.

Referring to FIG. 6, an optional dielectric fill material, such as silicon oxide, can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the stepped dielectric material portion 65 during replacement of the sacrificial material layers 42 with electrically conductive layers.

Referring to FIGS. 7A-7D, a second etch mask layer (such as a photoresist layer) can be formed over the alternating stack (32, 42), and can be lithographically patterned to form openings in the memory array region 100. An anisotropic etch process can be performed to transfer the pattern of the openings in the second etch mask layer through the alternating stack (32, 42). Memory openings 49 can be formed through the alternating stack (32, 42) in the memory array region 100. Each of the memory openings 49 can vertically extend into the carrier substrate 9. In one embodiment, bottom surfaces of the memory openings 49 may be formed at or below the top surface of the carrier substrate 9. Each cluster of memory openings 49 in a respective memory subblock (104A, 104B) may comprise a plurality of rows of memory openings 49. Each row of memory openings 49 may comprise a plurality of memory openings 49 that are arranged along the first horizontal direction hd1 with a uniform pitch. The rows of memory openings 49 may be laterally spaced from each other along the second horizontal direction hd2, which may be perpendicular to the first horizontal direction hd2. In one embodiment, each cluster of memory openings 49 may be formed as a two-dimensional periodic array of memory openings 49. The memory openings 49 may have a diameter in a range from 60 nm to 400 nm, such as from 120 nm to 300 nm, although lesser and greater thicknesses may be employed.

According to an aspect of the present disclosure, each cluster of memory openings 49 comprise rows of first memory openings 49F, rows of second memory openings 49S, and a row of third memory openings 49T. The first memory openings 49F are located in the first memory subblock 104A, vertically extend through at least one first sacrificial material strip 42S1 of at least one primary-source-select-level electrically conductive layer 42P, and are laterally spaced from each second sacrificial material strip 42S2 of the at least one primary-source-select-level electrically conductive layer 42P located in the second memory subblock 104B. The second memory openings 49S are located in the second memory subblock 104B, vertically extend through at least one second sacrificial material strip 42S2 of the at least one primary-source-select-level electrically conductive layer 42P, and are laterally spaced from each first sacrificial material strip 42S1 of the at least one primary-source-select-level electrically conductive layer 42P located in the first memory subblock 104A. The row of third memory openings 49T is arranged along the first horizontal direction hd1, and divides a source-side dielectric isolation structure 120 into multiple dielectric material blocks 12. In other words, the third memory openings 49T extend through the source-side dielectric isolation structure 120 between the two memory subblocks (104A, 104B) of the same memory block 102.

Thus, each dielectric material rail 12R can be divided into a respective row of dielectric material blocks 12 by a respective row of third memory openings 49T. In one embodiment, the multiple dielectric material blocks 12 surround a respective lateral through-hole 13 that laterally extends along the first horizontal direction hd1. Each of the lateral through-holes 13 may be connected to at least one memory opening 49. At least one of the third memory openings 49T within each row of third memory openings 49T may be laterally bounded by a pair of dielectric material blocks 12, and/or may be connected to a pair of lateral through-holes 13. Dielectric material blocks 12 within each row can be laterally spaced apart from each other along the first horizontal direction hd1, and can be interlaced with a row of third memory openings 49T along the first horizontal direction hd1. A row of third memory openings 49T may be interconnected through an interlaced row of lateral through-holes 13 (if present).

FIGS. 8A-8F are sequential vertical cross-sectional views of a memory opening 49 during formation of a memory opening fill structure 58 according to an embodiments of the present disclosure.

Figure 8B:
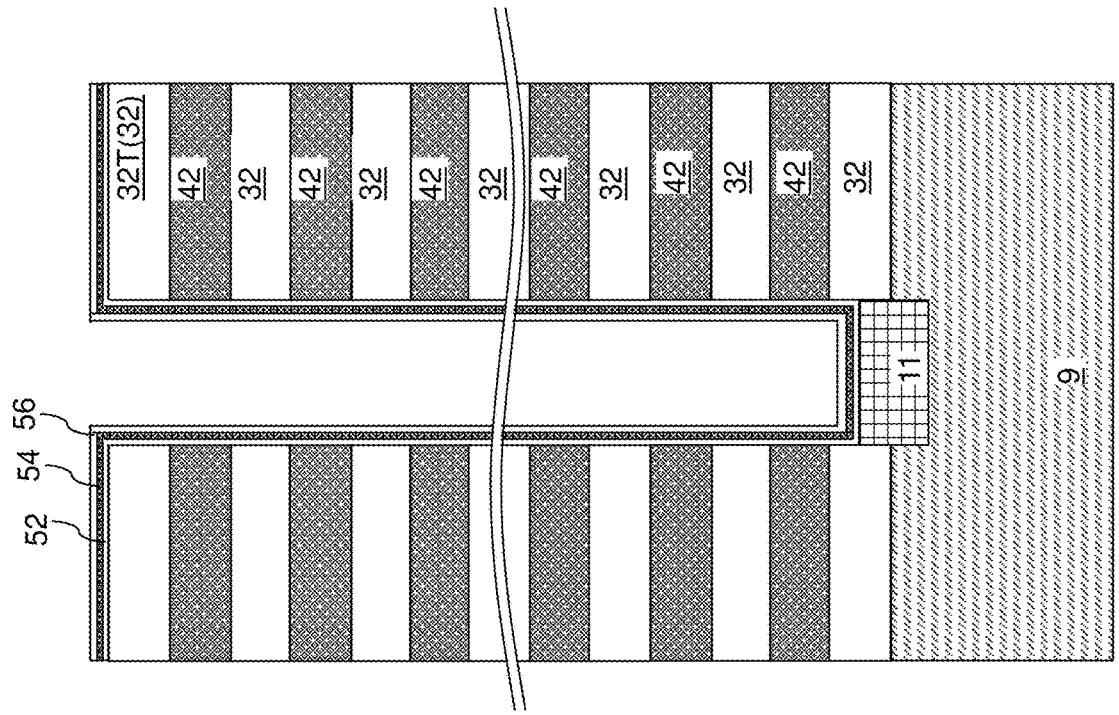
FIGS. 8A-8F are sequential vertical cross-sectional views of a memory opening during formation of a memory opening fill structure according to an embodiments of the present disclosure.
Figure 8A:
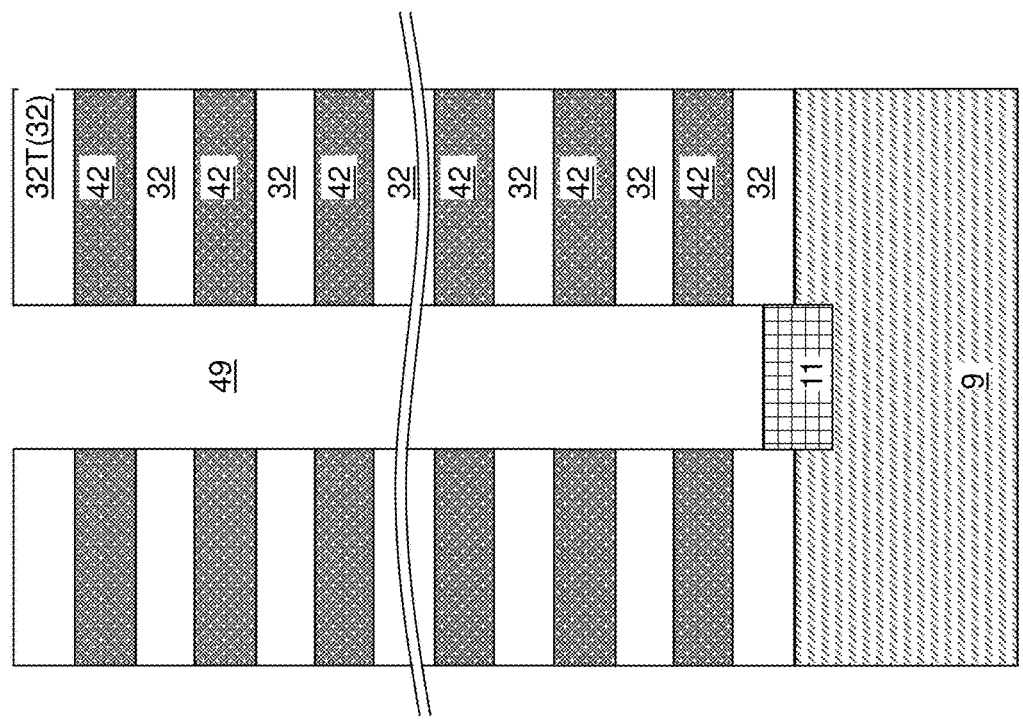

Referring to FIG. 8A, sacrificial pedestal structures 11 can be formed at the bottom of each of the memory openings 49. In an embodiment in which the carrier substrate 9 comprises a semiconductor material (such as single crystalline silicon), the sacrificial pedestal structures 11 may comprise a semiconductor material, such as single crystal silicon or polysilicon, and can be formed by selective growth of the semiconductor material from physically exposed surfaces of the carrier substrate 9. A selective semiconductor deposition process such as a selective epitaxy process may be employed to form the sacrificial pedestal structures 11.

Referring to FIG. 8B, a layer stack including a memory material layer 54 can be conformally deposited. In an illustrative example, the layer stack may comprise an optional blocking dielectric layer 52, the memory material layer 54, an optional dielectric liner 56, and an optional sacrificial cover layer (not illustrated). The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprise a charge storage material, the optional dielectric liner 56 may comprise a tunneling dielectric layer. The sacrificial cover layer, if present, comprises a material that can protect the dielectric liner 56 or the memory material layer 54 during a subsequent anisotropic etch process. The sacrificial cover layer comprises a sacrificial cover material such as amorphous silicon, polysilicon, or a carbon-based material (such as amorphous carbon or diamond-like carbon).

According to an aspect of the present disclosure, portions of the layer stack (52, 54, 56) may be deposited in the lateral through-holes 13 that are connected to the third memory openings 49T, i.e., the subset of the memory openings 49 that are in direct contact with the dielectric material blocks 12 of the source-side dielectric isolation structure 120. The lateral through-holes 13 (if present) may optionally be at least partially filled with portions of the layer stack (52, 54, 56).

Figure 8D:
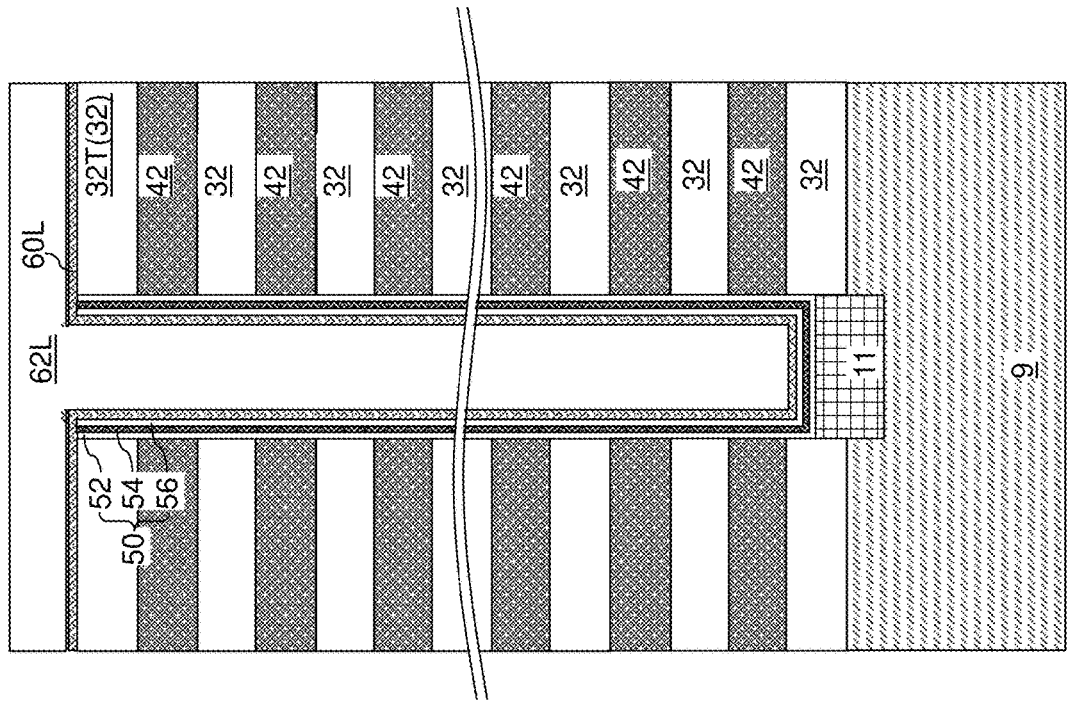
Figure 8C:
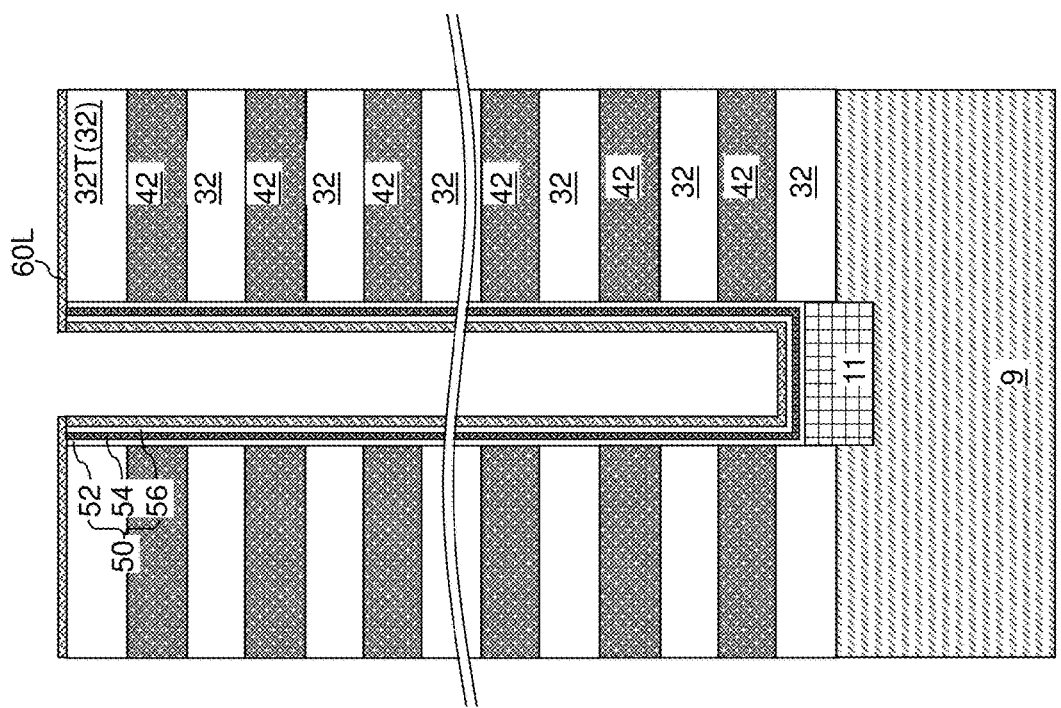

Referring to FIG. 8C, a semiconductor channel material layer 60L can be deposited over each memory film 50 by performing a conformal deposition process. If the semiconductor channel material layer 60L is doped, the semiconductor channel material layer 60L may have a doping of a first conductivity type, which may be p-type or n-type.

Referring to FIG. 8D, a dielectric core layer 62L comprising a dielectric fill material can be deposited in remaining volumes of the memory openings 49. The dielectric core layer 62L may comprise any insulating material, such as silicon oxide.

Figure 8F:
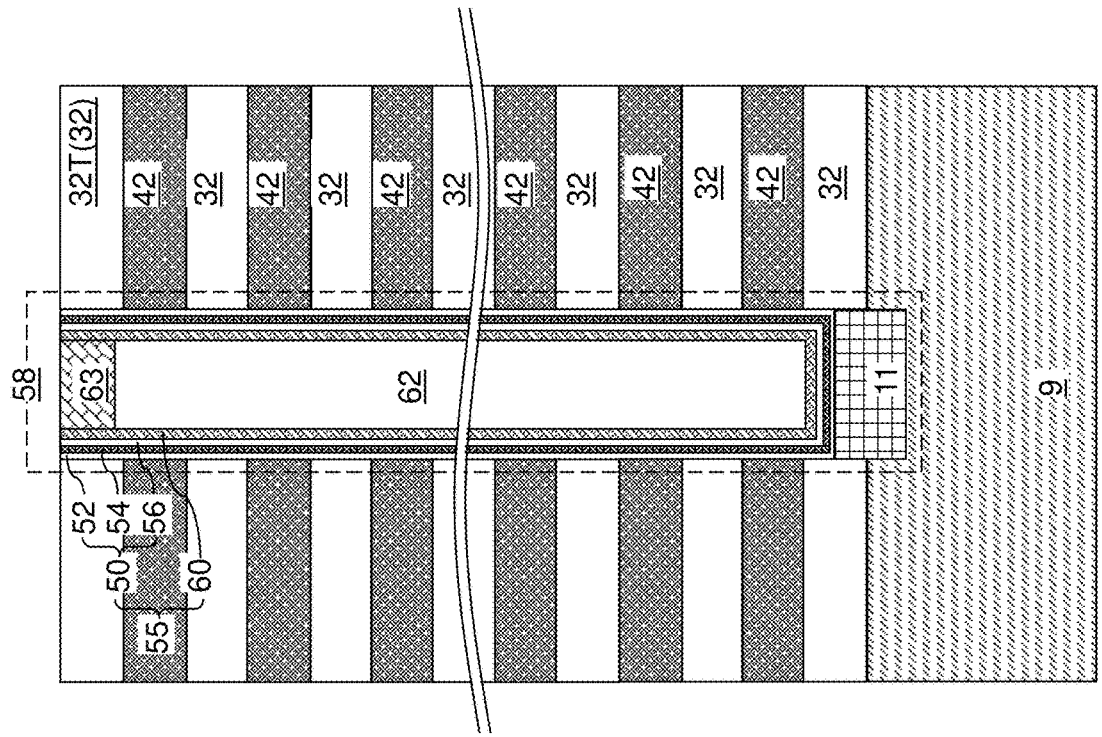
Figure 8E:
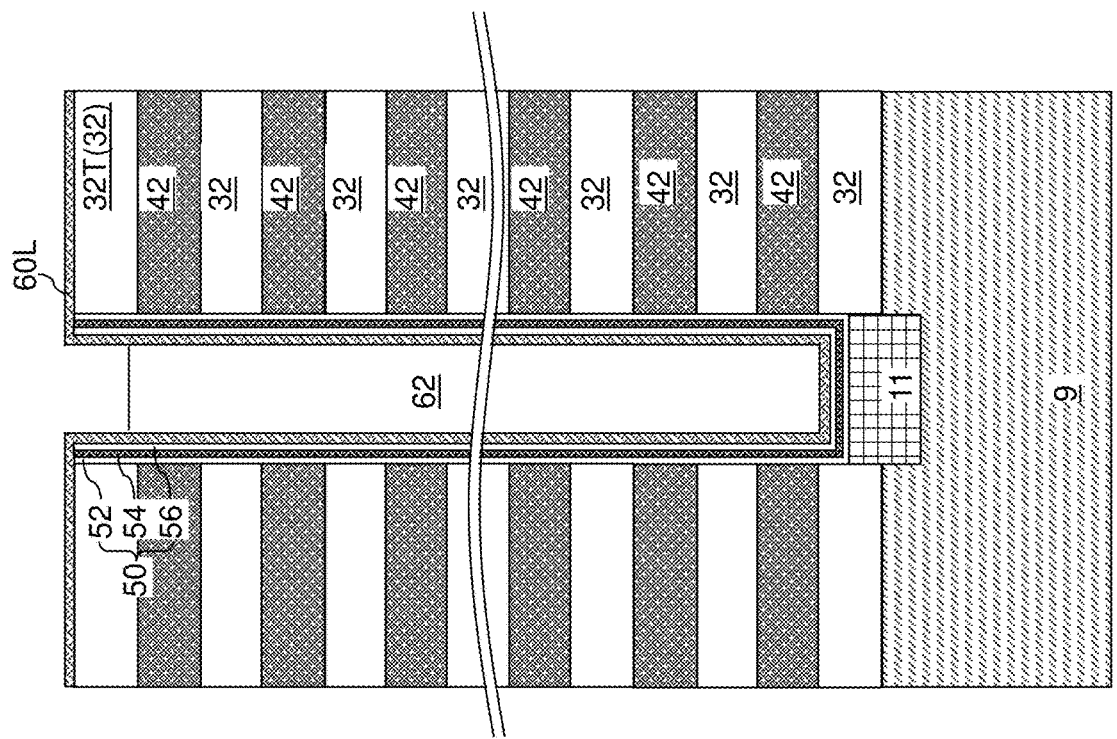
Figure 9A:
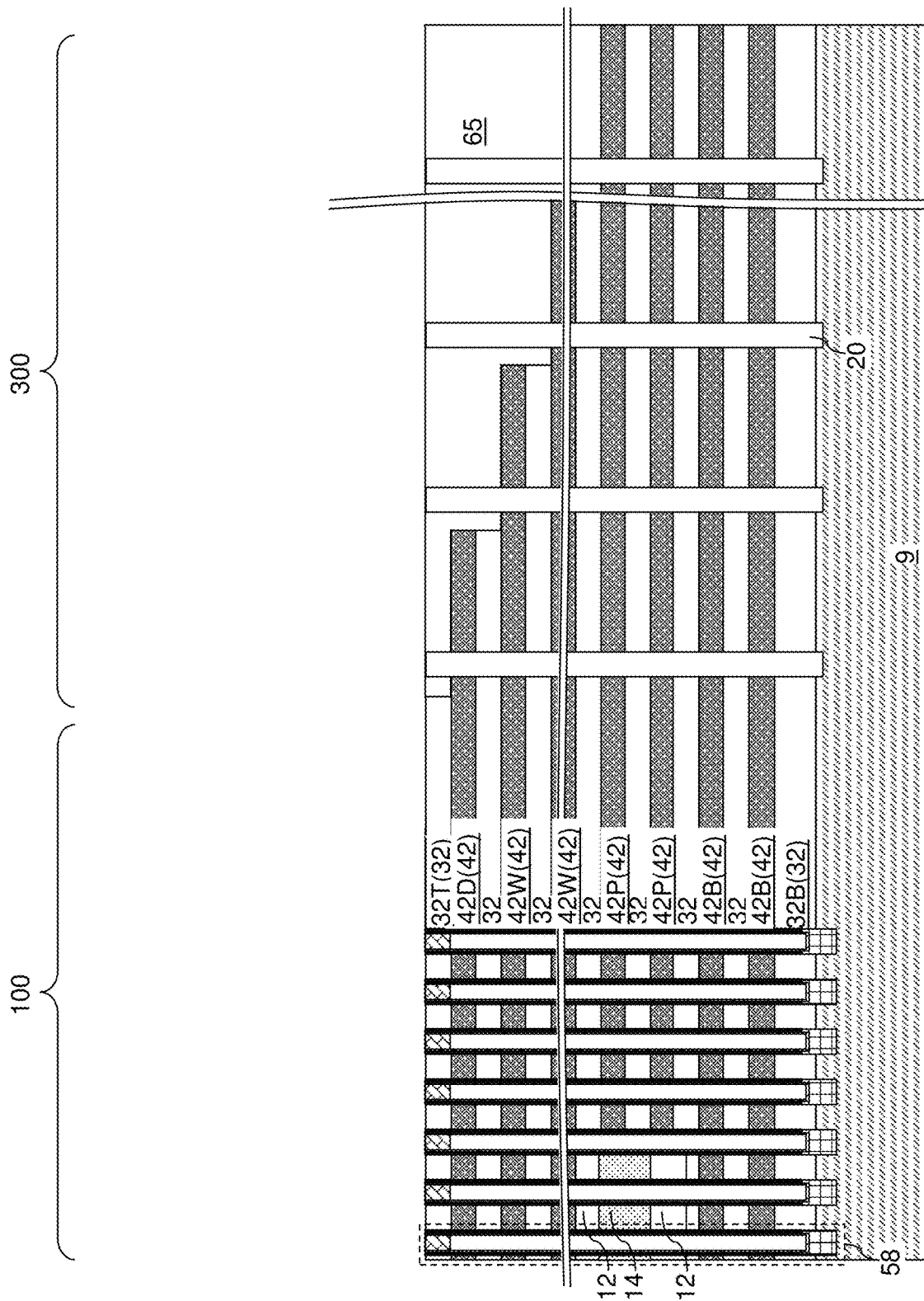
FIG. 9A is a schematic vertical cross-sectional view of the exemplary structure after formation of memory opening fill structures according to an embodiment of the present disclosure.
Figure 9C:
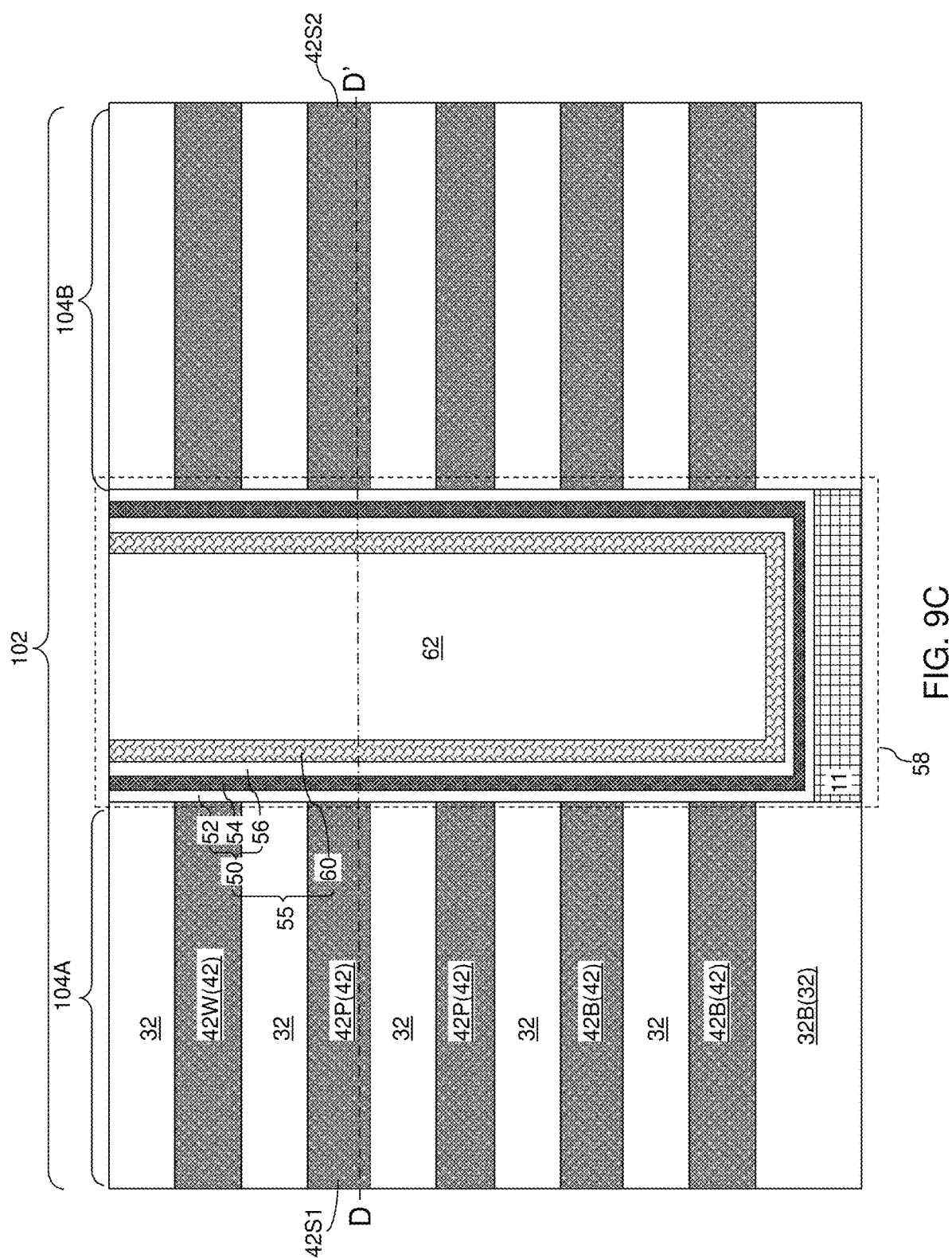
FIG. 9C is a vertical cross-sectional view of a region of the exemplary structure along the vertical plane C-C' of FIG. 9B.
Figure 9D:
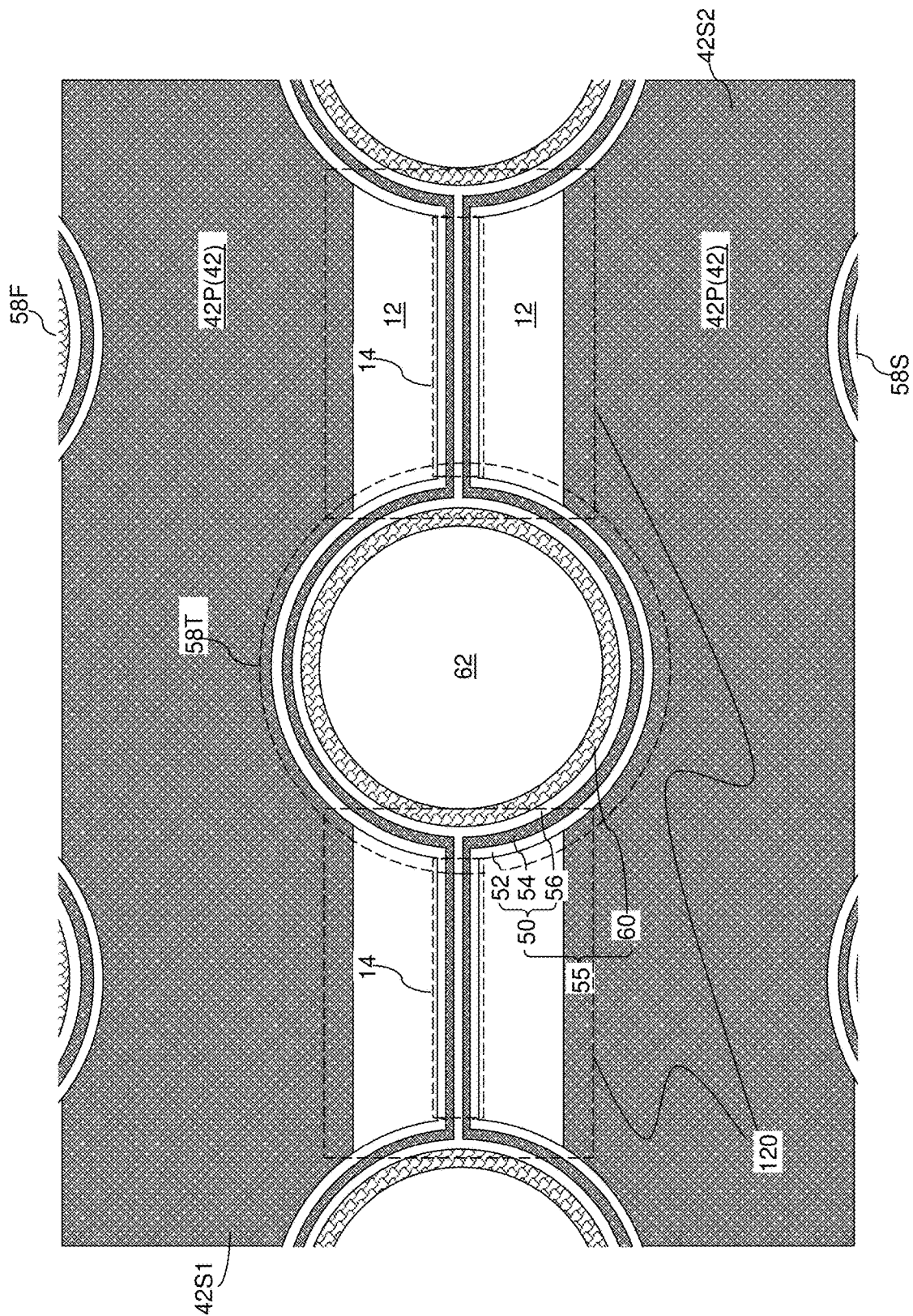
FIG. 9D is a horizontal cross-sectional view of a region of the exemplary structure along the horizontal plane D-D' of FIG. 9C.

Referring to FIG. 8E, the dielectric core layer 62L can be vertically recessed such that each remaining portion of the dielectric core layer has a top surface at, or about, the horizontal plane including the bottom surface of the topmost insulating layers 32. Each remaining portion of the dielectric core layer 62L constitutes a dielectric core 62.

Referring to FIG. 8F, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a sacrificial pedestal structure 11 (if present), a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42, or generally speaking, at levels of spacer material layers that may be formed as, or may be subsequently replaced at least partly with, electrically conductive layers.

Referring to FIGS. 9A-9D, the exemplary structure is illustrated after formation of memory opening fill structures 58 within the memory openings 49. The memory opening fill structures 58 are located in the memory openings 49. Each of the memory opening fill structures 58 comprises a respective memory film 50 and a respective vertical semiconductor channel 60.

According to an aspect of the present disclosure, each cluster of memory opening fill structures 58 comprise rows of first memory opening fill structures 58F, rows of second memory opening fill structures 58F, and a row of third memory opening fill structures 58T. The first memory opening fill structures 58F are located in the first memory subblock 104A, vertically extend through at least one first sacrificial material strip 42S1 of the at least one primary-source-select-level electrically conductive layer 42P, and are laterally spaced from each second sacrificial material strip 42S2 of the at least one primary-source-select-level electrically conductive layer 42P located on the second memory subblock 104B. The second memory opening fill structures 58S are located in the second memory subblock 104B, vertically extend through at least one second sacrificial material strip 42S2 of the at least one primary-source-select-level electrically conductive layer 42P, and are laterally spaced from each first sacrificial material strip 42S1 of the at least one primary-source-select-level electrically conductive layer 42P located in the first memory subblock 104A. The row of third memory opening fill structures 58T is arranged along the first horizontal direction hd1, and divides a source-side dielectric isolation structure 120 into multiple dielectric material blocks 12. In other words, the row of third memory opening fill structures 58T is located between two memory subblocks (104A, 104B) of the same memory block 102.

In one embodiment, the third memory opening fill structures 58T may comprise dummy memory opening fill structures in which the memory film 50 is not used to store data (e.g., not used to store electrons). In this case, the drain regions 63 and the vertical semiconductor channels 60 of the third memory opening fill structures 58T would not be electrically connected to any of the subsequently formed bit lines. In contrast, the drain regions 63 and the vertical semiconductor channels 60 of the first and second memory opening fill structures (58F, 58S) would be electrically connected to a respective one of the subsequently formed bit lines.

In one embodiment, each source-side dielectric isolation structure 120 comprises multiple dielectric material blocks 12 that are laterally spaced apart from each other along the first horizontal direction hd1, and are interlaced with a row of memory opening fill structures 58 along the first horizontal direction hd1. Each of the multiple dielectric material blocks 12 within each source-select-level isolation structure 120 may surround a respective optional lateral through-hole 13 that laterally extends along the first horizontal direction hd1. In one embodiment, each lateral through-hole 13 may be filled with a respective dielectric hole fill structure 14 including at least one dielectric material having a same material composition as a component layer within the memory films 50 during formation of the memory films 50.

In the illustrated example, each dielectric hole fill structure 14 includes an optional first dielectric material portion having a same material composition as an optional blocking dielectric layer 52, a second dielectric material portion having a same material composition as a memory material layer 54, and an optional third dielectric material portion having a same material composition as an optional dielectric liner 56 (such as a tunneling dielectric layer). In one embodiment, each of the memory films 50 comprises a respective blocking dielectric layer 52 and a respective vertical stack of memory elements that is laterally surrounded by the respective blocking dielectric layer 52, and each dielectric hole fill structure 14 of each dielectric material blocks 12 comprises a dielectric fill material layer that is an extension of one of the blocking dielectric layers 52 into a respective one of the lateral through-holes 13.

Figure 10A:
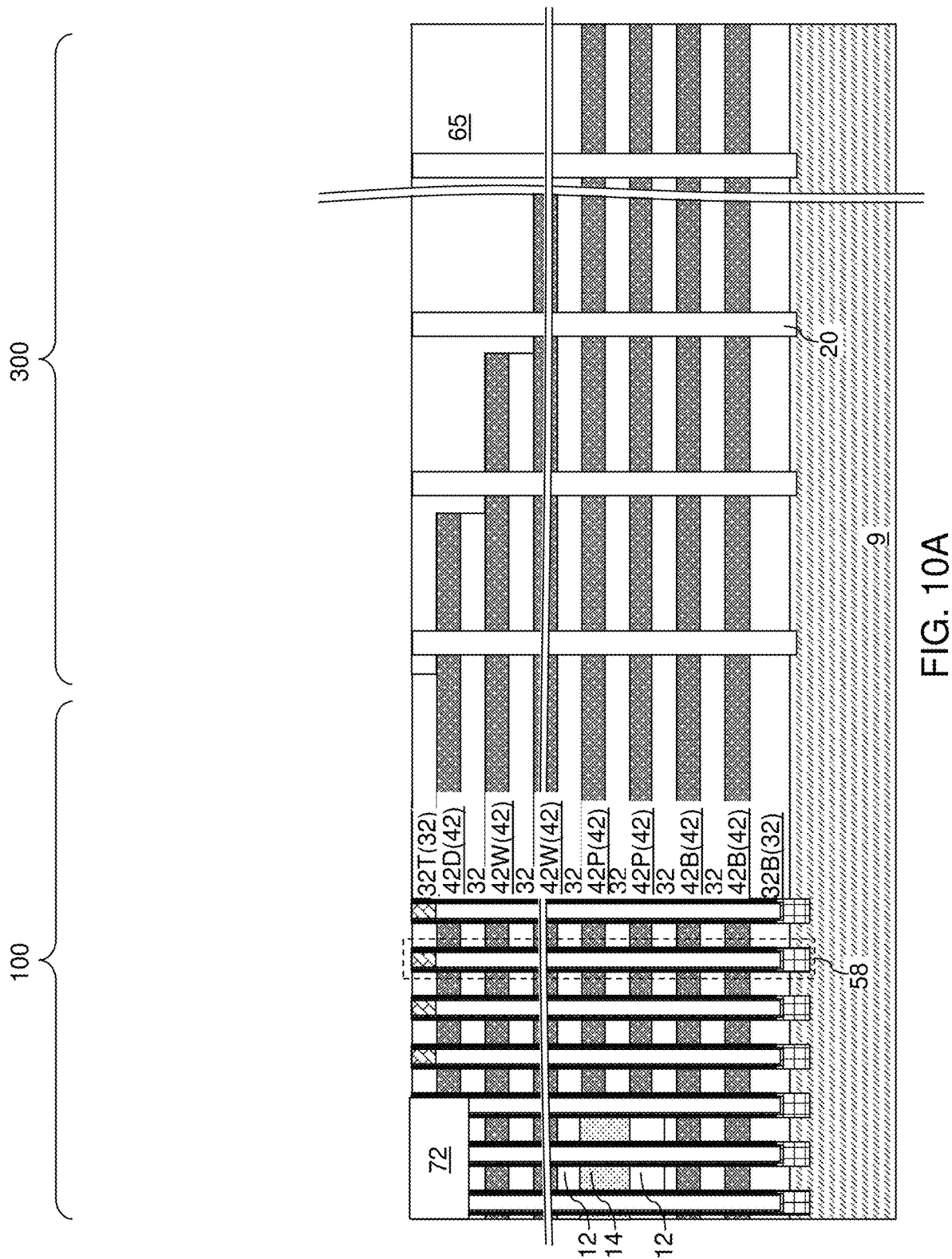
FIG. 10A is a schematic vertical cross-sectional view of the exemplary structure after formation of drain-side dielectric isolation structures according to an embodiment of the present disclosure.
Figure 10C:
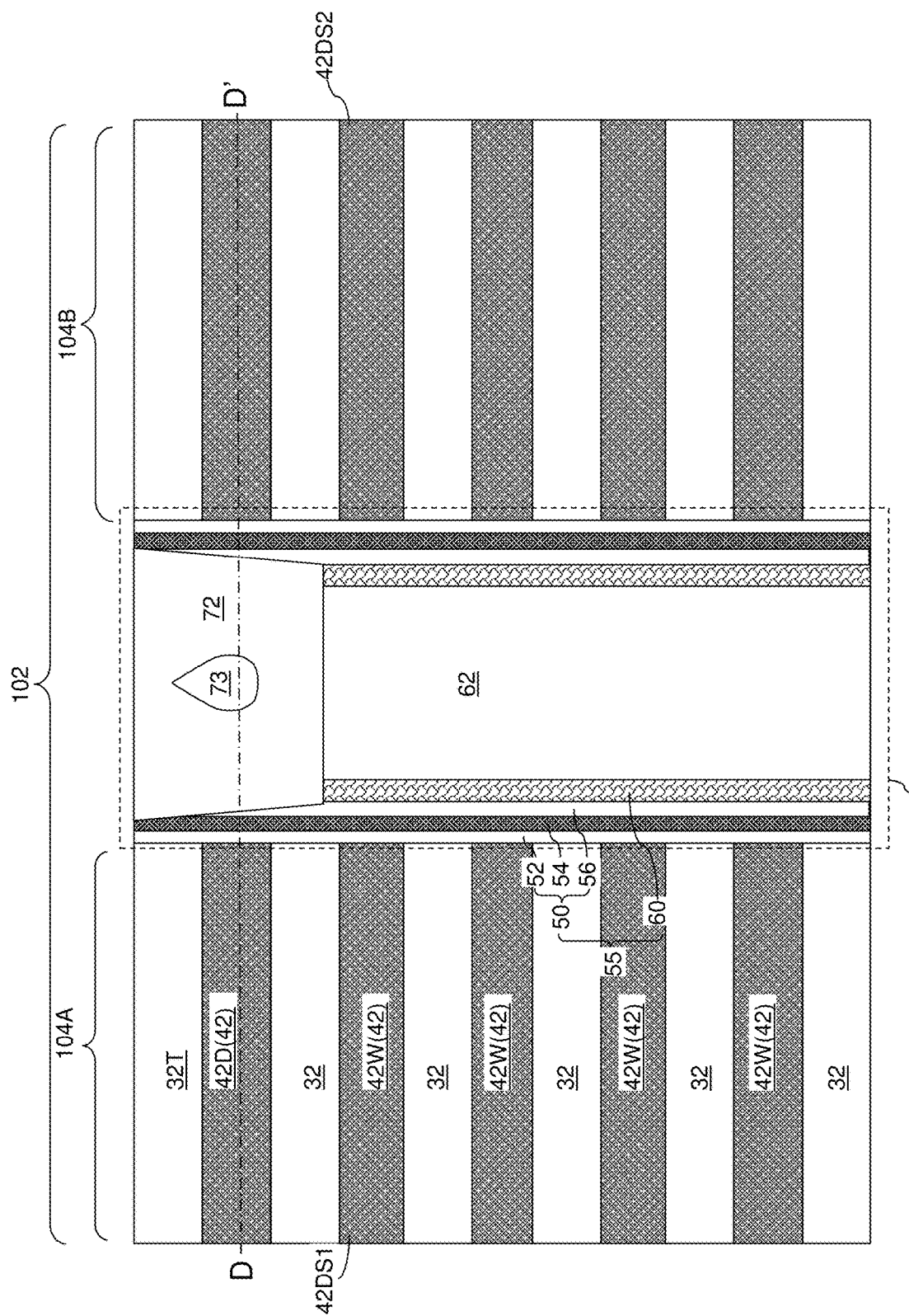
FIG. 10C is a vertical cross-sectional view of a region of the exemplary structure along the vertical plane C-C' of FIG. 10B.
Figure 10D:
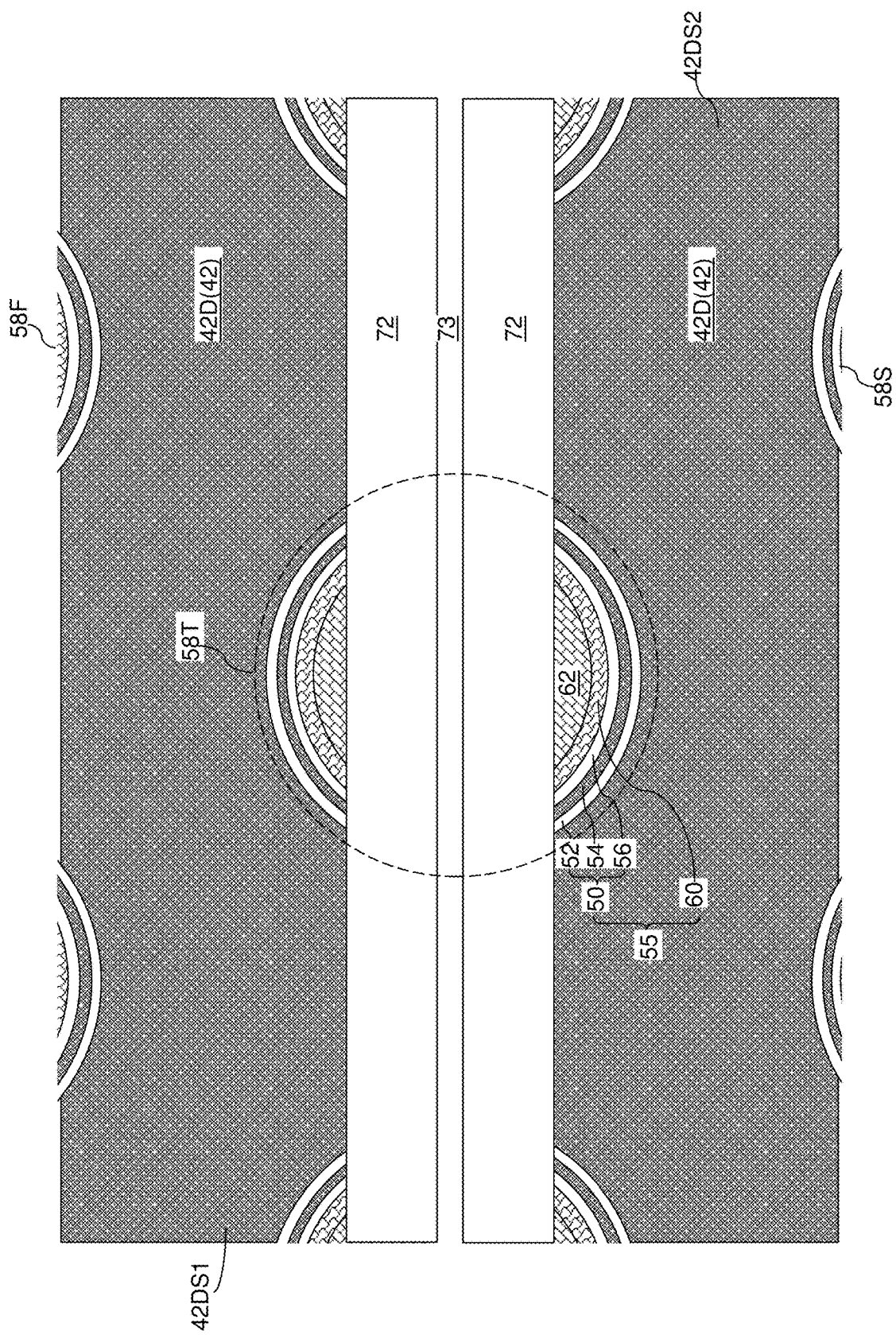
FIG. 10D is a horizontal cross-sectional view of a region of the exemplary structure along the horizontal plane D-D' of FIG. 10C.

Referring to FIGS. 10A-10C, a photoresist layer (not shown) can be applied over the topmost insulating layer 32T, and can be lithographically patterned to form slit-shaped openings that laterally extend along a first horizontal direction hd1. The pattern of the openings through the photoresist layer may be the same as the pattern of the source-select-level isolation structures 120. An anisotropic etch process can be performed to transfer the pattern of the slit-shaped openings in the photoresist layer through each of the at least one drain-select-level sacrificial material layer 42D. The trenches that are formed through the at least one drain-select-level sacrificial material layer 42D are herein referred to as drain-select-level isolation trenches. The drain-select-level isolation trenches vertically extend through each of the at least one drain-select-level sacrificial material layer 42D, but does not vertically extend into any of the word-line-level sacrificial material layer 42W.

A dielectric fill material, such as silicon oxide, can be deposited in the drain-select-level isolation trenches, for example, by a chemical vapor deposition process. Excess portions of the dielectric fill material deposited above the horizontal plane including the top surface of the topmost insulating layer 32T can be removed by a planarization process, which may comprise a recess etch process or a chemical mechanical polishing process. Each remaining portion of the dielectric fill material that remains in a respective one of the drain-select-level isolation trenches constitutes a dielectric isolation structure, which is herein referred to as a drain-side dielectric isolation structure 72.

In one embodiment, the top surface of each drain-side dielectric isolation structure 72 may be located within the horizontal plane HP1 including the top surface of the topmost insulating layer 32T. In one embodiment, the drain-side dielectric isolation structures 72 divide each of the at least one drain-select-level sacrificial material layer 42D into multiple portions that are laterally spaced from each other along the second horizontal direction hd2. For example, each drain-side dielectric isolation structure 72 divides each drain-select-level sacrificial material layer 42D into a respective pair of sacrificial material strips (42DS1, 42DS2), which are herein referred to as a third sacrificial material strip and a fourth sacrificial material strip, which are located in the respective first and second memory subblocks (104A, 104B) of the same memory block 102.

The drain-select-level isolation trenches may have a relative high aspect ratio. In other words, the ratio of the depth of the drain-select-level isolation trenches to the width of each drain-select-level isolation trench can be a relatively large number, such as a number in a range from 3 to 10. Due to the high aspect ratio, the dielectric fill material that is deposited in a drain-select-level isolation trench may optionally have a laterally-extending void that extends along the first horizontal direction hd1. The laterally-extending void is herein referred to as a drain-select-level through-hole 73. Alternatively, the drain-select-level through-hole 73 may be omitted.

In one embodiment, each drain-side dielectric isolation structure 72 may cut into a respective row of third memory opening fill structures 58T, and can contact a respective row of dielectric cores 62 within the respective row of third memory opening fill structures 58T. In this embodiment, the third memory opening fill structures comprise dummy memory opening fill structures.

Figure 11A:
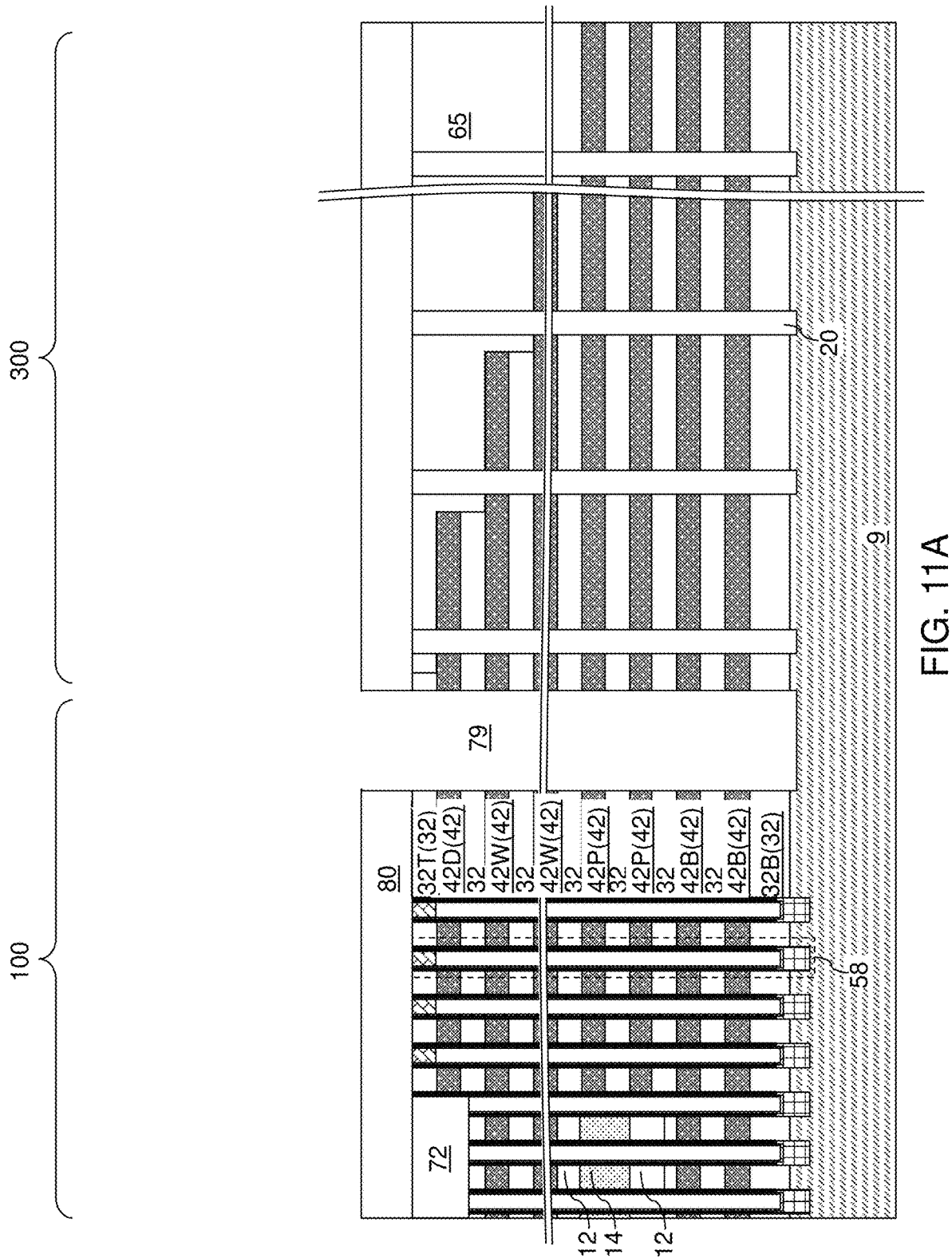
FIG. 11A is a vertical cross-sectional view of the exemplary structure after formation of lateral isolation trenches according to an embodiment of the present disclosure.
Figure 11B:
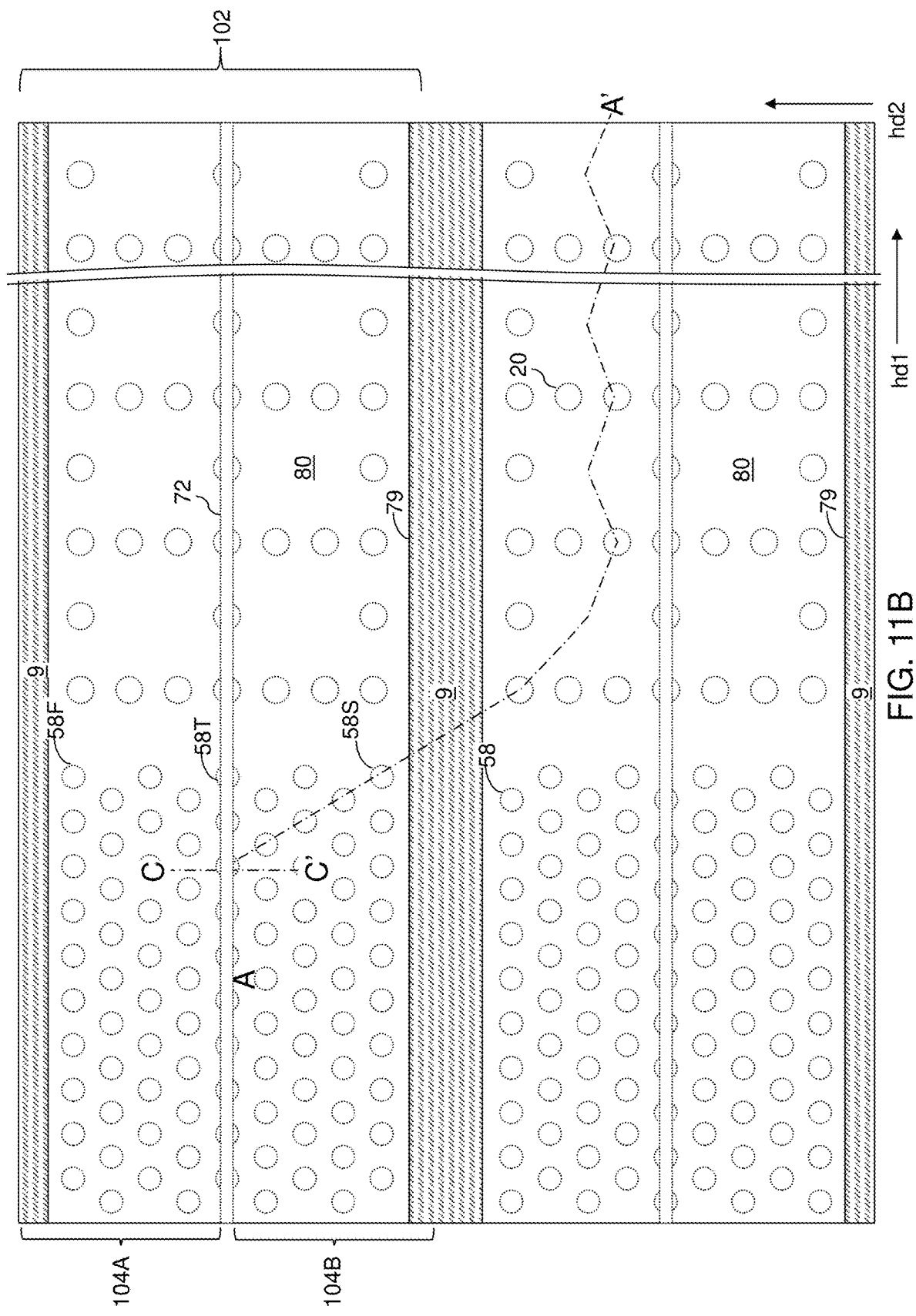
FIG. 11B is a top-down view of the exemplary structure of FIG. 11A. The vertical plane A-A' is the cut plane of the vertical cross-sectional view of FIG. 11A.

Referring to FIGS. 11A and 11B, a dielectric material, such as undoped silicate glass or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), and the stepped dielectric material portion 65, and at least to a top surface of the carrier substrate 9. Lateral isolation trenches 79 laterally extending along the first horizontal direction hd1 can be formed through the alternating stack (32, 42), the stepped dielectric material portion 65, and the contact-level dielectric layer 80. Each of the lateral isolation trenches 79 may comprise a respective pair of lengthwise sidewalls that are parallel to the first horizontal direction hd1 and vertically extend from the carrier substrate 9 to the top surface of the contact-level dielectric layer 80. A surface of the carrier substrate 9 can be physically exposed underneath each lateral isolation trench 79. The photoresist layer can be subsequently removed, for example, by ashing.

Generally, a pair of lateral isolation trenches 79 extend through each layer within the alternating stack (32, 42) (i.e., the combination of the second alternating stack {32, (42W, 42D)} and the first alternating stack {32, (42B, 42P)} around each cluster of memory opening fill structures 58. Each of the pair of lateral isolation trenches 79 laterally extends along the first horizontal direction hd1. A source-side dielectric isolation structure 120 and a drain-side dielectric isolation structure 72 are located between the pair of lateral isolation trenches 79. The pair of lateral isolation trenches 79 comprise lateral boundaries along the first horizontal direction hd1 of a respective memory block 102.

Figure 12:
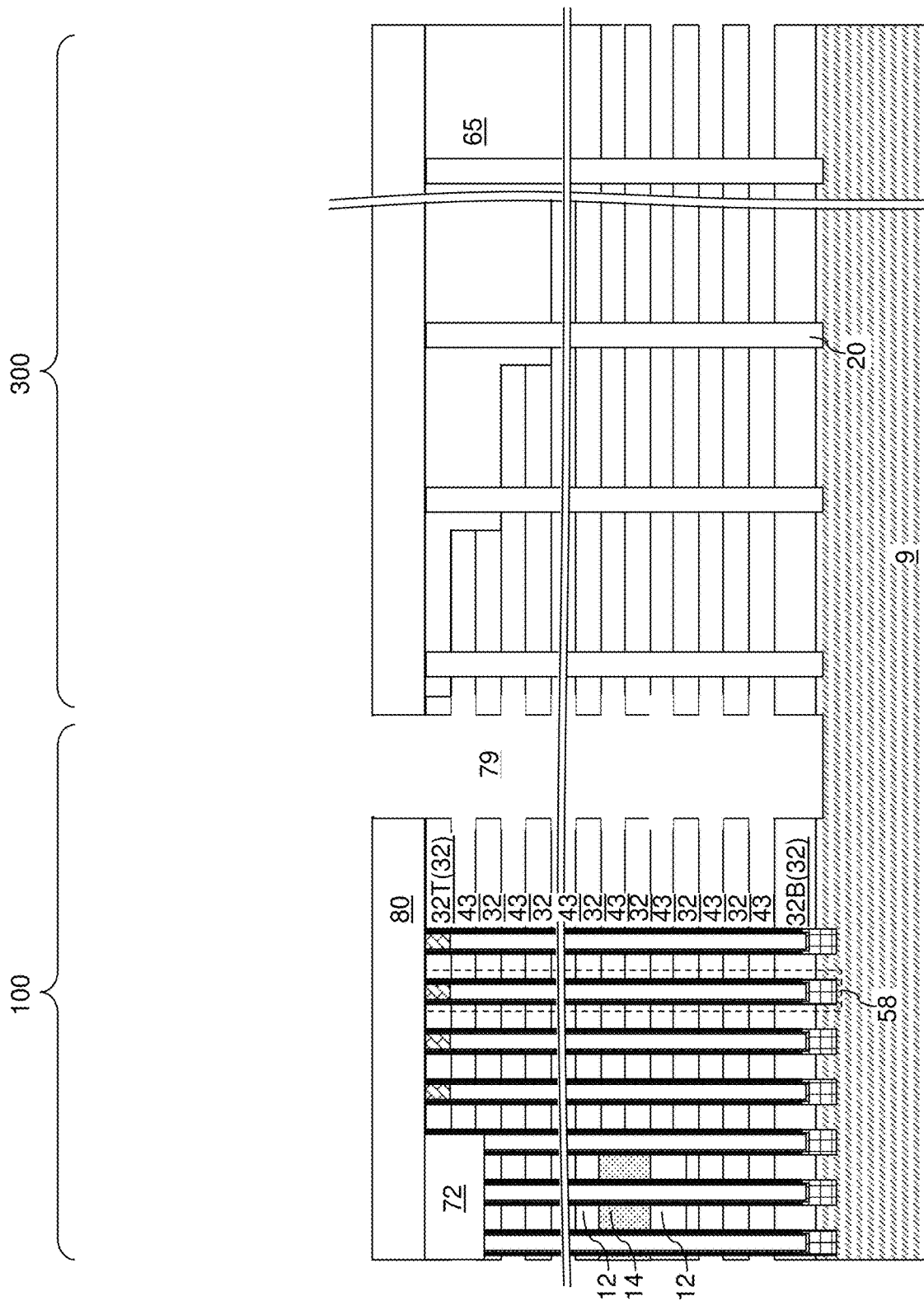
FIG. 12 is a vertical cross-sectional view of the exemplary structure after formation of laterally-extending cavities according to an embodiment of the present disclosure.
Figure 13A:
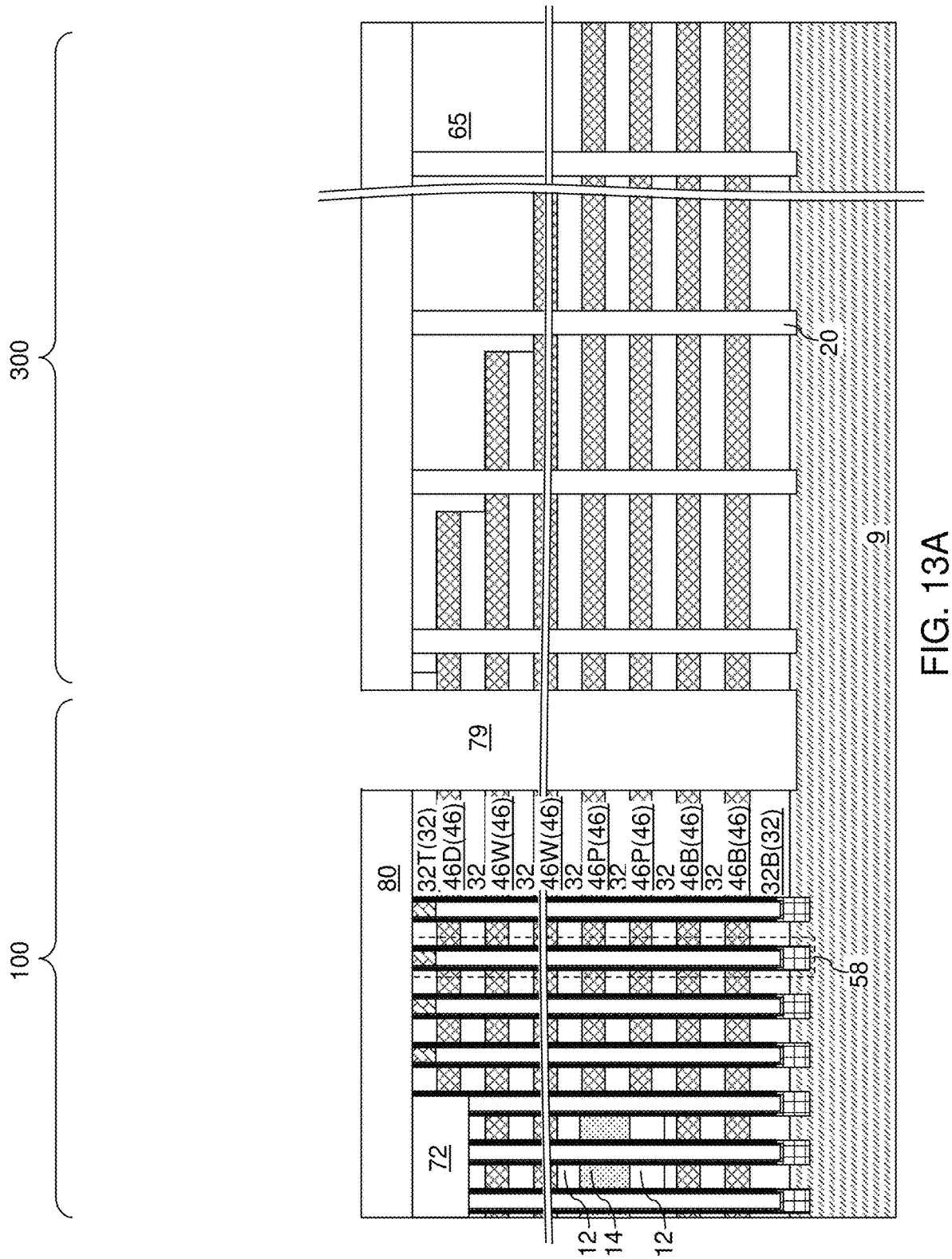
FIG. 13A is a schematic vertical cross-sectional view of the exemplary structure after formation of electrically conductive layers according to an embodiment of the present disclosure.
Figure 13C:
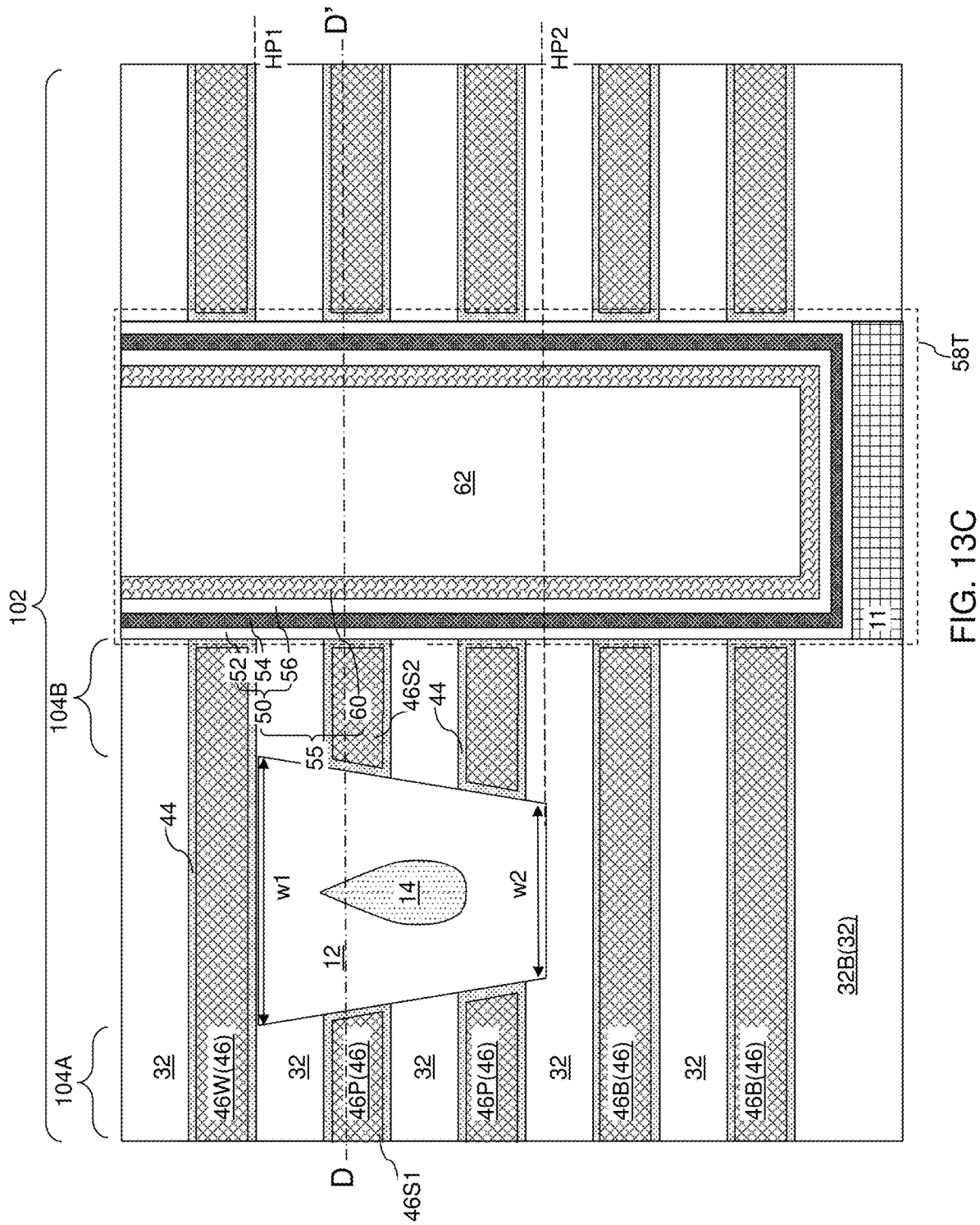
FIG. 13C is a vertical cross-sectional view of a region of the exemplary structure along the vertical plane C-C' of FIG. 13B.
Figure 13D:
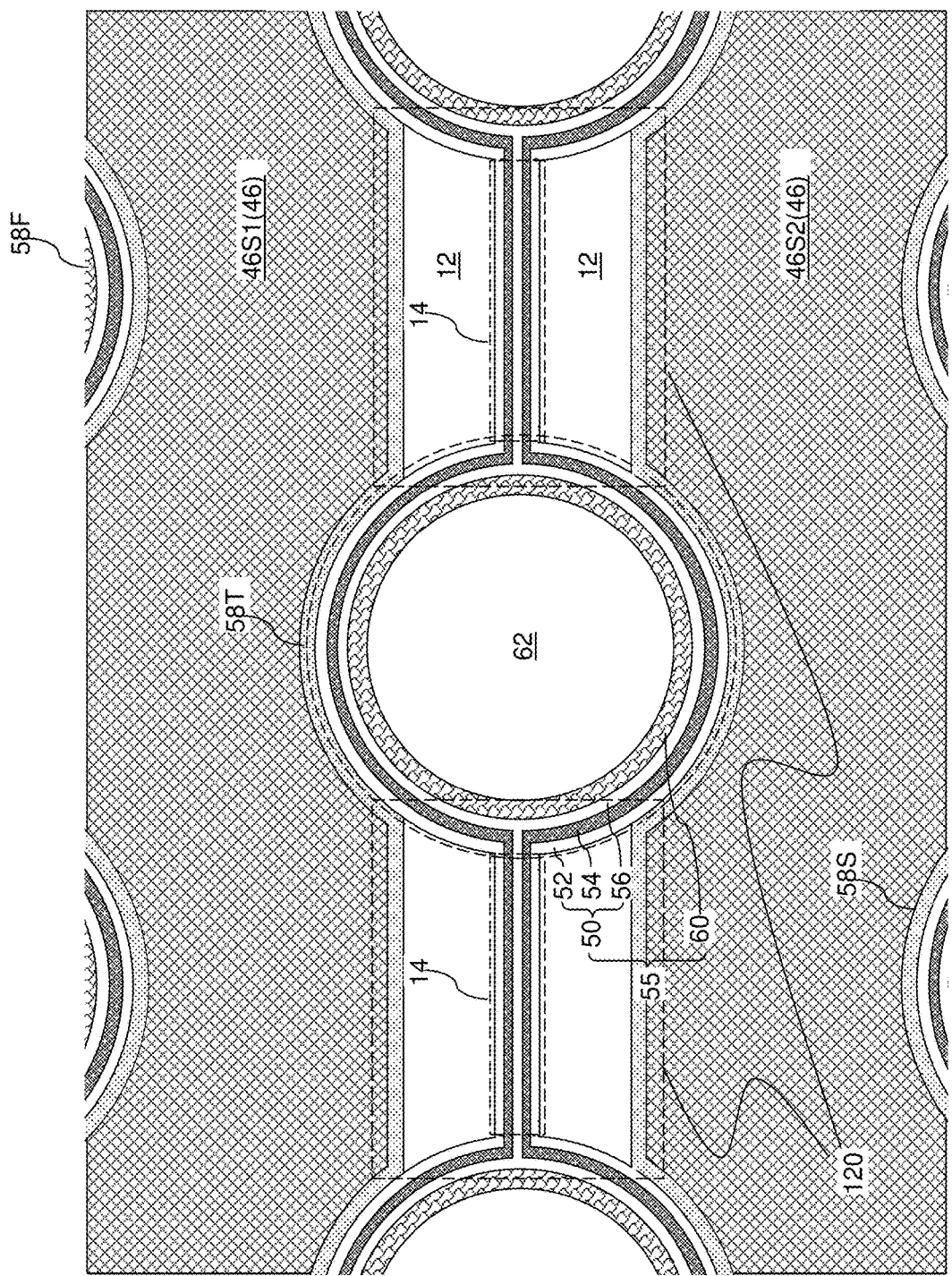
FIG. 13D is a horizontal cross-sectional view of a region of the exemplary structure along the horizontal plane D-D' of FIG. 13C.

Referring to FIG. 12, an etchant that selectively etches the material of the sacrificial material layers 42 with respect to the material of the insulating layers 32 can be introduced into the access trenches 79, for example, employing an isotropic etch process. Lateral recesses 43 are formed in volumes from which the sacrificial material layers 42 are removed. The removal of the sacrificial material layers 42 can be selective to the materials of the insulating layers 32, the stepped dielectric material portion 65, the semiconductor material of the substrate 9, and the material of the outermost layer of the memory films 50. In one embodiment, the sacrificial material layers 42 can include silicon nitride, and the materials of the insulating layers 32 and the stepped dielectric material portion 65 can be selected silicon oxide.

The etch process that removes the second material selective to the first material and the outermost layer of the memory films 50 can be a wet etch process employing a wet etch solution, or can be a gas phase (dry) etch process in which the etchant is introduced in a vapor phase into the access trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the stepped dielectric material portion 65, and the memory opening fill structures 58 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. The memory openings 49 in which the memory stack structures 55 are formed are herein referred to as front side openings or front side cavities in contrast with the lateral recesses 43. Each of the plurality of lateral recesses 43 can extend substantially parallel to the top surface of the substrate 9 A lateral recess 43 can be vertically bounded by a top surface of an underlying insulating layer 32 and a bottom surface of an overlying insulating layer 32. In one embodiment, each lateral recess 43 can have a uniform height throughout.

Referring to FIGS. 13A-13D, an outer blocking dielectric layer 44 can be optionally formed. The outer blocking dielectric layer 44, if present, comprises a dielectric material that functions as a control gate dielectric for the control gates to be subsequently formed in the lateral recesses 43. In case the blocking dielectric layer 52 is present within each memory opening, the outer blocking dielectric layer 44 is optional. In case the blocking dielectric layer 52 is omitted, the outer blocking dielectric layer 44 is present.

At least one conductive material can be deposited in the lateral recesses 43 by providing at least one reactant gas into the lateral recesses 43 through the access trenches 79. A metallic barrier layer can be deposited in the lateral recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of lateral recesses 43, on the sidewalls of the at least one the access trench 79, and over the top surface of the contact-level dielectric layer 80 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer that blocks diffusion of fluorine atoms therethrough.

A plurality of electrically conductive layers 46 can be formed in the plurality of lateral recesses 43, and a continuous metallic material layer can be formed on the sidewalls of each access trench 79 and over the contact-level dielectric layer 80. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the access trenches 79 or above the contact-level dielectric layer 80.

The deposited metallic material of the continuous electrically conductive material layer is etched back from the sidewalls of each access trench 79 and from above the contact-level dielectric layer 80 by performing an isotropic etch process that etches the at least one conductive material of the continuous electrically conductive material layer. Each remaining portion of the deposited metallic material in the lateral recesses 43 constitutes an electrically conductive layer 46. Each electrically conductive layer 46 can be a conductive line structure. Thus, the sacrificial material layers 42 are replaced with the electrically conductive layers 46. Generally, the electrically conductive layers 46 can be formed by providing a metallic precursor gas into the lateral isolation trenches 79 and into the lateral recesses 43.

Generally, remaining portions of the sacrificial material layers 42 can be replaced with electrically conductive layers 46. Layer stacks (32, 46, 80) are formed, which laterally extend along the first horizontal direction hd1 and are laterally spaced apart among one another by the access trenches 79 along the second horizontal direction hd2. Each of the layer stacks (32, 42, 80) comprises a respective alternating stack (32, 46) of respective insulating layers 32 and respective electrically conductive layers 46, and further comprises a respective contact-level dielectric layer 80 that overlies the respective alternating stack (32, 46). In one embodiment, each of the alternating stacks (32, 46) comprises a respective pair of lengthwise sidewalls in which a plurality of vertically-straight and laterally-concave surface segments are adjoined among one another along the first horizontal direction hd1.

The electrically conductive layers 46 comprise bottom-source-select-level electrically conductive layers (i.e., bottom source side select gate electrodes 46B that replace the bottom-source-select-level sacrificial material layers 42B, primary-source-select-level electrically conductive layers (i.e., primary source side select gate electrodes) 46P that replace the primary-source-select-level sacrificial material layers 42P, word lines 46W (also referred to as word-line-level electrically conductive layers 46W) that replace the word-line-level sacrificial material layers 42W, and drain-select-level electrically conductive layers (i.e., drain side select gate electrodes) 46D that replace the drain-select-level sacrificial material layers 42D. The primary-source-select-level electrically conductive layers (i.e., primary source side select gate electrodes) 46P are located between the word lines 46W and the bottom-source-select-level electrically conductive layers (i.e., bottom source side select gate electrodes 46B) along the vertical direction perpendicular to the top surface of the substrate 9.

Each alternating stack of insulating layers 32 and electrically conductive layers 46 formed between a neighboring pair of lateral isolation trenches 79 comprises at least one primary-source-select-level electrically conductive layer 46P, which may comprise a single primary-source-select-level electrically conductive layer 46P, or a plurality of primary-source-select-level electrically conductive layers 46P formed at a plurality of source select levels and vertically spaced from each other. In one embodiment, each primary-source-select-level the electrically conductive layer 46P comprises a first electrically conductive strip that replaces a first sacrificial material strip 46S1 located in the first memory subblock 104A and a second electrically conductive strip 46S2 located in the second memory subblock 104B. Each primary-source-select-level electrically conductive layer 46P comprises a combination of a respective first electrically conductive strip 46S1 and a respective second electrically conductive strip 46S2 that are laterally spaced apart from each other along the second horizontal direction hd2 by a source-side dielectric isolation structure 120.

Figure 14A:
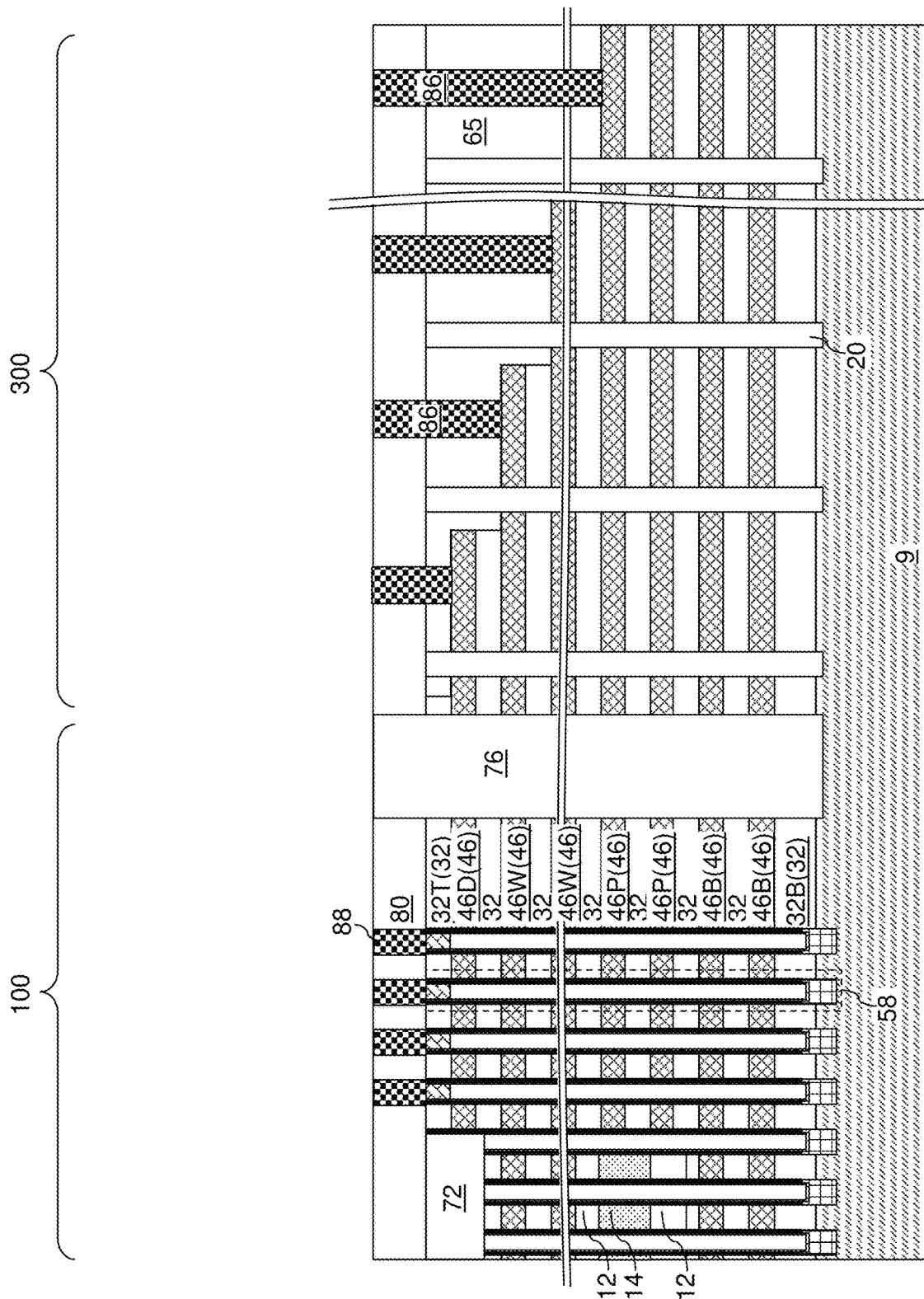
FIG. 14A is a vertical cross-sectional view of the exemplary structure after formation of lateral isolation trench fill structures, layer contact via structures, and drain contact via structures according to an embodiment of the present disclosure.
Figure 14B:
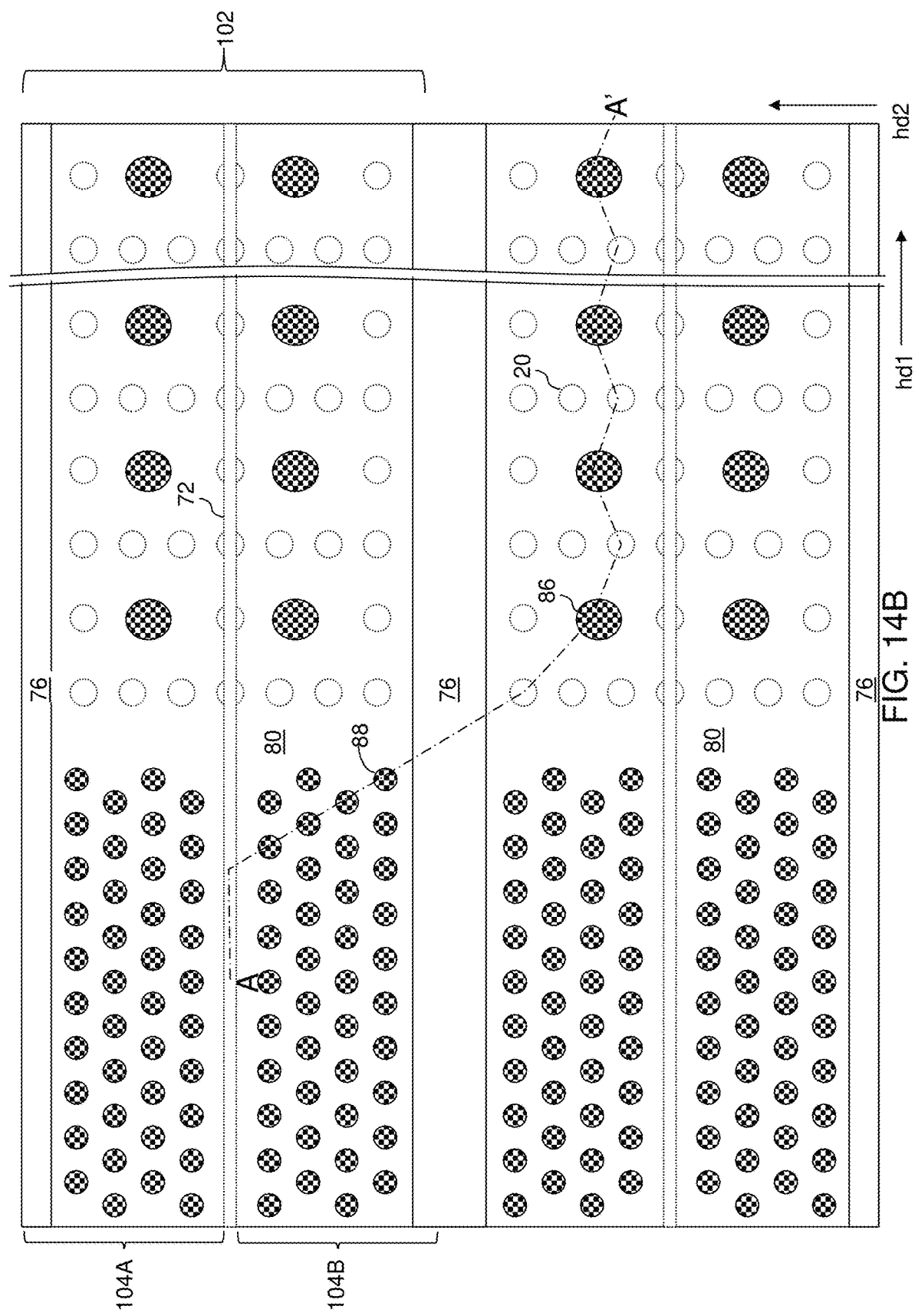
FIG. 14B is a top-down view of the exemplary structure of FIG. 14A. The vertical plane A-A' is the cut plane of the vertical cross-sectional view of FIG. 14A.

Referring to FIGS. 14A and 14B, a dielectric fill material, such as silicon oxide, can be deposited in the lateral isolation trenches 79. Excess portions of the dielectric fill material can be removed from above the contact-level dielectric layer 80. Each remaining portion of the dielectric fill material that fills a respective one of the lateral isolation trenches 79 constitutes a lateral isolation trench fill structure 76, which may be a dielectric wall structure. In an alternative embodiment, an insulating spacer having a tubular configuration can be formed in peripheral portions of each of the lateral isolation trenches 79, and a through-stack conductive via structure may be formed within a respective one of the insulating spacers. In this case, each lateral isolation trench fill structure 76 may comprise a combination of a through-stack conductive via structure and an insulating spacer that laterally surrounds the through-stack conductive via structure. A pair of adjacent lateral isolation trench fill structures 76 sidewalls of respective memory block 102. Each lateral isolation trench fill structures 76 laterally separates adjacent memory blocks 102.

Contact via structures (88, 86) can be formed through the contact-level dielectric layer 80, and optionally through the stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the stepped dielectric material portion 65.

According to an aspect of the present disclosure, an alternating stack (32, 42) of insulating layers 32 and electrically conductive layers 46 arranged along a vertical direction can be formed between a neighboring pair of lateral isolation trench fill structures 76 that laterally extend along the first horizontal direction hd1. The electrically conductive layers 46 comprise, from bottom to top, at least one bottom-source-select-level electrically conductive layer 46B, at least one primary-source-select-level electrically conductive layer 46P, word lines 46W, and at least one drain-select-level electrically conductive layer 46D. Each bottom-source-select-level electrically conductive layer 46P may comprise a respective first single continuous structure that extends through the entire memory block 102 along the second horizontal direction hd2 and contacts each of the neighboring pair of lateral isolation trench fill structures 76. Each of the at least one primary-source-select-level electrically conductive layer 46P may comprise a respective pair of a first electrically conductive strip 46S1 (located only in the first memory subblock 104A) and a second electrically conductive strip 46S2 (located only in the second memory subblock 104B) that are laterally spaced apart from each other, and contacting one but not the other of the pair of neighboring pair of lateral isolation trench fill structures 76. The word lines 42W may comprise respective second single continuous structures laterally extending through the entire memory block 102 along the second horizontal direction hd2 and contacts contacting each of the neighboring pair of lateral isolation trench fill structures 76.

In one embodiment, the first electrically conductive strip 46S1 and the second electrically conductive strip 46S2 within each of the at least one primary-source-select-level electrically conductive layer 46P are laterally spaced from the source-side dielectric isolation structure 120 by a respective outer blocking dielectric layer 44. In one embodiment, the at least one bottom-source-select-level electrically conductive layer 46B and the word lines 46W are spaced from each of the memory opening fill structures 58 by additional outer blocking dielectric layers 44 having a same material composition and a same thickness as the respective outer blocking dielectric layer 44.

In one embodiment, a top surface of the source-side dielectric isolation structure 120 has a first width w1 along a second horizontal direction hd2 that is perpendicular to the first horizontal direction hd1, and a bottom surface of the source-side dielectric isolation structure 120 has a second width w2 along the second horizontal direction hd2 that is less than the first width w1. In one embodiment, the top surface of the source-side dielectric isolation structure 120 is located within a first horizontal plane HP1 including a top surface of one of the insulating layers 32 that is interposed between the word lines 46W and the at least one primary-source-select-level electrically conductive layer 46P, and the bottom surface of the source-side dielectric isolation structure 120 is located within a second horizontal plane HP2 that is located below a top surface of another of the insulating layers 32 that is interposed between the at least one primary-source-select-level electrically conductive layer 46P and the at least one bottom-source-select-level electrically conductive layer 46B.

In one embodiment, the electrically conductive layers 46 further comprise at least one drain-select-level electrically conductive layer 46D located above the word lines 46W. Each of the at least one drain-select-level electrically conductive layer 46D comprises respective pair of a third electrically conductive strip 46D1 (located in the first memory subblock 104A) and a fourth electrically conductive strip 46D2 (located in the second memory subblock 104B) that are laterally spaced apart from each other along the second horizontal direction hd2 by a drain-side dielectric isolation structure 72. The drain-side dielectric isolation structure 72 can be located between the respective pair of the third electrically conductive strip 46D1 and the fourth electrically conductive strip 46D2 for each of the at least one drain-select-level electrically conductive layer 46D.

Figure 15:
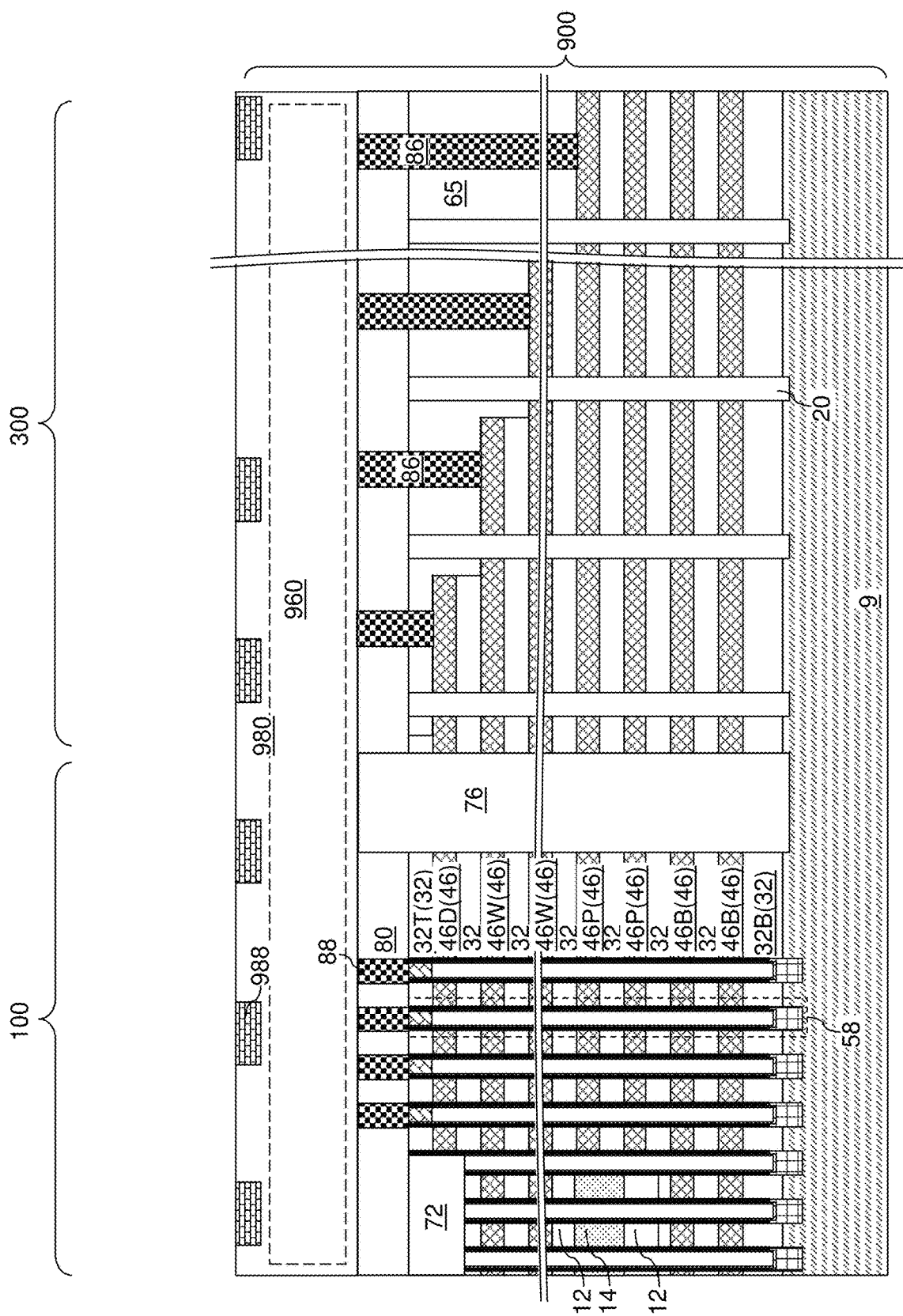
FIG. 15 is a vertical cross-sectional view of the exemplary structure after formation of a memory die according to an embodiment of the present disclosure.

Referring to FIG. 15, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side metal interconnect structures 980. The memory-side dielectric material layers 960 comprise a bit-line-level dielectric material layer embedding bit lines, which are a subset of the memory-side metal interconnect structures 980.

Metal bonding pads, which are herein referred to as upper bonding pads 988, may be formed at the topmost level of the memory-side dielectric material layers 960. The upper bonding pads 988 may be electrically connected to the memory-side metal interconnect structures 980 and various nodes of the three-dimensional memory array including the alternating stacks of insulating layers 32 and electrically conductive layers 46 and the memory opening fill structures 58.

A memory die 900 is thus formed, which comprises the memory-side dielectric material layers 960 formed over the alternating stacks (32, 46), the memory-side metal interconnect structures 980 embedded in the memory-side dielectric material layers 960, and the memory-side bonding pads 988 be embedded within the topmost layer of the memory-side dielectric material layers 960. The memory-side bonding pads 988 can be electrically connected to the memory-side metal interconnect structures 980.

Figure 16:
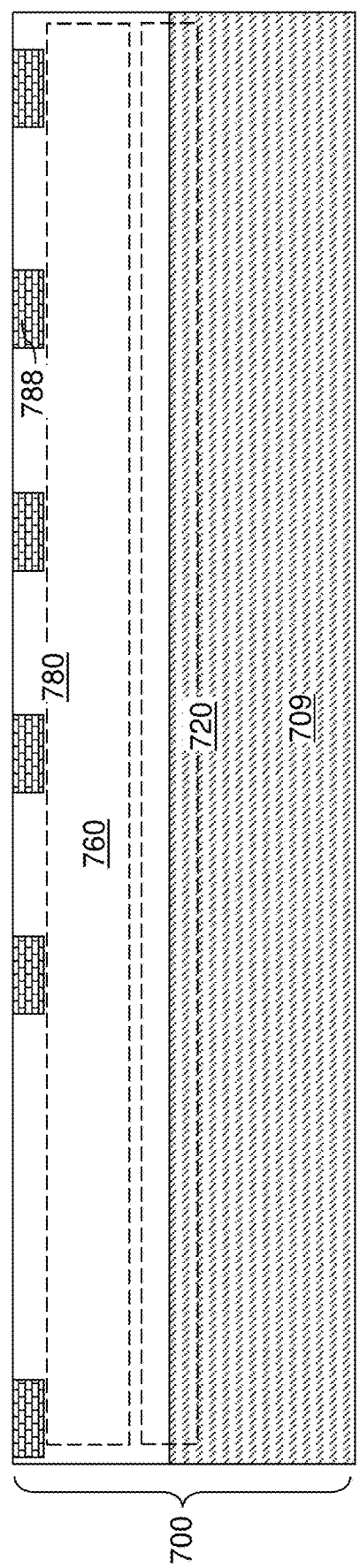
FIG. 16 is a vertical cross-sectional view of a logic die according to an embodiment of the present disclosure.

Referring to FIG. 16, a logic die 700 can be provided. The logic die 700 includes a logic-side substrate 709, a peripheral circuit 720 located on the logic-side substrate 709 and comprising logic-side semiconductor devices (such as field effect transistors), logic-side metal interconnect structures 780 embedded within logic-side dielectric material layers 760, and logic-side bonding pads 778. The peripheral circuit 720 can be configured to control operation of the memory array within the memory die 900. Specifically, the peripheral circuit 720 can be configured to drive various electrical components within the memory array including, but not limited to, the electrically conductive layers 46, the drain regions 63, and a source structure to be subsequently formed. The peripheral circuit 720 can be configured to control operation of the vertical stack of memory elements in the memory array in the memory die 900.

Figure 17:
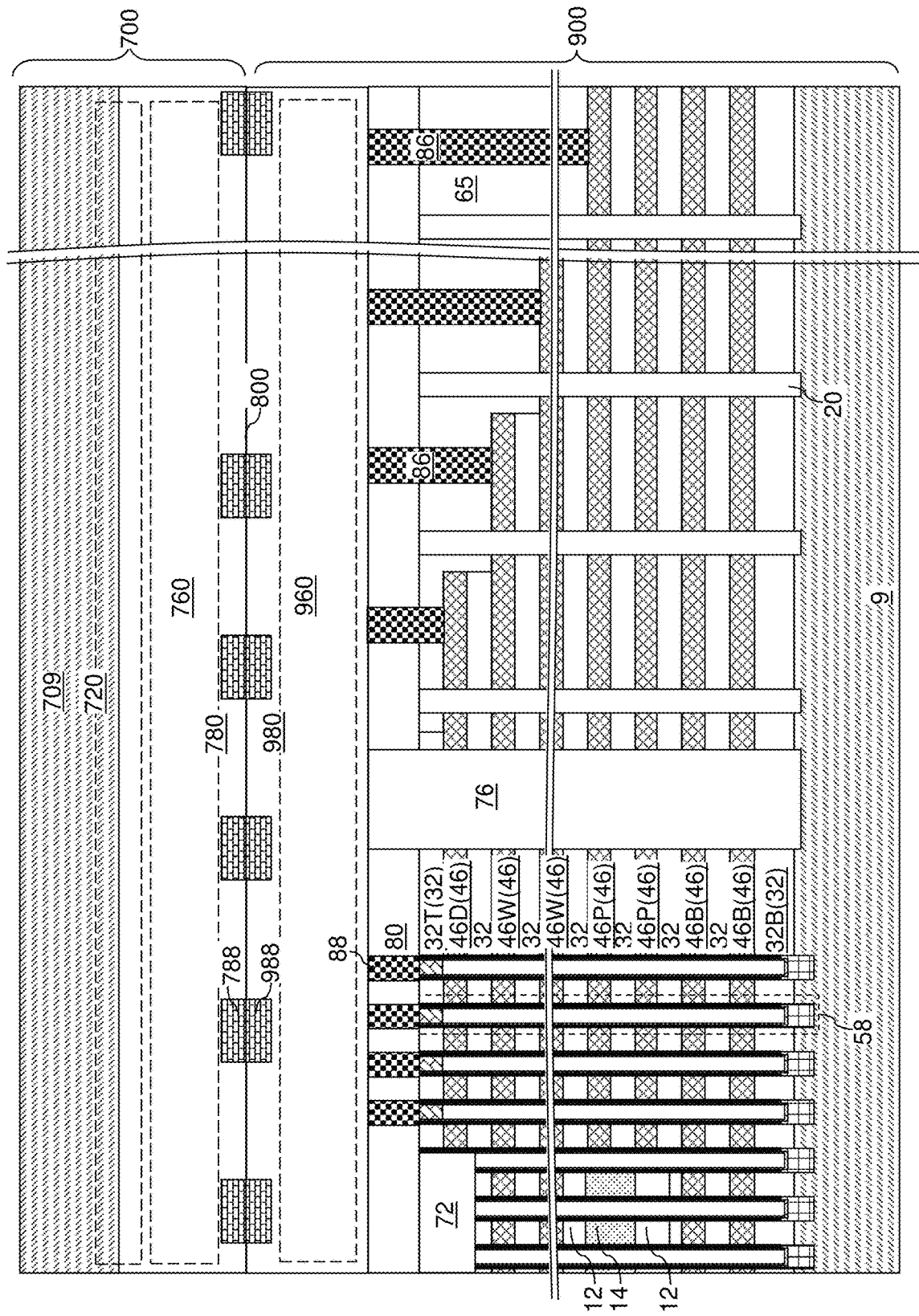
FIG. 17 is a vertical cross-sectional view of the exemplary structure after attaching the logic die to the memory die according to an embodiment of the present disclosure.

Referring to FIG. 17, the logic die 700 can be attached to the memory die 900, for example, by bonding the logic-side bonding pads 788 to the memory-side bonding pads 988 at a bonding interface 800. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 18A:
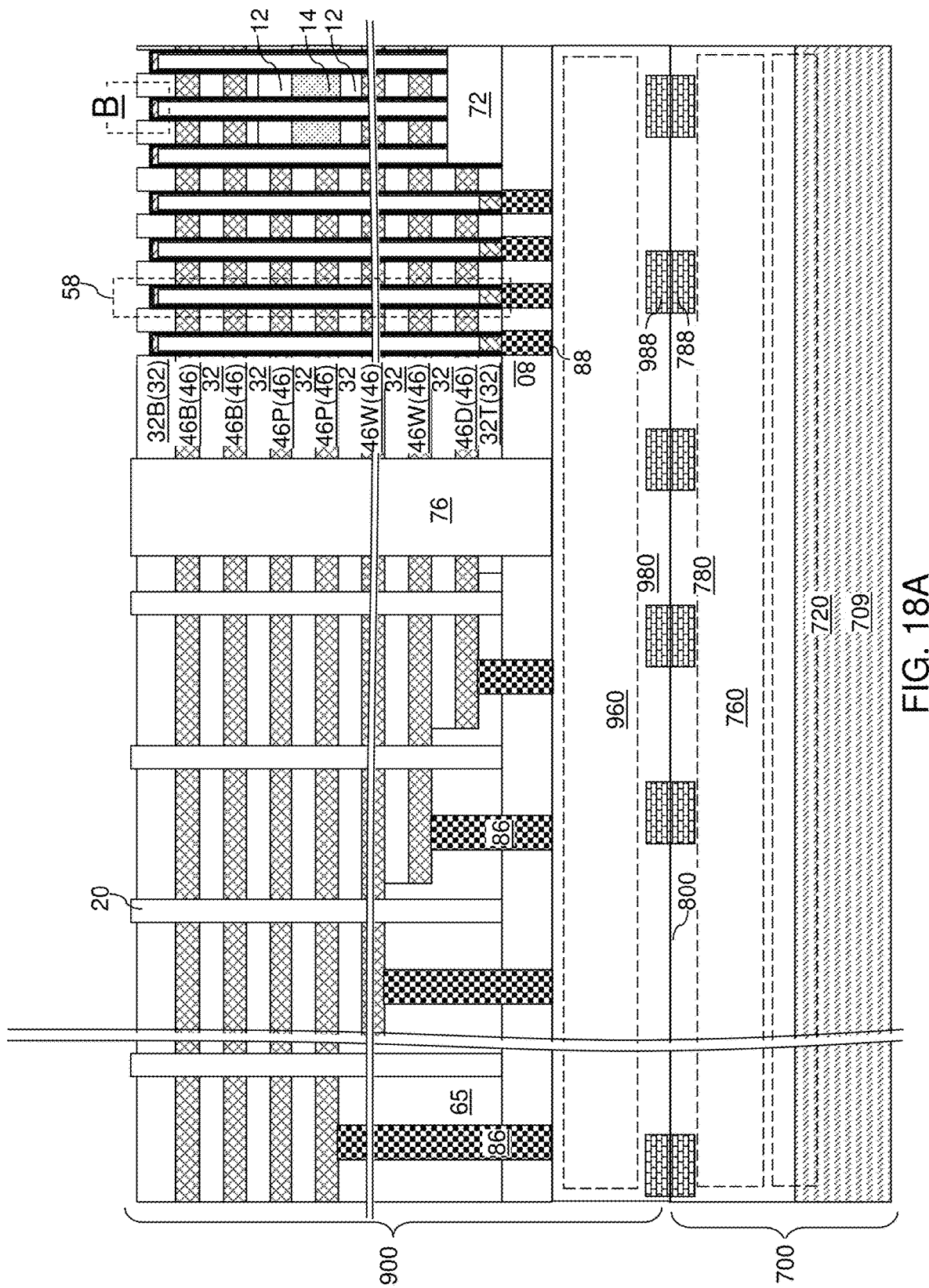
FIG. 18A is a vertical cross-sectional view of the exemplary structure after removal of the carrier substrate according to an embodiment of the present disclosure.
Figure 18B:
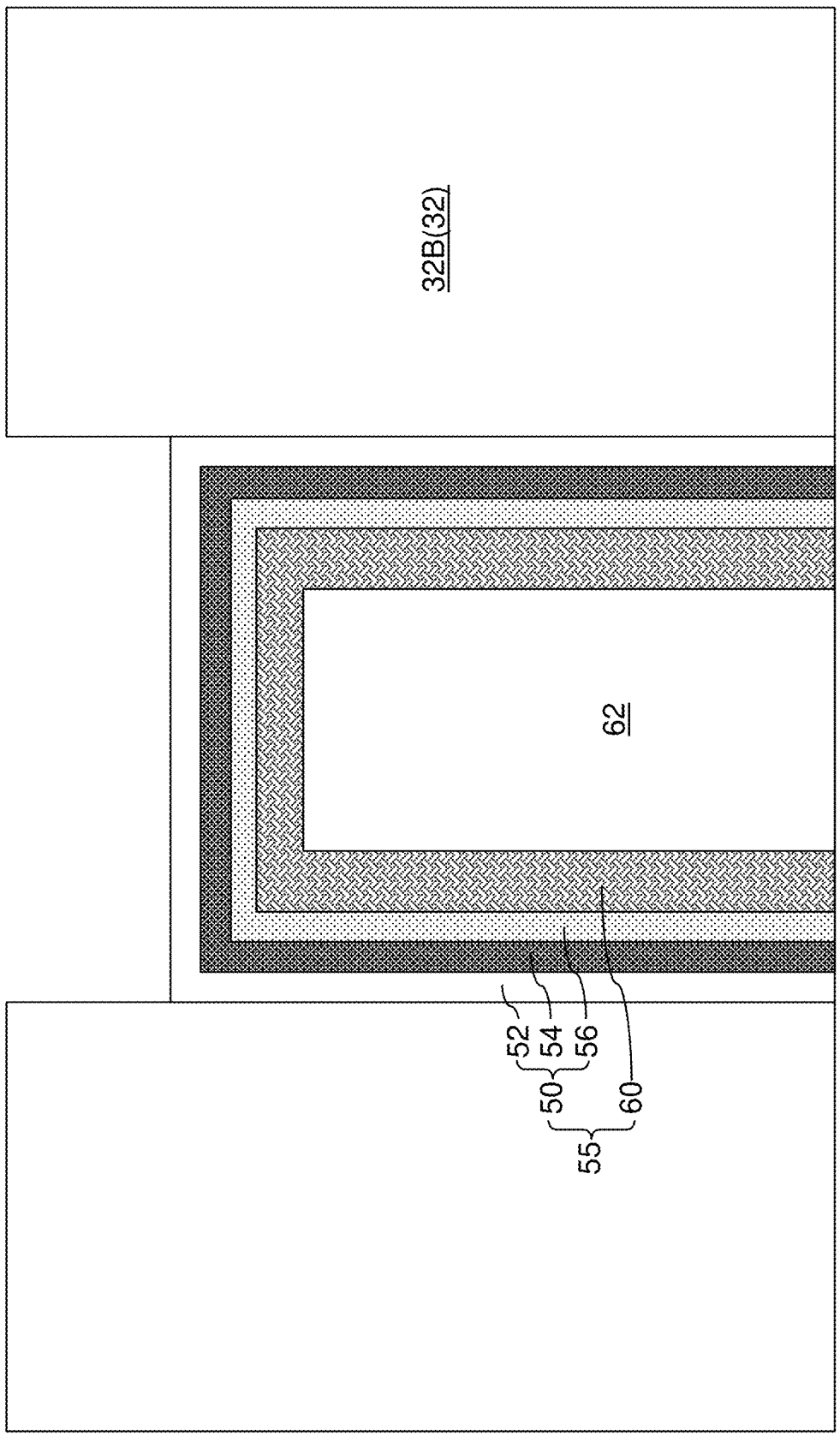
FIG. 18B is a magnified view of region B of FIG. 18A.

Referring to FIGS. 18A and 18B, the carrier substrate 9 and the sacrificial pedestal structures 11 can be removed, for example, by grinding, polishing, cleaving, an isotropic etch process, and/or an anisotropic etch process. If a polishing process, such as a chemical mechanical polishing process, is employed to remove the carrier substrate 9, the bottommost insulating layer 32B may be employed as a polishing stopper material layer. If an etch process such, as a wet etch process, is employed to remove the carrier substrate 9 and the sacrificial pedestal structures 11, the bottommost insulating layer 32B may be employed as an etch stop material layer. In one embodiment, at least a terminal step of at least one removal process that is employed to remove the carrier substrate 9 and the sacrificial pedestal structures 11 may comprise a selective wet etch process that etches the semiconductor materials selective to dielectric materials of the memory films 50 and the dielectric cores 62. In an illustrative example, the terminal step of the at least one removal process may comprise a wet etch process using hot trimethyl-2 hydroxyethyl ammonium hydroxide ("hot TMY") or tetramethyl ammonium hydroxide (TMAH). The entirety of the carrier substrate 9 and the entirety of each of the sacrificial pedestal structures 11 can be removed by the selective wet etch process. Backside end surfaces of the sacrificial pillar structures 20 can be physically exposed upon removal of the carrier substrate 9.

Figure 19:
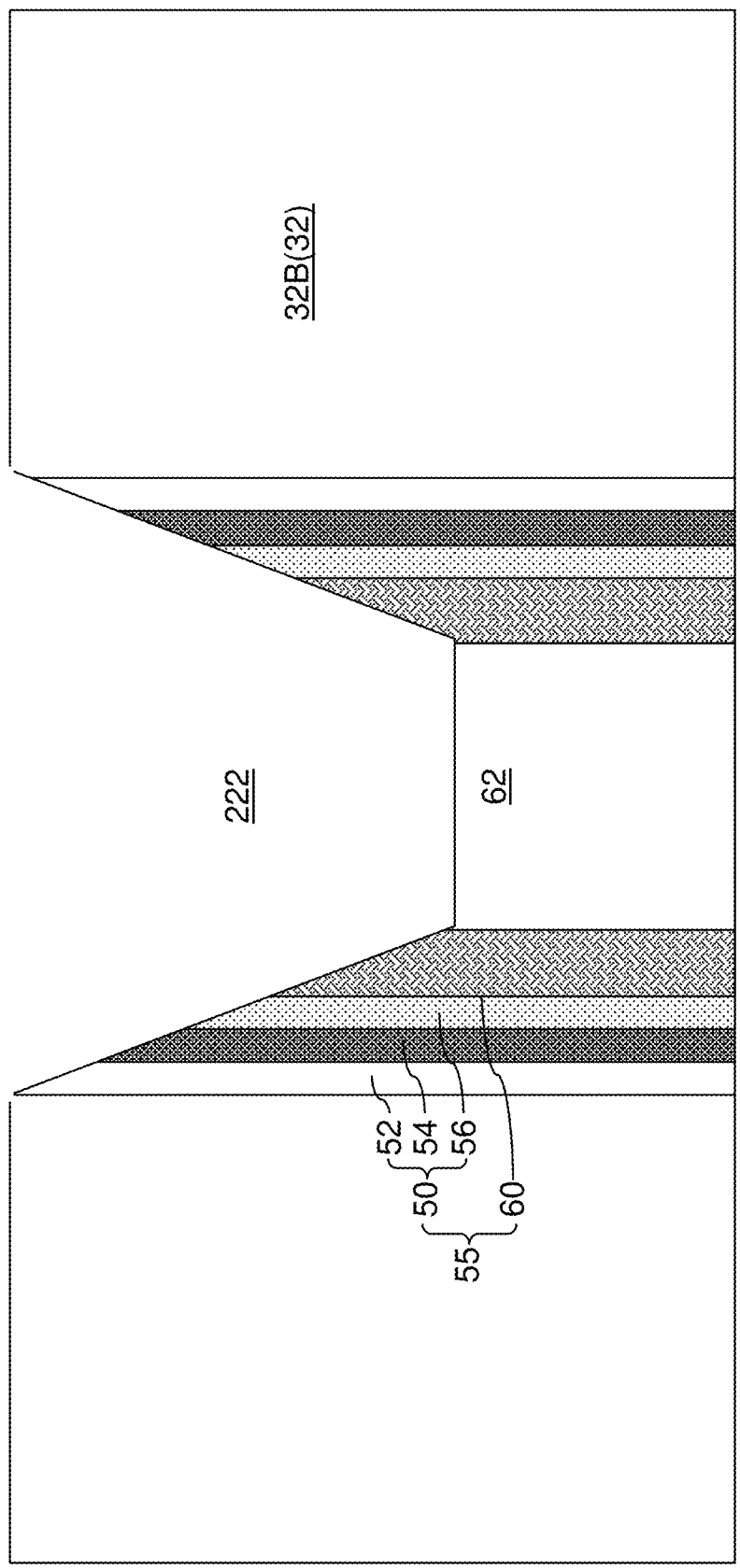
FIG. 19 is a vertical cross-sectional view of a region of the exemplary structure after vertically recessing memory films, channels and dielectric cores according to an embodiment of the present disclosure.

Referring to FIG. 19, at least one etch process that etches the bottom portions of the memory films 50, the vertical semiconductor channels 60 and the dielectric cores 62 can be performed to vertically recess the memory films 50, the vertical semiconductor channels 60 and the dielectric cores 62. Vertically-extending surface segments of the vertical semiconductor channels 60 can be physically exposed in the recesses 223 from which materials of the memory films 50, the vertical semiconductor channels 60, and the dielectric cores 62 are removed. In one embodiment, physically exposed surface segments of each vertical semiconductor channel 60 may comprise an end portion of an inner cylindrical surface of the respective vertical semiconductor channel 60. Optionally, one or more insulating spacers (not shown) may be formed on the bottom ends of the dielectric cores 62 exposed in the recesses 223 to seal any exposed seams that may be located in the dielectric cores 62.

According to an aspect of the present disclosure, the source-side dielectric isolation structures 120 are vertically spaced from portions of the dielectric cores 62, the vertical semiconductor channels 60, and the memory films 50 that are removed during the various processing steps described with reference to FIG. 19. Thus, the source-side dielectric isolation structures 120 are not exposed to any of the etchants that are employed to remove bottom portions of the vertical semiconductor channels 60, the memory films 50, and/or the dielectric cores 62. Thus, the source-side dielectric isolation structures 120 are not exposed in the recesses 223 and are protected from the various etch processes employed during the processing steps described with reference to FIG. 19. Thus, structural damage to the source-side dielectric isolation structures 120 or degradation in electrical isolation provided by the source-side dielectric isolation structures 120 due to the expansion of the lateral through hole 13 during the etching can be eliminated.

Figure 20A:
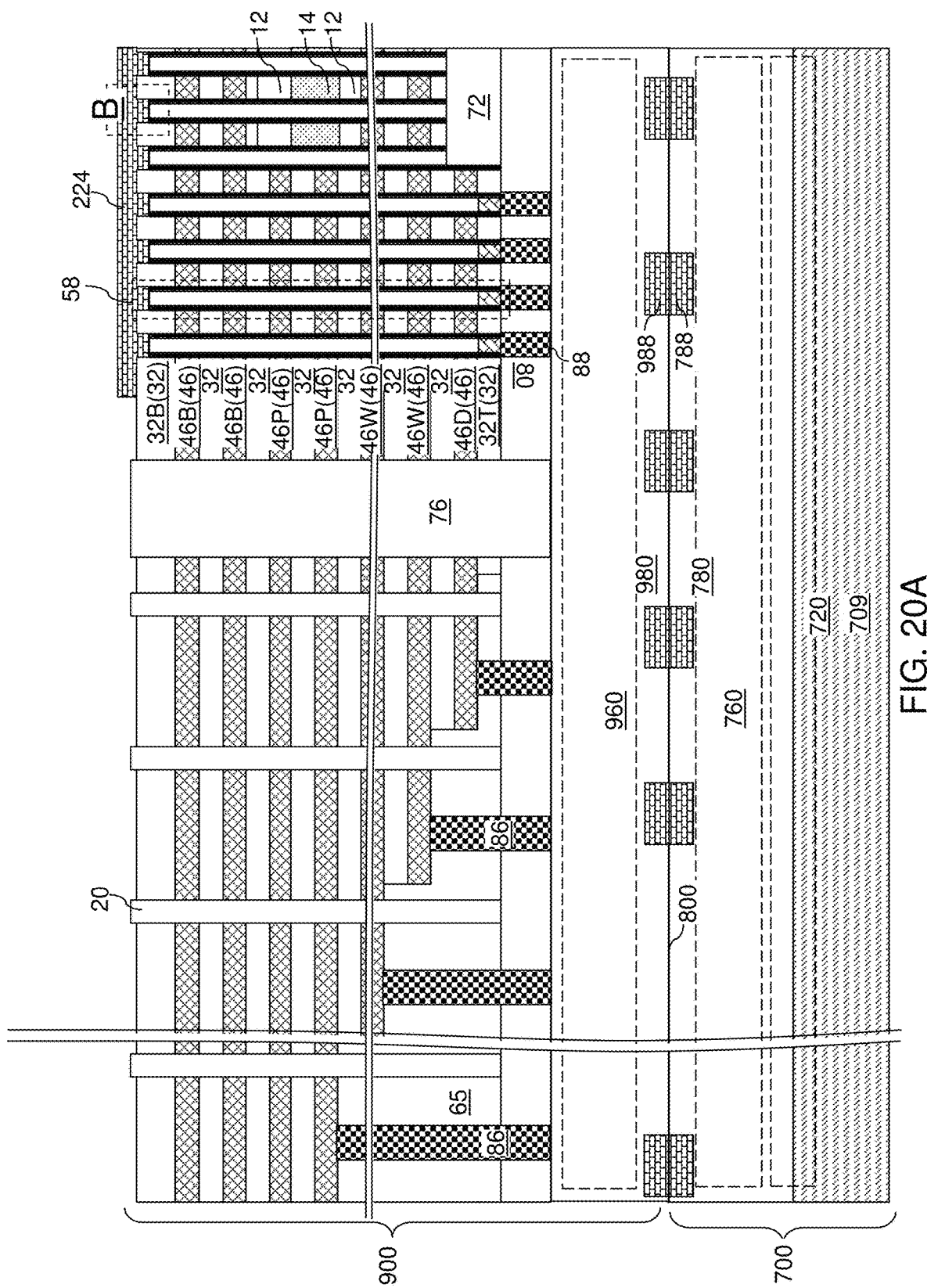
FIG. 20A is a vertical cross-sectional view of the exemplary structure after formation of a metallic source structure according to an embodiment of the present disclosure.
Figure 20B:
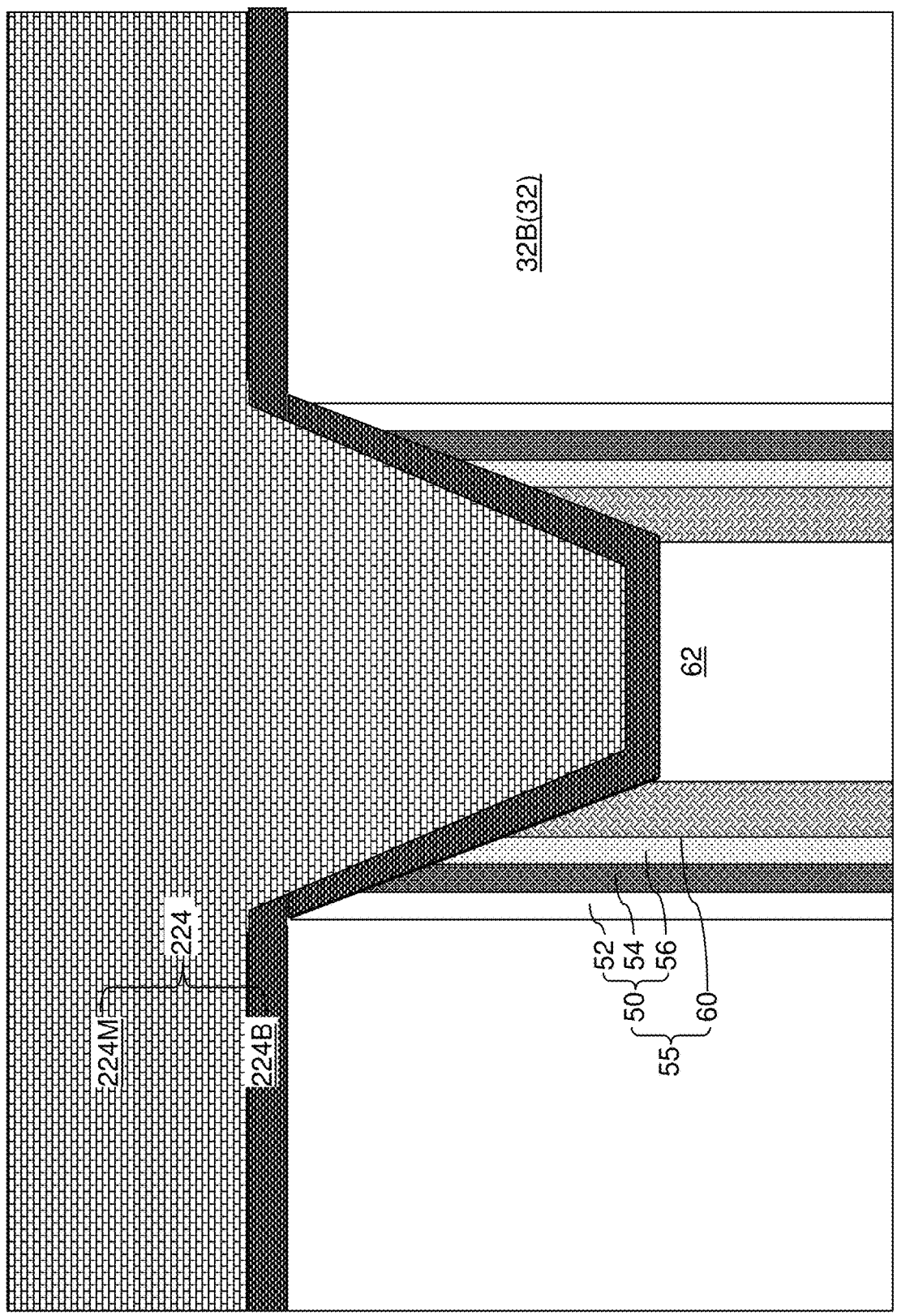
FIG. 20B is a magnified view of region B of FIG. 20A.

Referring to FIGS. 20A and 20B, a metallic barrier material can be conformally deposited in the recesses 223 formed by removal of end portions of the memory films 50, the vertical semiconductor channels 60 and the dielectric cores 62, and over the bottommost insulating layer 32B. The metallic barrier material may comprise a metallic nitride material such as titanium nitride, tantalum nitride, tungsten nitride, or molybdenum nitride, and/or may comprise a metallic carbide material such as titanium carbide, tantalum carbide, or tungsten carbide. The metallic barrier material can be deposited by a conformal deposition process such as a chemical vapor deposition process. A metallic barrier liner 224B can be formed on physically exposed end surfaces of the dielectric cores 62, the vertical semiconductor channels 60, and the memory films 50 in the recesses 223, and over the bottommost insulating layer 32B.

A metallic fill material can be subsequently deposited over the metallic barrier liner 224B. The metallic fill material may comprise tungsten, tantalum, titanium, molybdenum, cobalt, ruthenium, copper, etc. A metal layer 224M can be formed over the metallic barrier liner 224B. Subsequently, the metal layer 224M and the metallic barrier liner 224B can be patterned, for example, by applying and patterning a photoresist layer over the metal layer 224M, and by removing portions of the metal layer 224M and the metallic barrier liner 224B that are not masked by patterned portions of the photoresist layer. A conductive source electrode 224 is thus formed.

A memory block 102 of NAND strings including multiple memory subblocks (104A, 104B) of NAND strings can be provided between each neighboring pair of lateral isolation trench fill structures 76. Each memory subblock (104A or 104B) of NAND strings can be erased by gate induced leakage (e.g., by injecting holes from the source side into the vertical semiconductor channels 60) by applying an erase voltage. To erase the NAND strings (e.g., the first memory opening fill structures 58F) in the first memory subblock 104A, a hole transfer erase voltage is applied to both the bottom-source-select-level electrically conductive layer 46B and to the first electrically conductive strips 46S1 of the primary-source-select-level electrically conductive layers 46P located in the first memory subblock 104A to inject holes in the vertical semiconductor channels 60 of the NAND strings of the first memory subblock 104A. However, a hole cutoff voltage is applied to the second electrically conductive strips 46S2 of the primary-source-select-level electrically conductive layers 46P located in the second memory subblock 104B to prevent holes from being injected into the vertical semiconductor channels 60 of the NAND strings of the second memory subblock 104B. Thus, the NAND strings (e.g., the second memory opening fill structures 58S) in the second memory subblock 104B are not erased during erasing of the NAND strings in the first memory subblock 104A of the same memory block 102.

Referring to FIGS. 1-20B and according to various embodiments of the present disclosure, a semiconductor structure is provided, which comprises: a memory block 102 comprising an alternating stack (32, 46) of insulating layers 32 and electrically conductive layers 46 arranged along a vertical direction and laterally extending in a first horizontal direction hd1; memory openings 49 vertically extending through the alternating stack (32, 46); and memory opening fill structures 58 located in the memory openings 49, wherein each of the memory opening fill structures 58 comprises a respective memory film 50 and a respective vertical semiconductor channel 60. The electrically conductive layers 46 comprise word lines 46W, at least one bottom source side select gate electrode 46B, and at least one primary source side select gate electrode 46P located between the word lines 46W and the at least bottom source side select gate electrode 46B along the vertical direction. The word lines 46W and the at least one bottom source side select gate electrode 46B continuously laterally extend in a second horizontal direction hd2 perpendicular to the first horizontal direction hd1 through an entirety of the memory block 102, and the at least one primary source side select gate electrode 46P is laterally separated along the second horizontal direction hd2.

In one embodiment, the semiconductor structure also comprises a neighboring pair of lateral isolation trench fill structures 76 that laterally extend along the first horizontal direction hd1 and vertically extend at least from a bottommost layer of the alternating stack (32, 46) to a topmost layer of the alternating stack (32, 46). The alternating stack (32, 46) is located between the neighboring pair of lateral isolation trench fill structures 76; and the neighboring pair of lateral isolation trench fill structures comprise respective sidewalls of the memory block 102.

The at least one bottom source side select gate electrode 46B comprises bottom-source-select-level electrically conductive layers 46B, each comprising a respective first single continuous structure contacting each of the neighboring pair of lateral isolation trench fill structures 76. The at least one primary source side select gate electrode 46P comprises primary-source-select-level electrically conductive layer, each comprising a respective pair of a first electrically conductive strip 46S1 and a second electrically conductive strip 46S2 that are laterally spaced apart from each other along the second horizontal direction hd2. The word lines 46W each comprise a respective second single continuous structure contacting each of the neighboring pair of lateral isolation trench fill structures 76.

In one embodiment, the semiconductor structure further comprises a source-side dielectric isolation structure 120 located between the respective pair of the first electrically conductive strip 46S1 and the second electrically conductive strip 46S2 for each of the primary-source-select-level electrically conductive layers 46P.

In one embodiment, the source-side dielectric isolation structure 120 comprises multiple dielectric material blocks 12 that are laterally spaced apart from each other along the first horizontal direction hd1 and interlaced with a row of dummy memory opening fill structures 58T along the first horizontal direction hd1. In one embodiment, the multiple dielectric material blocks 12 surround a respective lateral through-hole 13 that laterally extends along the first horizontal direction hd1. In one embodiment, the respective lateral through-hole 13 is filled with a respective dielectric hole fill structure 14 including at least one dielectric material having a same material composition as a component layer within the memory films 50. In one embodiment, each of the memory films 50 comprises a respective blocking dielectric layer 52 and a respective vertical stack of memory elements that is laterally surrounded by the respective blocking dielectric layer 52; and each dielectric hole fill structure 14 comprises a dielectric fill material layer that is an extension of the blocking dielectric layer 52 into a respective one of the lateral through-holes 13.

In one embodiment, a top surface of the source-side dielectric isolation structure 120 has a first width w1 along a second horizontal direction hd2; and a bottom surface of the source-side dielectric isolation structure 120 has a second width w2 along the second horizontal direction hd2 that is less than the first width w1. In one embodiment, the top surface of the source-side dielectric isolation structure 120 is located within a first horizontal plane HP1 including a top surface of one of the insulating layers 32 that is interposed between the word lines 46W and the primary-source-select-level electrically conductive layers 46P; and the bottom surface of the source-side dielectric isolation structure 120 is located within a second horizontal plane HP2 that is located below a top surface of another of the insulating layers 32 that is interposed between the primary-source-select-level electrically conductive layers 46P and the bottom-source-select-level electrically conductive layers 46B.

In one embodiment, the electrically conductive layers 46 comprise at least one drain-select-level electrically conductive layer 46D located above the word lines 46W, wherein each of the at least one drain-select-level electrically conductive layer 46D comprises a respective pair of a third electrically conductive strip 46DS1 and a fourth electrically conductive strip 46DS2 that are laterally spaced apart from each other along the second horizontal direction hd2. In one embodiment, the semiconductor structure also comprises a drain-side dielectric isolation structure 72 located between the respective pair of the third electrically conductive strip and the fourth electrically conductive strip.

In one embodiment, the semiconductor structure also comprises a source electrode 224 located over a first (e.g., bottom) side of the alternating stack (32, 46) and contacting bottom ends of the vertical semiconductor channels 60. The alternating stack is located in a memory die 900 and the semiconductor structure further comprises a logic die 700 bonded to the memory die 900 over a second (e.g., top) side of the alternating stack opposite to the first side.

The various embodiments of the present disclosure can be employed to form source-side dielectric isolation structures 120 that are vertically offset from the source electrode 224 that is formed on bottom ends of vertical semiconductor channels 60. The source-side dielectric isolation structures 120 can be vertically spaced from the metallic source electrode 224 by at least one insulating layer 32 and at least one bottom-source-select-level electrically conductive layer 46B. Damage to the source-side dielectric isolation structures 120 can be avoided by vertically shifting the position of the source-side dielectric isolation structures 120 by at least one electrically conductive layer 46, such as at least one bottom-source-select-level electrically conductive layer 46B.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A semiconductor structure, comprising:
    a memory block comprising an alternating stack of insulating layers and electrically conductive layers arranged along a vertical direction and laterally extending in a first horizontal direction;
memory openings vertically extending through the alternating stack; and
memory opening fill structures located in the memory openings, wherein each of the memory opening fill structures comprises a respective memory film and a respective vertical semiconductor channel,
wherein:
the electrically conductive layers comprise word lines, at least one bottom source side select gate electrode, and at least one primary source side select gate electrode located between the word lines and the at least bottom source side select gate electrode along the vertical direction;
the word lines and the at least one bottom source side select gate electrode continuously laterally extend in a second horizontal direction perpendicular to the first horizontal direction through an entirety of the memory block; and
the at least one primary source side select gate electrode is laterally separated along the second horizontal direction.

2. The semiconductor structure of claim 1, further comprising a neighboring pair of lateral isolation trench fill structures that laterally extend along the first horizontal direction and vertically extend at least from a bottommost layer of the alternating stack to a topmost layer of the alternating stack.

3. The semiconductor structure of claim 2, wherein:
the alternating stack is located between the neighboring pair of lateral isolation trench fill structures; and
the neighboring pair of lateral isolation trench fill structures comprise respective sidewalls of the memory block.

4. The semiconductor structure of claim 2, wherein:
the at least one bottom source side select gate electrode comprises bottom-source-select-level electrically conductive layers, each comprising a respective first single continuous structure contacting each of the neighboring pair of lateral isolation trench fill structures;
the at least one primary source side select gate electrode comprises primary-source-select-level electrically conductive layers, each comprising a respective pair of a first electrically conductive strip and a second electrically conductive strip that are laterally spaced apart from each other along the second horizontal direction; and
the word lines each comprise a respective second single continuous structure contacting each of the neighboring pair of lateral isolation trench fill structures.

5. The semiconductor structure of claim 4, further comprising a source-side dielectric isolation structure located between the respective pair of the first electrically conductive strip and the second electrically conductive strip for each of the primary-source-select-level electrically conductive layers.

6. The semiconductor structure of claim 5, wherein the source-side dielectric isolation structure comprises multiple dielectric material blocks that are laterally spaced apart from each other along the first horizontal direction and interlaced with a row of dummy memory opening fill structures along the first horizontal direction.

7. The semiconductor structure of claim 6, wherein the multiple dielectric material blocks surround a respective lateral through-hole that laterally extends along the first horizontal direction.

8. The semiconductor structure of claim 7, wherein:
the respective lateral through-hole is filled with a respective dielectric hole fill structure;
each of the memory films comprises a respective blocking dielectric layer and a respective vertical stack of memory elements that is laterally surrounded by the respective blocking dielectric layer; and
each dielectric hole fill structure comprises a dielectric fill material layer that is an extension of the blocking dielectric layer into a respective one of the lateral through-holes.

9. The semiconductor structure of claim 5, wherein:
a top surface of the source-side dielectric isolation structure has a first width along the second horizontal direction; and
a bottom surface of the source-side dielectric isolation structure has a second width along the second horizontal direction that is less than the first width.

10. The semiconductor structure of claim 9, wherein:
the top surface of the source-side dielectric isolation structure is located within a first horizontal plane including a top surface of one of the insulating layers that is interposed between the word lines and the primary-source-select-level electrically conductive layers; and
the bottom surface of the source-side dielectric isolation structure is located within a second horizontal plane that is located below a top surface of another of the insulating layers that is interposed between the primary-source-select-level electrically conductive layers and the bottom-source-select-level electrically conductive layers.

11. The semiconductor structure of claim 5, wherein the electrically conductive layers further comprise drain-select-level electrically conductive layers located above the word lines, wherein each of the drain-select-level electrically conductive layers comprises a respective pair of a third electrically conductive strip and a fourth electrically conductive strip that are laterally spaced apart from each other along the second horizontal direction.

12. The semiconductor structure of claim 11, further comprising a drain-side dielectric isolation structure located between the respective pair of the third electrically conductive strip and the fourth electrically conductive strip.

13. The semiconductor structure of claim 1, further comprising a source electrode located over a first side of the alternating stack and contacting bottom ends of the vertical semiconductor channels.

14. The semiconductor structure of claim 13, wherein the alternating stack is located in a memory die and further comprising a logic die bonded to the memory die over a second side of the alternating stack opposite to the first side.

15. A method of forming a semiconductor structure, comprising:
forming a first alternating stack of first insulating layers and first sacrificial material layers over a substrate, wherein the first sacrificial material layers comprise, from bottom to top, at least one bottom-source-select-level sacrificial material layer and at least one primary-source-select-level sacrificial material layer;
forming a source-side dielectric isolation structure laterally extending in a first horizontal direction through the at least one primary-source-select-level sacrificial material layer but not through any portion of the at least one bottom-source-select-level sacrificial material layer;

forming a second alternating stack of second insulating layers and second sacrificial material layers over the first alternating stack and the source-side dielectric isolation structure;

forming memory openings through the second alternating stack and the first alternating stack;

forming memory opening fill structures in the memory openings, wherein the each of the memory opening fill structures comprises a respective memory film and a respective vertical semiconductor channel; and replacing the second sacrificial material layers and the first sacrificial material layers with electrically conductive layers.

16. The method of claim 15, wherein the source-side dielectric isolation structure divides each of the at least one primary-source-select-level sacrificial material layer into a respective pair of a first sacrificial material strip and a second sacrificial material strip.

17. The method of claim 16, wherein:

the electrically conductive layers comprise at least one first electrically conductive strip that replaces each first sacrificial material strip and at least one second electrically conductive strip that replaces each second sacrificial material strip; and a primary-source-select-level electrically conductive layer comprises combination of the first electrically conductive strip and the second electrically conductive strip that are laterally spaced apart from each other by the source-side dielectric isolation structure.

18. The method of claim 16, wherein the memory openings comprise:

first memory openings that vertically extend through each first sacrificial material strip and laterally spaced from each second sacrificial material strip;

second memory openings that vertically extend through each second sacrificial material strip and laterally spaced from each first sacrificial material strip; and a row of third memory openings arranged along the first horizontal direction and dividing the source-side dielectric isolation structure into multiple dielectric material blocks.

19. The method of claim 18, wherein:

the multiple dielectric material blocks surround a respective lateral through-hole that laterally extends along the first horizontal direction; and the respective lateral through-hole is filled with a respective dielectric hole fill structure including at least one dielectric material having a same material composition as a component layer within the memory films.

20. The method of claim 15, further comprising:

forming a pair of lateral isolation trenches through each layer within the second alternating stack and the first alternating stack, wherein each of the pair of lateral isolation trenches laterally extends along the first horizontal direction, and the source-side dielectric isolation structure is located between the pair of lateral isolation trenches;

removing the second sacrificial material layers and the first sacrificial material layers by providing an isotropic etchant into the pair of lateral isolation trenches to form lateral recesses;

forming the electrically conductive layers in the lateral recesses; and forming a pair of lateral isolation trench fill structures in the pair of lateral isolation trenches, wherein the electrically conductive layers further comprise at least one bottom-source-select-level electrically conductive layer that replaces the at least one bottom-source-select-level sacrificial material layer, and wherein each of the at least one bottom-source-select-level electrically conductive layer comprises a respective first single continuous structure contacting each of the pair of lateral isolation trench fill structures.

* * * * *